(12) United States Patent
Yamakawa

(10) Patent No.: US 8,981,276 B2
(45) Date of Patent: Mar. 17, 2015

(54) IMAGING ELEMENT WITH PIXELS HAVING CAPACITORS SEPARATED FROM SUBSTRATE, DRIVE METHOD FOR IMAGING ELEMENT, MANUFACTURING METHOD FOR IMAGING ELEMENT, AND ELECTRONIC APPARATUS

(75) Inventor: Shinya Yamakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 350 days.

(21) Appl. No.: 13/523,493

(22) Filed: Jun. 14, 2012

(65) Prior Publication Data

US 2013/0001403 A1  Jan. 3, 2013

(30) Foreign Application Priority Data

Jun. 30, 2011 (JP) .................. 2011-145563
Jul. 12, 2011 (JP) .................. 2011-267559

(51) Int. Cl.
*H01L 27/00* (2006.01)
*H01L 27/146* (2006.01)
*H04N 5/355* (2011.01)

(52) U.S. Cl.
CPC ...... *H01L 27/14609* (2013.01); *H01L 27/1464* (2013.01); *H01L 27/14641* (2013.01); *H01L 27/14692* (2013.01); *H04N 5/3559* (2013.01)
USPC .................................... 250/208.1

(58) Field of Classification Search
CPC .................. H01L 21/14643; H01L 27/14609; H04N 3/155
USPC ........................................... 250/208.1
See application file for complete search history.

(56) References Cited

U.S. PATENT DOCUMENTS

2001/0015256 A1\* 8/2001 Yamazaki et al. ............. 156/289
2007/0254400 A1\* 11/2007 Yamada et al. ................. 438/64
2010/0230579 A1\* 9/2010 Watanabe .................. 250/208.1

FOREIGN PATENT DOCUMENTS

JP  2008-205638  9/2008
JP  2011-119950  6/2011

OTHER PUBLICATIONS

Aoki, Takeshi et al. "Electronic Global Shutter CMOS Image Sensor Using Oxide Semiconductor FET with Extremely Low Off-state Current" pp. 174 & 175, *Semiconductor Energy Laboratory Co. Ltd., 2011 Symposium on VLSI Technology Digest of Technical Papers.*

\* cited by examiner

*Primary Examiner* — Thanh Luu
*Assistant Examiner* — Renee D Chavez
(74) *Attorney, Agent, or Firm* — Rader, Fishman & Grauer PLLC

(57) ABSTRACT

An imaging element includes a plurality of pixels. Each of the plurality of pixels includes the following element. A photoelectric transducer is disposed in each of the plurality of pixels and is configured to generate electric charge corresponding to received light. A storage unit has a predetermined capacitance and is configured to store therein electric charge transferred from the photoelectric transducer. A capacitor is disposed separate from a silicon substrate with an interlayer insulating film therebetween, the photoelectric transducer and the storage unit being formed in the silicon substrate. A connecting unit is disposed separate from the silicon substrate with the interlayer insulating film therebetween and is configured to connect the storage unit and the capacitor.

18 Claims, 30 Drawing Sheets

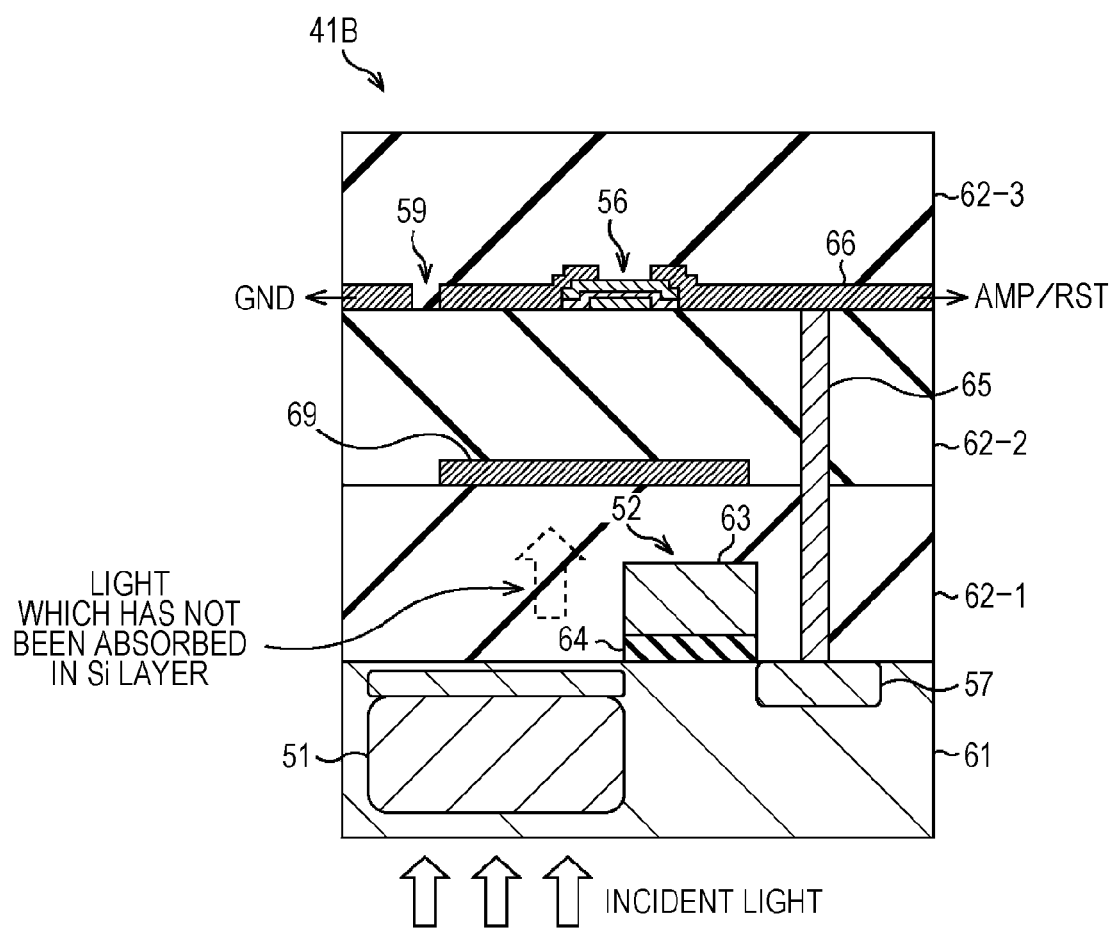

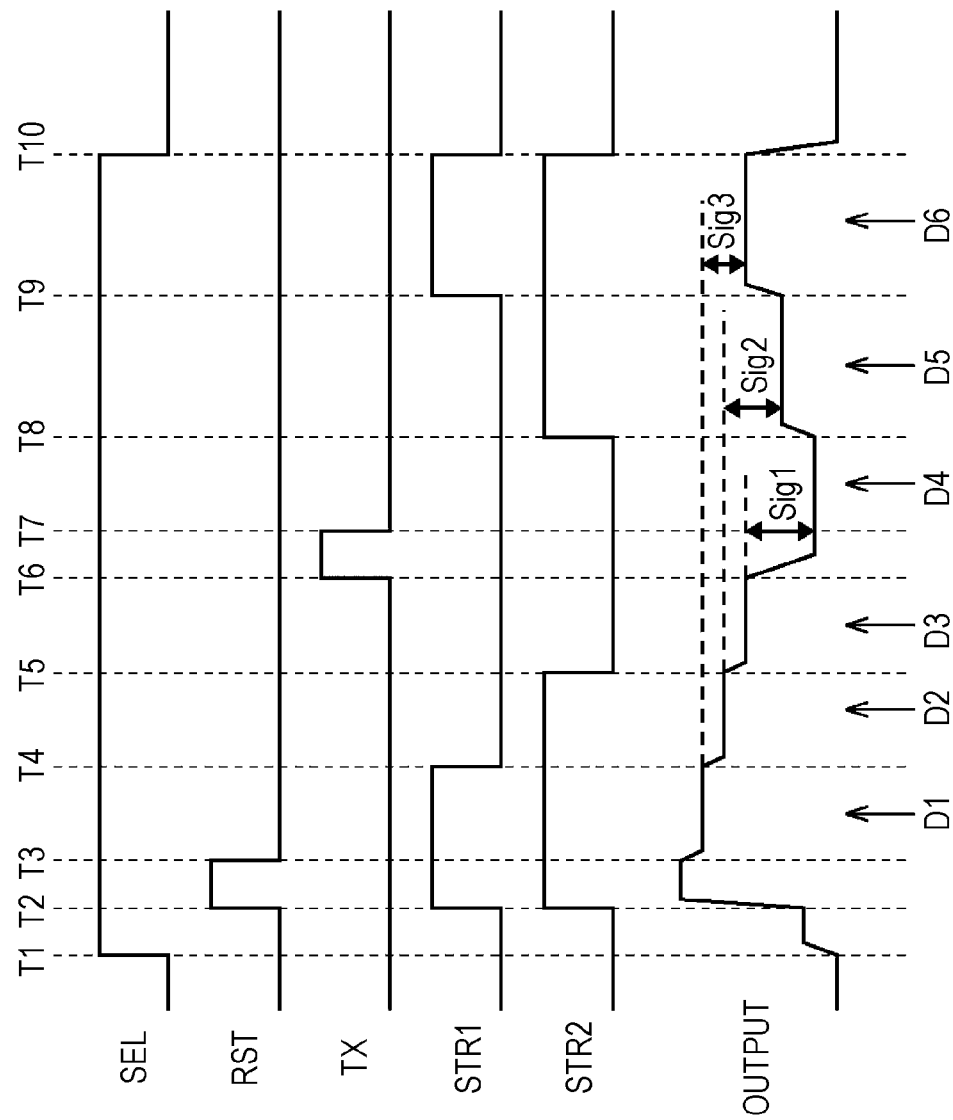

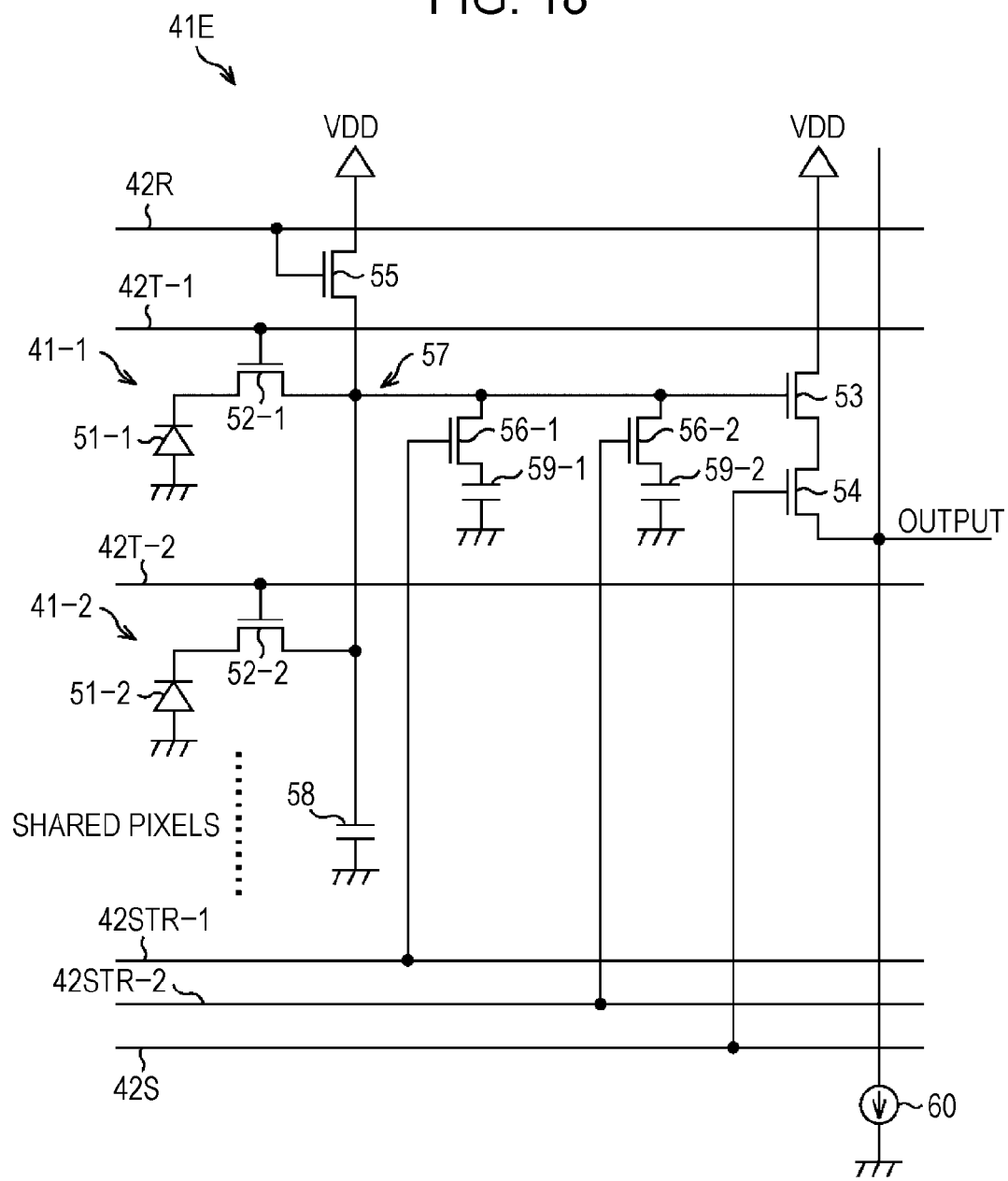

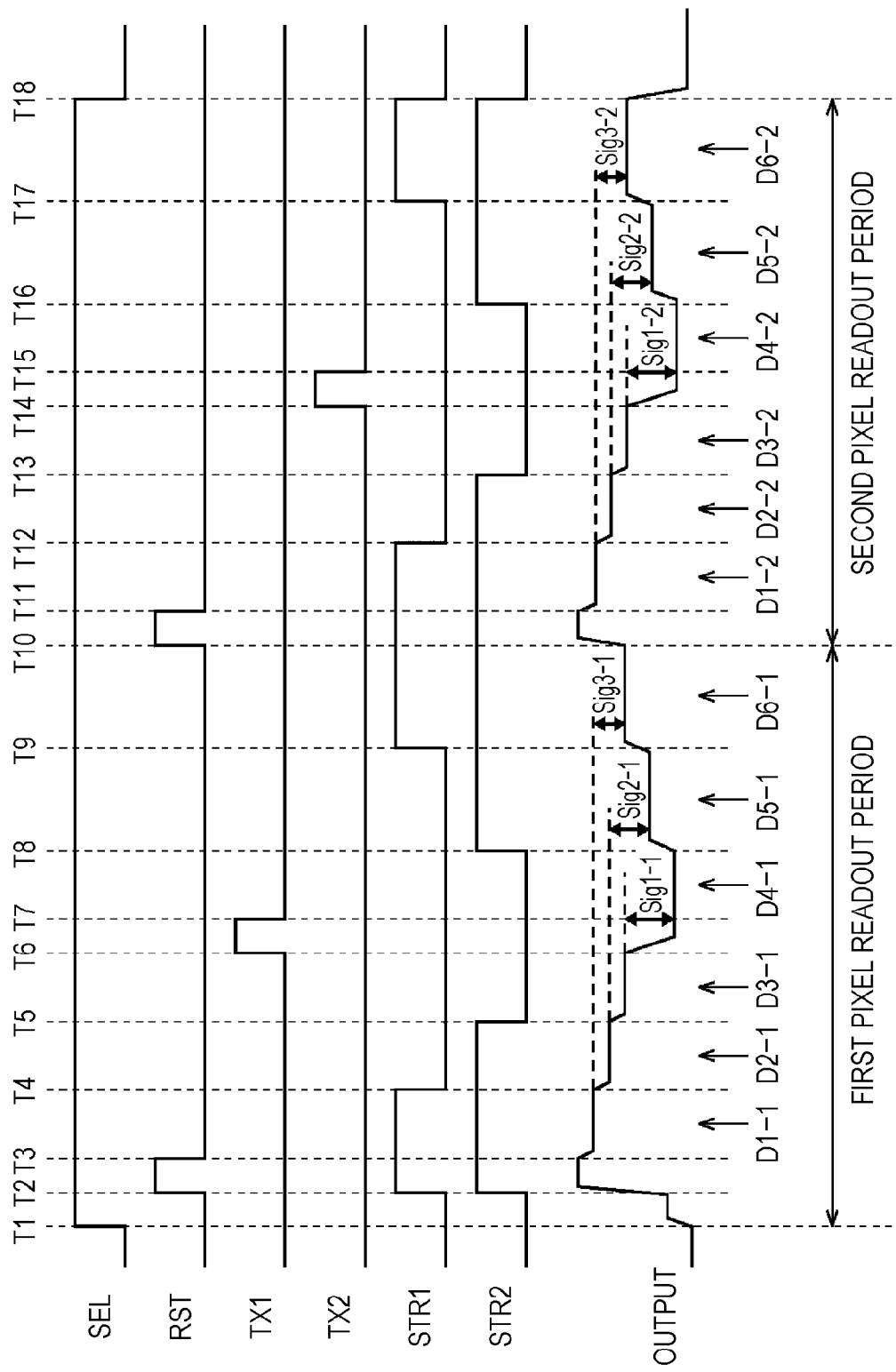

US 8,981,276 B2

IMAGING ELEMENT WITH PIXELS HAVING CAPACITORS SEPARATED FROM SUBSTRATE, DRIVE METHOD FOR IMAGING ELEMENT, MANUFACTURING METHOD FOR IMAGING ELEMENT, AND ELECTRONIC APPARATUS

BACKGROUND

The present disclosure relates to an imaging element, a drive method for an imaging element, a manufacturing method for an imaging element, and an electronic apparatus. More particularly, the disclosure relates to an imaging element that implements an imaging operation to obtain high-quality images, a drive method for the imaging element, a manufacturing method for the imaging element, and an electronic apparatus.

Hitherto, in solid-state imaging elements (image sensors) using a semiconductor, as photoelectric conversion elements that convert received light into an electric signal, photodiodes (PDs), which are photoelectric transducers utilizing a semiconductor pn junction, are used. Elements using PDs are installed in many devices, such as digital cameras, video cameras, monitor cameras, copying machines, and fax machines. These days, as solid-state imaging elements, so-called complementary metal oxide semiconductor (CMOS) solid-state imaging elements, which are manufactured by a CMOS process, together with peripheral circuits, are widely used.

For example, in a solid-state imaging element, electric charge generated as a result of performing photoelectric conversion in a PD included in a pixel is transferred to a floating diffusion (FD), which is a floating diffusion area. Then, by measuring a potential of the FD, a signal representing a voltage corresponding to the electric charge in the PD is extracted.

This will be described more specifically below with reference to FIG. 1. FIG. 1 illustrates a pixel 11. In the pixel 11, electric charge generated in a PD 12 is transferred to an FD 14 as a result of driving a transfer transistor 13, and is stored in a capacitor 15 included in the FD 14. The electric charge stored in the FD 14 is then converted into a voltage by an amplifier transistor 16, and is then output to a vertical signal line as a result of driving a selection transistor 17. The vertical signal line is connected to a transistor (constant current source) which is biased at a constant voltage, and this transistor and the amplifier transistor 16 form a so-called source-follower circuit. Meanwhile, electric charge stored in the FD 14 is discharged to a constant voltage source VDD as a result of driving a reset transistor 18.

In a solid-state imaging element in which the pixels 11 configured as described above are arranged in a matrix form on a semiconductor substrate, the output voltage (conversion efficiency) per unit electron is determined from the total of the capacitance components of the FD 14 in which electric charge is stored and the modulation factor of the source follower circuit. The total of the capacitance components of the FD 14 in which electric charge is stored is found by adding the capacitance of the capacitor 15 to the capacitance generated by each transistor connected to the FD 14.

In solid-state imaging elements of the related art, the capacitance of the FD 14 is fixed, and the dynamic range or the output voltage when illuminance is low is not changed. Accordingly, Japanese Unexamined Patent Application Publication No. 2008-205638 discloses a solid-state imaging element including pixels that are capable of changing the capacitance of the FD 14 in order to dynamically change the dynamic range or the output voltage when illuminance is low.

FIG. 2 schematically illustrates a planar structure of a pixel 11' that is capable of changing the capacitance of an FD 14' in which electric charge is stored.

The pixel 11' is configured as follows. A PD 12 is connected to the FD 14' via a transfer transistor 13, and the FD 14' is connected to the gate electrode of an amplifier transistor 16. A selection transistor 17 is disposed on one side of the amplifier transistor 16, and a reset transistor 18 is disposed on the other side of the amplifier transistor 16. In the pixel 11', a switching element 19 is disposed in the FD 14' between the transfer transistor 13 and the reset transistor 18. With this configuration, the FD 14' is able to store electric charge therein by using the capacitor 15 included in the FD 14' and an additional capacitor 15' connected to the FD 14' via the switching element 19.

In the pixel 11' configured as described above, driving of the switching element 19 is controlled such that electric charge generated in the PD 12 is stored in the capacitor 15 when illuminance is low, and is stored in the capacitor 15 and in the additional capacitor 15' when illuminance is high. In this manner, the total capacitance components of the FD 14' in which electric charge is stored are dynamically changed by using the switching element 19, thereby implementing a high dynamic range in the pixel 11'.

In CMOS solid-state imaging elements of the related art, pixel signals are sequentially read in turn from individual rows, which causes distortion in images. Accordingly, in order to reduce the generation of distortion in images, a technology, called "global shutter", for simultaneously transferring electric charge in all PDs included in a solid-state imaging element has been developed.

For example, Japanese Unexamined Patent Application Publication No. 2011-119950 discloses a solid-state imaging device that implements a global shutter by using a thin-film transistor disposed in a wiring layer. Non-patent literature "Electronic Global Shutter CMOS Image Sensor using Oxide Semiconductor FET with Extremely Low Off-state Current", Aoki et al., Symp. On VLSI Technology 2011, p. 174, 2011 also discloses a CMOS image sensor in which a thin-film transistor is disposed in a wiring layer.

SUMMARY

However, in the pixel structure disclosed in Japanese Unexamined Patent Application Publication No. 2008-205638, the additional capacitor 15' and the switching element 19 disposed between the capacitor 15 included in the PD 14' and the additional capacitor 15' are formed in the same silicon substrate in which a photoelectric conversion region (PD) is formed. Similarly, in the solid-state imaging device disclosed in Japanese Unexamined Patent Application Publication No. 2011-119950, a capacitor element that stores therein electric charge generated in a PD is disposed in a silicon substrate. In this case, the area of the photoelectric conversion region is reduced, which may decrease the photoelectric conversion efficiency.

In the CMOS image sensor disclosed in the above-described non-patent literature, since no storage capacitor element is provided, the amount of electric charge that can be stored is smaller, which may make it difficult to increase the dynamic range.

In order to obtain images without distortion or to obtain images with a wider dynamic range through implementation of a global shutter, the effect of the addition of capacitor elements within a pixel is being examined. At the same time, however, the area of the photoelectric conversion region may be decreased by the addition of capacitor elements. It is thus desirable to obtain higher quality images without decreasing the area of the photoelectric conversion region.

In view of this background, it is desirable to implement an imaging operation to obtain higher quality images.

According to an embodiment of the present disclosure, there is provided an imaging element including a plurality of pixels. Each of the plurality of pixels includes: a photoelectric transducer disposed in each of the plurality of pixels and configured to generate electric charge corresponding to received light; a storage unit having a predetermined capacitance and configured to store therein electric charge transferred from the photoelectric transducer; a capacitor disposed separate from a silicon substrate with an interlayer insulating film therebetween, the photoelectric transducer and the storage unit being formed in the silicon substrate; and a connecting unit disposed separate from the silicon substrate with the interlayer insulating film therebetween and configured to connect the storage unit and the capacitor.

According to an embodiment of the present disclosure, there is provided a first drive method for an imaging element including a plurality of pixels. Each of the plurality of pixels includes a photoelectric transducer disposed in each of the plurality of pixels and configured to generate electric charge corresponding to received light, a storage unit having a predetermined capacitance and configured to store therein electric charge transferred from the photoelectric transducer, a capacitor disposed separate from a silicon substrate with an interlayer insulating film therebetween, the photoelectric transducer and the storage unit being formed in the silicon substrate, and a connecting unit disposed separate from the silicon substrate with the interlayer insulating film therebetween and configured to connect the storage unit and the capacitor. The first drive method includes: driving the imaging element such that transfer of electric charge from the photoelectric transducer to the storage unit is simultaneously performed in the plurality of pixels; and transferring electric charge stored in the storage unit to the capacitor via the connecting unit and retaining the electric charge in the capacitor.

According to an embodiment of the present disclosure, there is provided a second drive method for an imaging element including a plurality of pixels. Each of the plurality of pixels includes a photoelectric transducer disposed in each of the plurality of pixels and configured to generate electric charge corresponding to received light, a storage unit having a predetermined capacitance and configured to store therein electric charge transferred from the photoelectric transducer, a capacitor disposed separate from a silicon substrate with an interlayer insulating film therebetween, the photoelectric transducer and the storage unit being formed in the silicon substrate, and a connecting unit disposed separate from the silicon substrate with the interlayer insulating film therebetween and configured to connect the storage unit and the capacitor. The capacitor is an additional capacitor configured to store electric charge therein in addition to the storing unit storing electric charge. The second drive method includes: connecting or disconnecting the storage unit and the additional capacitor during a readout period for which a signal is read from the pixel.

According to an embodiment of the present disclosure, there is provided a manufacturing method for an imaging element including a plurality of pixels. Each of the plurality of pixels includes a photoelectric transducer disposed in each of the plurality of pixels and configured to generate electric charge corresponding to received light, a storage unit having a predetermined capacitance and configured to store therein electric charge transferred from the photoelectric transducer, a capacitor disposed separate from a silicon substrate with an interlayer insulating film therebetween, the photoelectric transducer and the storage unit being formed in the silicon substrate, and a connecting unit disposed separate from the silicon substrate with the interlayer insulating film therebetween and configured to connect the storage unit and the capacitor. The manufacturing method includes: forming the capacitor at the same time as forming a wiring in a wiring layer which is disposed separate from the silicon substrate with the interlayer insulating film therebetween, the photoelectric transducer being formed in the silicon substrate.

According to an embodiment of the present disclosure, there is provided an electronic apparatus including: an imaging element including a plurality of pixels. Each of the plurality of pixels includes a photoelectric transducer disposed in each of the plurality of pixels and configured to generate electric charge corresponding to received light, a storage unit having a predetermined capacitance and configured to store therein electric charge transferred from the photoelectric transducer, a capacitor disposed separate from a silicon substrate with an interlayer insulating film therebetween, the photoelectric transducer and the storage unit being formed in the silicon substrate, and a connecting unit disposed separate from the silicon substrate with the interlayer insulating film therebetween and configured to connect the storage unit and the capacitor.

According to an embodiment of the present disclosure, the capacitor and the connecting unit may be formed in a wiring layer disposed separate from the silicon substrate with the interlayer insulating film therebetween, the photoelectric transducer being formed in the silicon substrate.

According to an embodiment of the present disclosure, higher quality images are obtained.

BRIEF DESCRIPTION OF THE DRAWINGS

FIG. 14 is a sectional view illustrating an example of a third configuration of a pixel;

FIG. 17 is a timing chart illustrating an example of the drive timing at which a pixel is driven by using a fourth drive method;

FIG. 18 is a circuit diagram illustrating an example of a sixth configuration of a pixel;

FIG. 19 is a timing chart illustrating an example of the drive timing at which a pixel is driven by using a fifth drive method;

DETAILED DESCRIPTION OF EMBODIMENTS

Embodiments of the present disclosure will be described in detail below with reference to the accompanying drawings.

Figure 1:
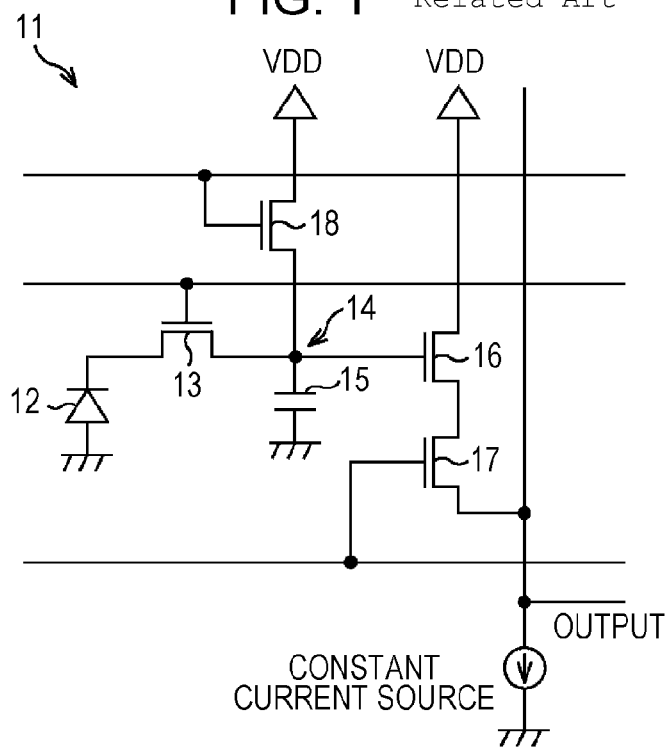
FIG. 1 is a circuit diagram illustrating an example of the configuration of a pixel used in a solid-state imaging element of the related art.
Figure 2:
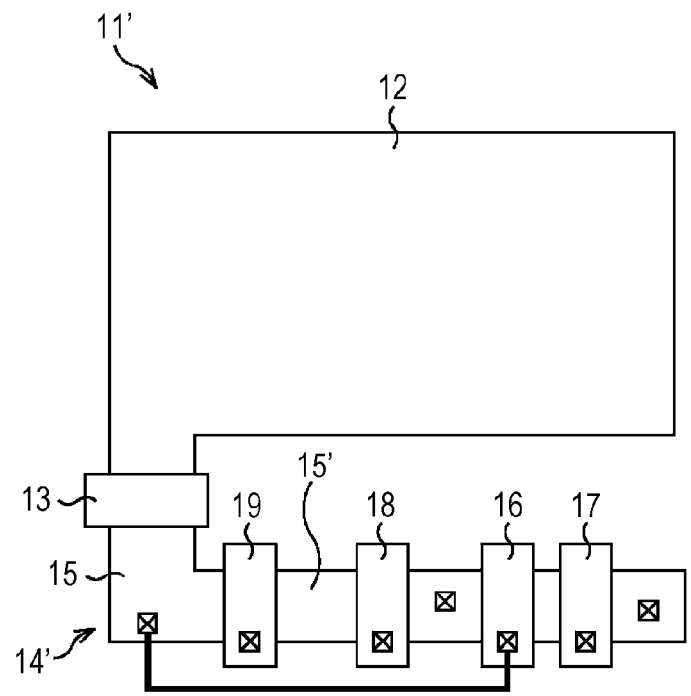
FIG. 2 schematically illustrates a planar structure of a pixel that is capable of changing the capacitance of an FD in which electric charge is stored.
Figure 3:
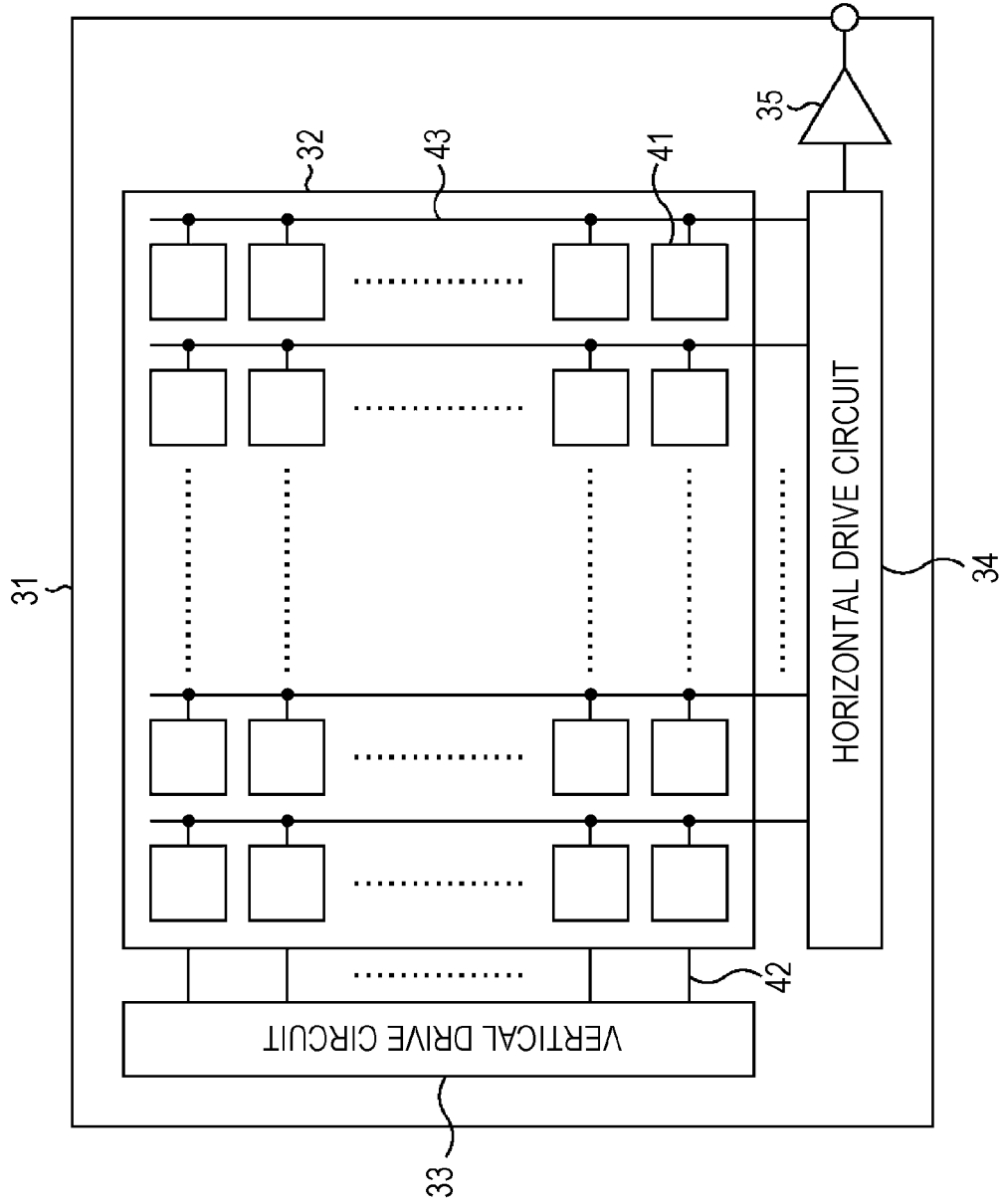
FIG. 3 is a block diagram illustrating an example of the configuration of a solid-state imaging element according to an embodiment of the present disclosure.

FIG. 3 is a block diagram illustrating an example of the configuration of a solid-state imaging element 31 according to an embodiment of the present disclosure.

In FIG. 3, the solid-state imaging element 31 includes a pixel array 32, a vertical drive circuit 33, a horizontal drive circuit 34, and an output circuit 35.

In the pixel array 32, a plurality of pixels 41 are arranged in a matrix form, and the pixels 41 in each row are connected to the vertical drive circuit 33 via a horizontal signal line 42 and the pixels 41 in each column are connected to the horizontal drive circuit 34 via a vertical signal line 43.

The vertical drive circuit 33 outputs drive signals (e.g., a transfer signal TX, a selection signal SEL, and a reset signal RST) to the pixels 41 in each row disposed in the pixel array 32 via the associated horizontal signal line 42, thereby driving the pixels 41.

The horizontal drive circuit 34 executes column processing by performing a correlated double sampling (CDS) operation. The column processing is executed in order to detect signal levels from signals output from the individual pixels 41 of the pixel array 32 via the vertical signal lines 43. The horizontal drive circuit 34 then supplies output signals representing electrons which have been generated in the pixels 41 as a result of performing photoelectric conversion to the output circuit 35.

The output circuit 35 amplifies output signals sequentially supplied from the horizontal drive circuit 34 to a predetermined voltage level, and then, outputs the amplified output signals to an image processing circuit, which is disposed subsequent to the output circuit 35.

Figure 4:
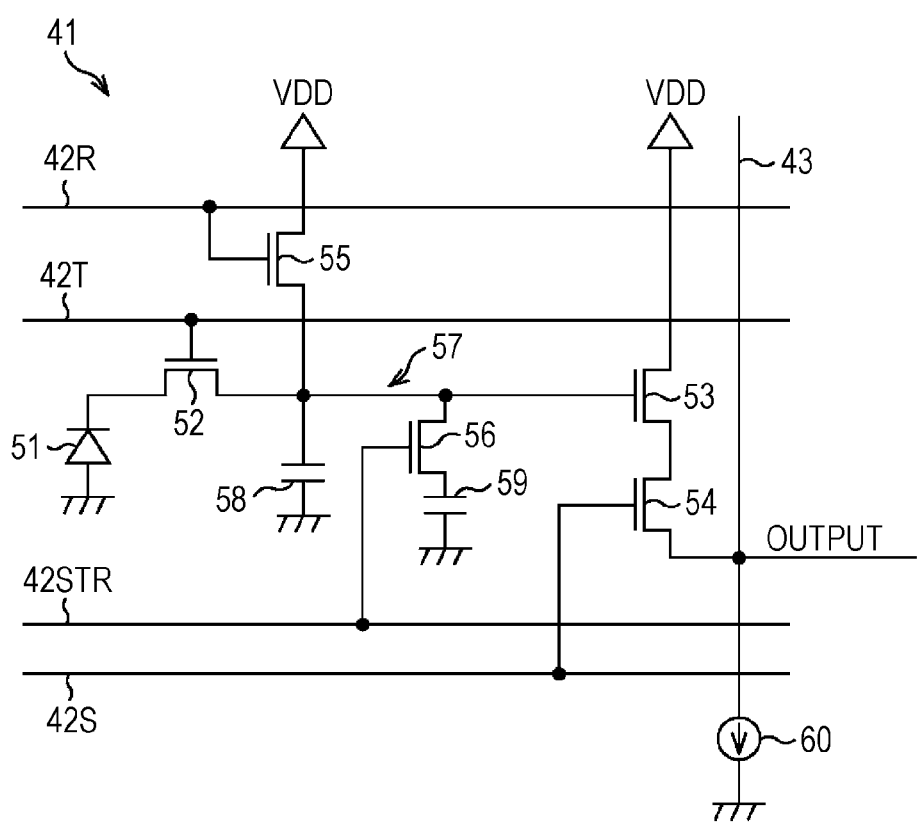
FIG. 4 is a circuit diagram illustrating an example of a first configuration of a pixel.

FIG. 4 is a circuit diagram illustrating an example of a first configuration of the pixel 41.

The pixel 41 includes, as shown in FIG. 4, a PD 51, a transfer transistor 52, an amplifier transistor 53, a selection transistor 54, a reset transistor 55, and a thin-film transistor 56. The node between the transfer transistor 52 and the amplifier transistor 53 forms an FD 57. The FD 57 is capable of storing electrons by using a capacitor 58 included in the FD 57 and an additional capacitor 59 connected to the FD 57 via the thin-film transistor 56.

The PD 51 is a photoelectric transducer which is constituted of a pn junction formed in a silicon substrate and which converts incident light into electric charge (electrons or holes) through photoelectric conversion and stores the electric charge. The anode terminal of the PD 51 is grounded, and the cathode terminal of the PD 51 is connected to the FD 57 via the transfer transistor 52.

The transfer transistor 52 is driven in accordance with the transfer signal TX supplied from the vertical drive circuit 33 (FIG. 3) via a horizontal signal line 42T, and is turned ON when the transfer signal TX is made to have a high level in a pulsed form. When the transfer transistor 52 is turned ON, electrons generated in the PD 51 are transferred to the FD 57 via the transfer transistor 52.

The FD 57 is connected to the gate electrode of the amplifier transistor 53. The amplifier transistor 53 outputs a voltage corresponding to electrons stored in the FD 57, i.e., a voltage which has been generated in the PD 51 through photoelectric conversion and transferred to the FD 57.

The selection transistor 54 is driven in accordance with the selection signal SEL supplied from the vertical drive circuit 33 via a horizontal signal line 42S, and is turned ON when the selection signal SEL is made to have a high level in a pulsed form. When the selection transistor 54 is turned ON, the voltage output from the amplifier transistor 53 is ready to be output to the vertical signal line 43 via the selection transistor 54.

For example, a plurality of pixels 41 are connected to the vertical signal line 43, and by turning ON the selection transistors 54 in a specific line (row), signals from the PDs 51 associated with the specific line are output. The vertical signal line 43 is connected to a constant current source 60 included in the horizontal drive circuit 34 shown in FIG. 3, and a signal representing a level corresponding to electrons stored in the FD 57 is output by a source-follower circuit constituted of the amplifier circuit 53 and the constant current source 60.

The reset transistor 55 is driven in accordance with the reset signal RST supplied from the vertical drive circuit 33 via a horizontal signal line 42R, and is turned ON when the reset signal RST is made to have a high level in a pulsed form. When the reset transistor 55 is turned ON, electrons stored in the FD 57 are discharged to a constant voltage source VDD via the reset transistor 55, thereby resetting the FD 57.

The thin-film transistor 56 is a switching element (connecting unit) for connecting or disconnecting the FD 57 and the additional capacitor 59. The thin-film transistor 56 is driven in accordance with a connection signal STR supplied from the vertical drive circuit 33 via a horizontal signal line 42STR, and connects the additional capacitor 59 to the FD 57 when the connection signal STR is turned ON in a pulsed form.

The FD 57 stores electrons transferred from the PD 51 via the transfer transistor 52. For example, when the thin-film transistor 56 is OFF, the FD 57 stores electrons in the capacitor 58 included in the FD 57. When the thin-film transistor 56 is ON, the FD 57 stores electrons in the capacitor 58 included in the FD 57 and also in the additional capacitor 59 connected to the FD 57 via the thin-film transistor 56.

Figure 5A:
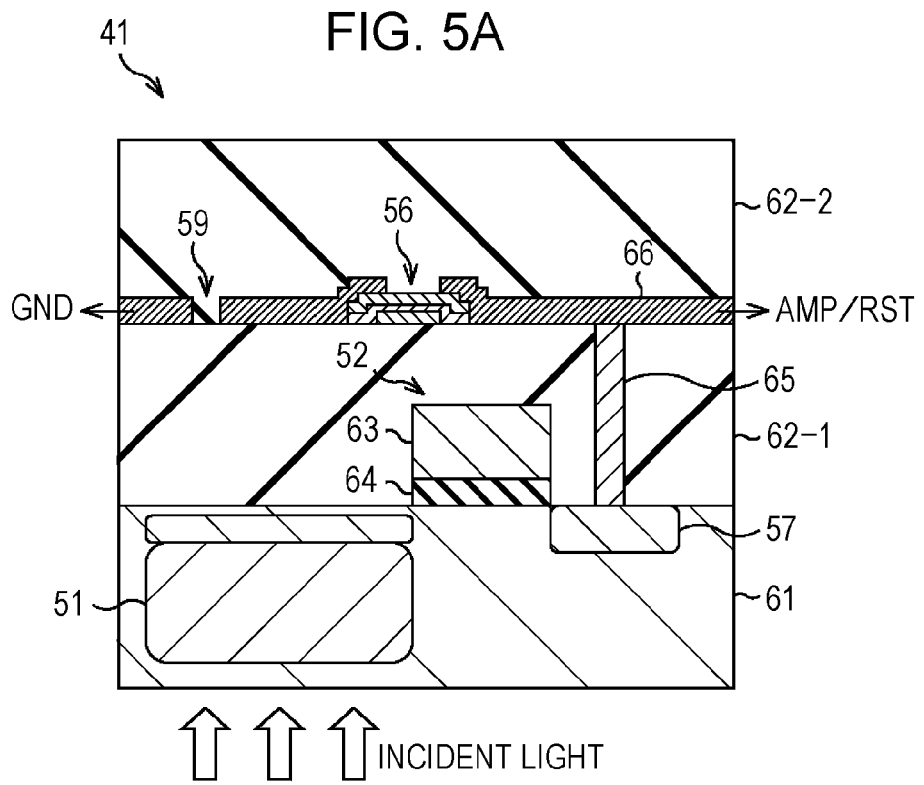
FIGS. 5A and 5B illustrate examples of a sectional configuration and a planar configuration, respectively, of a pixel.
Figure 5B:
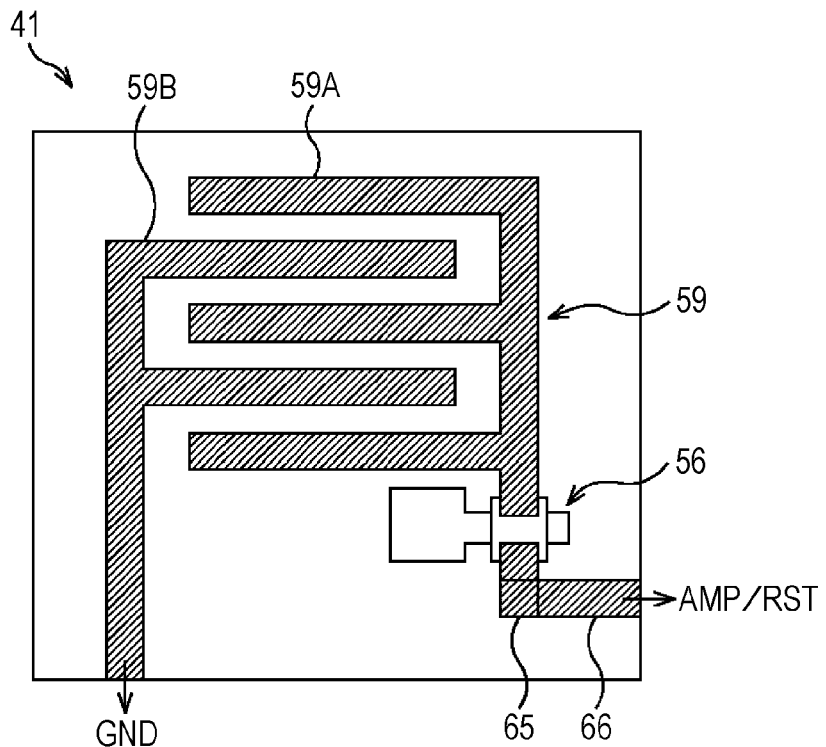

The structure of the pixel 41 will now be described below with reference to FIGS. 5A and 5B. FIG. 5A illustrates an example of the sectional configuration of the FD 57 and surrounding components of the pixel 41. FIG. 5B illustrates an example of the planar configuration of a wiring layer of the pixel 41.

The solid-state imaging element including the pixel 41 shown in FIGS. 5A and 5B has a so-called backside illumination structure. With this structure, the thin-film transistor 56 and the additional capacitor 59 are disposed in an interlayer insulating film, and thus, the amount of light incident on the photoelectric conversion region is not decreased. Details of the structure of a backside illumination solid-state imaging element are disclosed in, for example, Japanese Patent No. 3759435 filed by the assignee of the present disclosure.

Incident light is applied to the back side of a P-type silicon substrate 61 facing downward in FIG. 5A. The side opposite the back side is the front side of the pixel 41. An interlayer insulating film 62-1 is stacked on the front side of the P-type silicon substrate 61, and an interlayer insulating film 61-2 is stacked on the interlayer insulating film 62-1. A wiring layer is formed between the interlayer insulating films 62-1 and 62-2.

The PD 51 is formed of an N-type region formed in the P-type silicon substrate 61, and a gate electrode 63 of the transfer transistor 52 is disposed on the front side of the P-type silicon substrate 61 with an insulating layer 64 therebetween so as to be adjacent to the PD 51. The FD 57 is formed of an N-type region formed near the front side and within the silicon substrate 61 at a position separate from the PD 51 with the transfer transistor 52 therebetween.

The FD 57 is connected to a metal wiring 66, which is disposed in the wiring layer formed between the interlayer insulating films 62-1 and 62-2, through a contact via-hole 65 passing through the interlayer insulating film 62-1.

One end of the metal wiring 66 is connected to the amplifier transistor 53 and the reset transistor 55, and the other end of the metal wiring 66 is connected to one end of the thin-film transistor 56 formed in the wiring layer. As shown in FIG. 5B, one electrode 59A of the additional capacitor 59 is connected to the other end of the thin-film transistor 56, and another electrode 59B of the additional capacitor 59 is grounded (GND). The electrode 59B of the additional capacitor 59 may be connected to the constant voltage source VDD.

As shown in FIG. 5B, the pair of electrodes 59A and 59B forming the additional capacitor 59 are formed in a so-called comb-like shape, and wiring portions corresponding to the teeth of the comb-like shape of the electrode 59A and those of the electrode 59B are alternately disposed with a predetermined spacing therebetween. These wiring portions serve as capacitors storing electrons therein. The additional capacitor 59 has a certain area, and is formed in a region in which it overlaps the PD 51 when viewed from above.

The pixel 41 is formed as described above. The thin-film transistor 56 is driven under the control of the vertical drive circuit 33 so as to connect or disconnect the FD 57 and the additional capacitor 59. The vertical drive circuit 33 controls connecting/disconnecting operations of the thin-film transistor 56 in accordance with, for example, the amount of incident light.

In the pixel 41, as shown in FIG. 5A, the thin-film transistor 56 and the additional capacitor 59 are not formed in the P-type silicon substrate 61 in which the PD 51 is formed, but formed within the wiring layer which is disposed separate from the P-type silicon substrate 61 with the interlayer insulating film 62-1 therebetween. With this configuration, compared with a structure in which, for example, a switching element and an additional capacitor are formed within the silicon substrate 61, a wider area is secured for the PD 51, thereby maintaining the photoelectric conversion efficiency of the PD 51. Additionally, in a structure in which a metal wiring is used for part of the additional capacitor 59, if contacts leading to a switching element or the metal wiring remain, the area of the PD 51 is reduced. However, in the pixel 41 configured as described above, the area of the PD 51 is not decreased.

Moreover, as stated above, the solid-state imaging element including the pixel 41 has a backside illumination structure, and the additional capacitor 59 is formed by using the metal wiring 66 in the wiring layer such that it overlaps the PD 51 when viewed from above. It is thus possible to secure the capacitance and to reduce the number of manufacturing steps at the same time.

Figure 6:
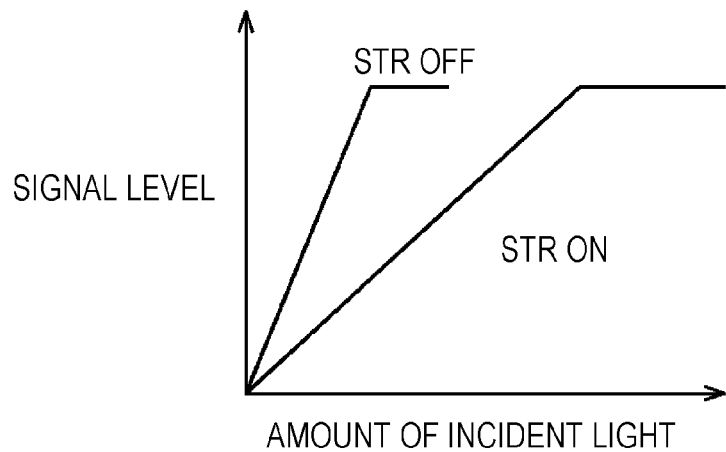
FIG. 6 illustrates the relationship between the amount of incident light and the level of an output signal.

FIG. 6 illustrates the relationship between the amount of incident light and the level of an output signal.

For example, when the thin-film transistor 56 is OFF, the FD 57 stores electrons in the capacitor 58 included in the FD 57. When the thin-film transistor 56 is ON, the FD 57 stores electrons in the capacitor 58 included in the FD 57 and in the additional capacitor 59 connected to the FD 57 via the thin-film transistor 56. The gradient of the level of an output signal with respect to the amount of incident light when the capacitance of the FD 57 is smaller is much sharper (higher gain) than that when the capacitance of the FD 57 is larger.

Accordingly, when the amount of incident light is small, the thin-film transistor 56 is turned OFF so as to decrease the capacitance of the FD 57, thereby allowing a signal to be output with a higher gain. In contrast, when the amount of incident light is large, the thin-film transistor 56 is turned ON so as to increase the capacitance of the FD 57, thereby making it possible to handle a larger amount of incident light.

A method for driving the pixel 41 will now be described below.

Figure 7:
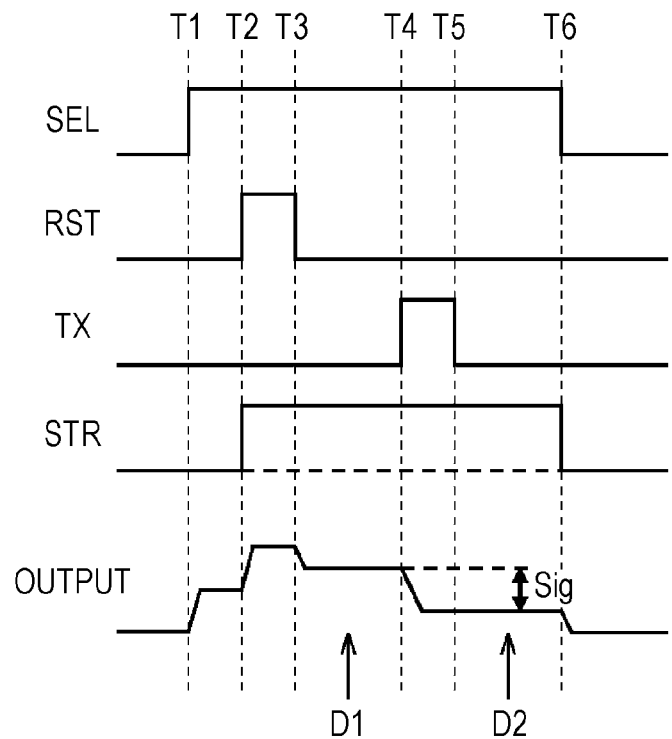
FIG. 7 is a timing chart illustrating an example of the drive timing at which a pixel is driven by using a first drive method.

FIG. 7 is a timing chart illustrating an example of the drive timing at which the pixel 41 is driven by using a first drive method. In the first drive method, it is possible to select the dynamic range of the pixel 41, depending on whether the thin-film transistor 56 is turned ON or OFF during a signal readout period. Each of the signals supplied via the horizontal signal line 42 can take one of two values, i.e., a high level and a low level. Assume that electrons generated as a result of performing photoelectric conversion in accordance with the amount of light were already stored in the PD 51 before a period from time T1 to T6 (hereinafter such a period may be referred to as the "readout period") shown in FIG. 7.

The vertical drive circuit 33 sequentially reads pixels 41 arranged in a matrix form row by row. At time T1 when the readout period for the pixel 41 is started, the vertical drive circuit 33 makes the selection signal SEL, which is to be supplied to the selection transistor 54 via the horizontal signal line 42S, to have a high level. Then, a signal is ready to be output from the pixel 41 to the horizontal drive circuit 34 via the vertical signal line 43.

At time T2, the vertical drive circuit 33 makes the reset signal RST, which is to be supplied to the reset transistor 55 via the horizontal signal line 42R, to have a high level so as to turn ON the reset transistor 55, thereby discharging electrons stored in the FD 57.

At time T3, the vertical drive circuit 33 makes the reset signal RST to have a low level so as to turn OFF the reset transistor 55, thereby finishing resetting the FD 57. At this time, an output voltage is slightly reduced because of a coupling capacitance between the FD 57 and the reset transistor 55, and thus, after the output voltage is stabilized, a signal representing a reset level of the FD 57 is detected by a detector of the horizontal drive circuit 34 as a detection value D1.

At time T4, the vertical drive circuit 33 makes the transfer signal TX, which is to be supplied to the transfer transistor 52 via the horizontal signal line 42T, to have a high level so as to turn ON the transfer transistor 52, thereby transferring electrons stored in the PD 51 to the FD 57.

At time T5, the vertical drive circuit 33 makes the transfer signal TX to have a low level so as to turn OFF the transfer transistor 52, thereby finishing transferring electrons. Then, a signal representing a level corresponding to electrons stored in the FD 57 is detected by the detector of the horizontal drive circuit 34 as a detection value D2.

At time T6, the vertical drive circuit 33 makes the selection signal SEL, which is to be supplied to the selection transistor 54 via the horizontal signal line 42S, to have a low level. With this operation, the readout period for the pixels 41 is completed.

The vertical drive circuit 33 drives the pixel 41 at the drive timing as described above, and a signal representing the difference between the detection value D1 and the detection value D2 is output from the horizontal drive circuit 34 as an output signal representing a level corresponding to electrons which have been generated in the PD 51 as a result of performing photoelectric conversion.

The vertical drive circuit 33 selects one of the low gain mode or the high gain mode in advance before starting reading a signal from the pixel 41. For example, the vertical drive circuit 33 selects the low gain mode or the high gain mode in accordance with the amount of incident light, e.g., the amount of light based on a signal which was output one frame before or the amount of light output from a sensor (not shown).

When the amount of light is small, the vertical drive circuit 33 selects the high gain mode and makes the connection signal STR, which is to be supplied to the thin-film transistor 56 via the horizontal signal line 42STR, to have a low level, thereby storing electrons in the capacitor 58 included in the FD 57. In contrast, when the amount of light is large, the vertical drive circuit 33 selects the low gain mode and makes the connection signal STR, which is to be supplied to the thin-film transistor 56 via the horizontal signal line 42STR, to have a high level during the period from time T2 to T6. With this operation, the vertical drive circuit 33 stores electrons in the capacitor 58 included in the FD 57 and in the additional capacitor 59 connected to the FD 57 via the thin-film transistor 56.

Accordingly, in the solid-state imaging element 31, when illuminance is low, the high gain mode is selected, and an output signal amplified with a high gain is output. In contrast, when illuminance is high, the low gain mode is selected, thereby making it possible to handle a larger amount of light. In this manner, by dynamically changing the capacitance of the FD 57, the dynamic range of the solid-state imaging element 31 can be increased. Additionally, even when illuminance is low, images with reduced noise can be obtained, and even when illuminance is high, high quality images without overflow can be obtained.

In the first drive method discussed with reference to FIG. 7, it is necessary to select the high gain mode or the low gain mode in advance. Alternatively, a drive method in which the high gain mode or the low gain mode is automatically selected in accordance with a level of an output signal may be employed.

Figure 8:
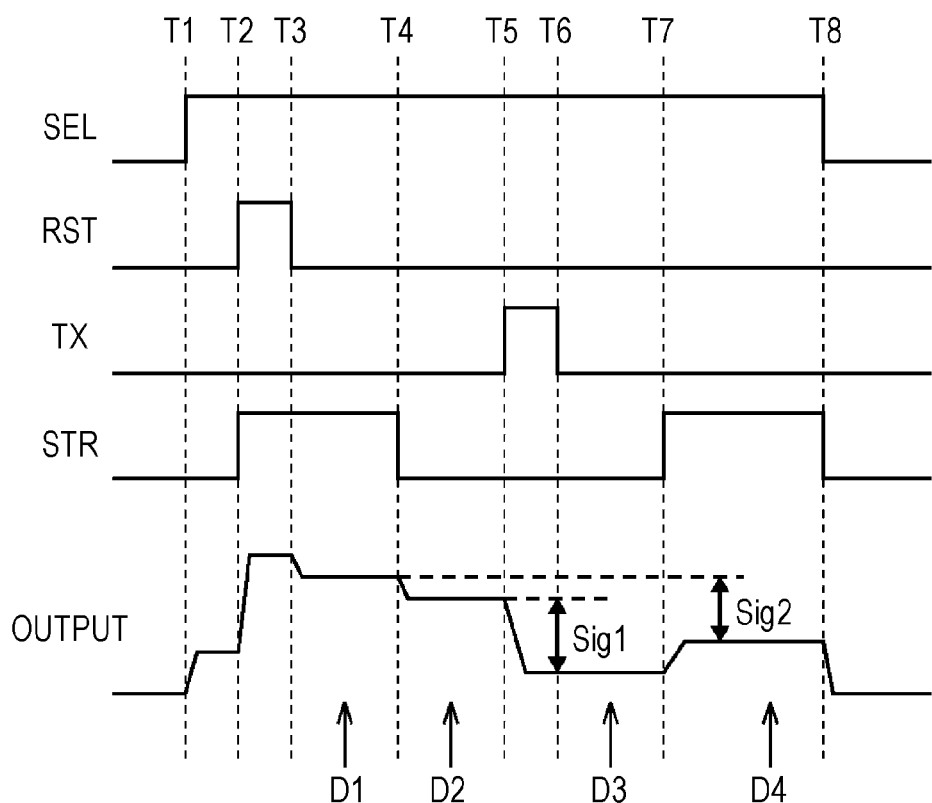
FIG. 8 is a timing chart illustrating an example of the drive timing at which a pixel is driven by using a second drive method.

FIG. 8 is a timing chart illustrating an example of the drive timing at which the pixel 41 is driven by using a second drive method.

At time T1, the vertical drive circuit 33 makes the selection signal SEL, which is to be supplied to the selection transistor 54 via the horizontal signal line 42S, to have a high level. Then, a signal is ready to be output from the pixel 41 to the horizontal drive circuit 34 via the vertical signal line 43.

At time T2, the vertical drive circuit 33 makes the reset signal RST, which is to be supplied to the reset transistor 55 via the horizontal signal line 42R, to have a high level and also causes the connection signal STR, which is to be supplied to the thin-film transistor 56 via the horizontal signal line 42STR, to have a high level. With this operation, in the state in which the additional capacitor 59 is connected to the FD 57, electrons stored in the capacitor 58 and in the additional capacitor 59 are discharged, thereby resetting the FD 57.

At time T3, the vertical drive circuit 33 makes the reset signal RST to have a low level so as to turn OFF the reset transistor 55, thereby finishing resetting the FD 57. Then, a signal representing a reset level of the FD 57 in the state in which the additional capacitor 59 is connected to the FD 57 is detected by the detector of the horizontal drive circuit 34 as a detection value D1.

At time T4, the vertical drive circuit 33 makes the connection signal STR, which is to be supplied to the thin-film transistor 56 via the horizontal signal line 42STR, to have a low level, thereby turning OFF the thin-film transistor 56. Then, a signal representing a reset level of the FD 57 in the state in which the additional capacitor 59 is not connected to the FD 57 is detected by the detector of the horizontal drive circuit 34 as a detection value D2.

At time T5, the vertical drive circuit 33 makes the transfer signal TX, which is to be supplied to the transfer transistor 52 via the horizontal signal line 42T, to have a high level so as to turn ON the transfer transistor 52, thereby transferring electrons stored in the PD 51 to the FD 57.

At time T6, the vertical drive circuit 33 makes the transfer signal TX to have a low level so as to turn OFF the transfer transistor 52, thereby finishing transferring electrons from the PD 51 to the FD 57. At this time, the additional capacitor 59 is not connected to the FD 57, and electrons generated in the PD 51 as a result of photoelectric conversion are stored in the capacitor 58 included in the FD 57. Then, a signal representing a level corresponding to electrons stored in the capacitor 58 is detected by the detector of the horizontal drive circuit 34 as a detection value D3.

At time T7, the vertical drive circuit 33 makes the connection signal STR, which is to be supplied to the thin-film transistor 56 via the horizontal signal line 42STR, to have a high level, thereby turning ON the thin-film transistor 56. With this operation, the additional capacitor 59 is connected to the FD 57, and then, a signal representing a level corresponding to electrons stored in the capacitor 58 and in the additional capacitor 59 is detected by the detector of the horizontal drive circuit 34 as a detection value D4.

At time T8, the vertical drive circuit 33 makes the connection signal STR, which is to be supplied to the thin-film transistor 56 via the horizontal signal line 42STR, to have a low level, and also makes the selection signal SEL, which is to be supplied to the selection transistor 54 via the horizontal signal line 42S, to have a low level. With this operation, the readout period for the pixels 41 is completed.

In the second drive method, during the readout period for which a signal is read from the pixel 41, the connection/disconnection of the FD 57 and the additional capacitor 59 is switched, and a signal is read in the state in which the FD 57 and the additional capacitor 59 are connected, and also, a signal is read in the state in which the FD 57 and the capacitor 59 are not connected.

With this driving, a signal representing the difference between the detection value D2 and the detection value D3 is output as an output signal Sig1 having a level corresponding to electrons generated in the PD 51 and stored in the capacitor 58 included in the FD 57. That is, the output signal Sig1 is an output signal in the high gain mode. Meanwhile, a signal representing the difference between the detection value D1 and the detection value D4 is output as an output signal Sig2 having a level corresponding to electrons generated in the PD 51 and stored in the capacitor 58 included in the FD 57 and in the additional capacitor 59 connected to the FD 57. That is, the output signal Sig2 is an output signal in the low gain mode.

The output signal Sig1 in the high gain mode is saturated with a lower amount of light than the output signal Sig2 in the low gain mode. Thus, the level at which the output signal Sig1 in the high gain mode is saturated is determined in advance, and when the output signal Sig1 exceeds the determined level, the output signal Sig2 in the low gain mode is employed. With this arrangement, it is possible to handle a larger amount of light while securing the sensitivity when the amount of light is smaller.

That is, in the second drive method, it is possible to uniquely select one of the output signal Sig1 in the high gain mode and the output signal Sig2 in the low gain mode in accordance with the output signal Sig1 in the high gain mode. With this arrangement, the high gain mode is automatically selected when illuminance is low, and the low gain mode is automatically selected when illuminance is high. As a result, the solid-state imaging element 31 with a wide dynamic range is implemented.

Figure 9:
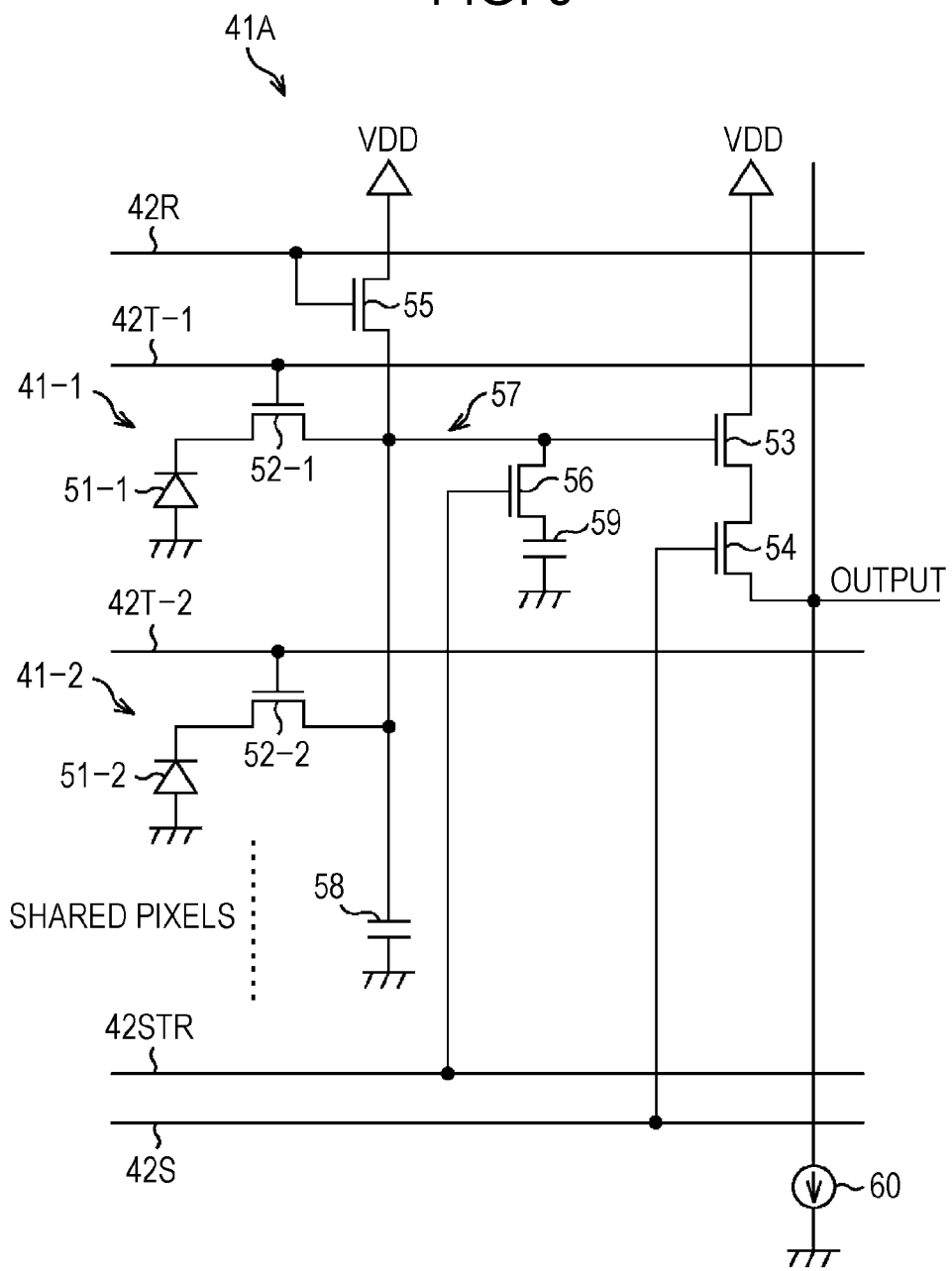
FIG. 9 is a circuit diagram illustrating an example of a second configuration of a pixel.

FIG. 9 is a circuit diagram illustrating an example of a second configuration of the pixel 41 (hereinafter denoted by 41A).

As shown in FIG. 9, the pixel 41A has a two-pixel sharing structure including two pixels 41-1 and 41-2. Alternatively, the number of pixels shared by the pixel 41A may be increased to four or eight.

In the pixel 41A, the pixels 41-1 and 41-2 share an amplifier transistor 53, a selection transistor 54, a reset transistor 55, and an FD 57. That is, in the pixel 41A, a PD 51-1 included in the pixel 41-1 is connected to the FD 57 via a transfer transistor 52-1, while a PD 51-2 included in the pixel 41-2 is connected to the FD 57 via a transfer transistor 52-2. In the pixel 41A, as well as in the pixel 41 shown in FIG. 4, an additional transistor 59 is connected to the FD 57 via a thin-film transistor 56.

Figure 10:
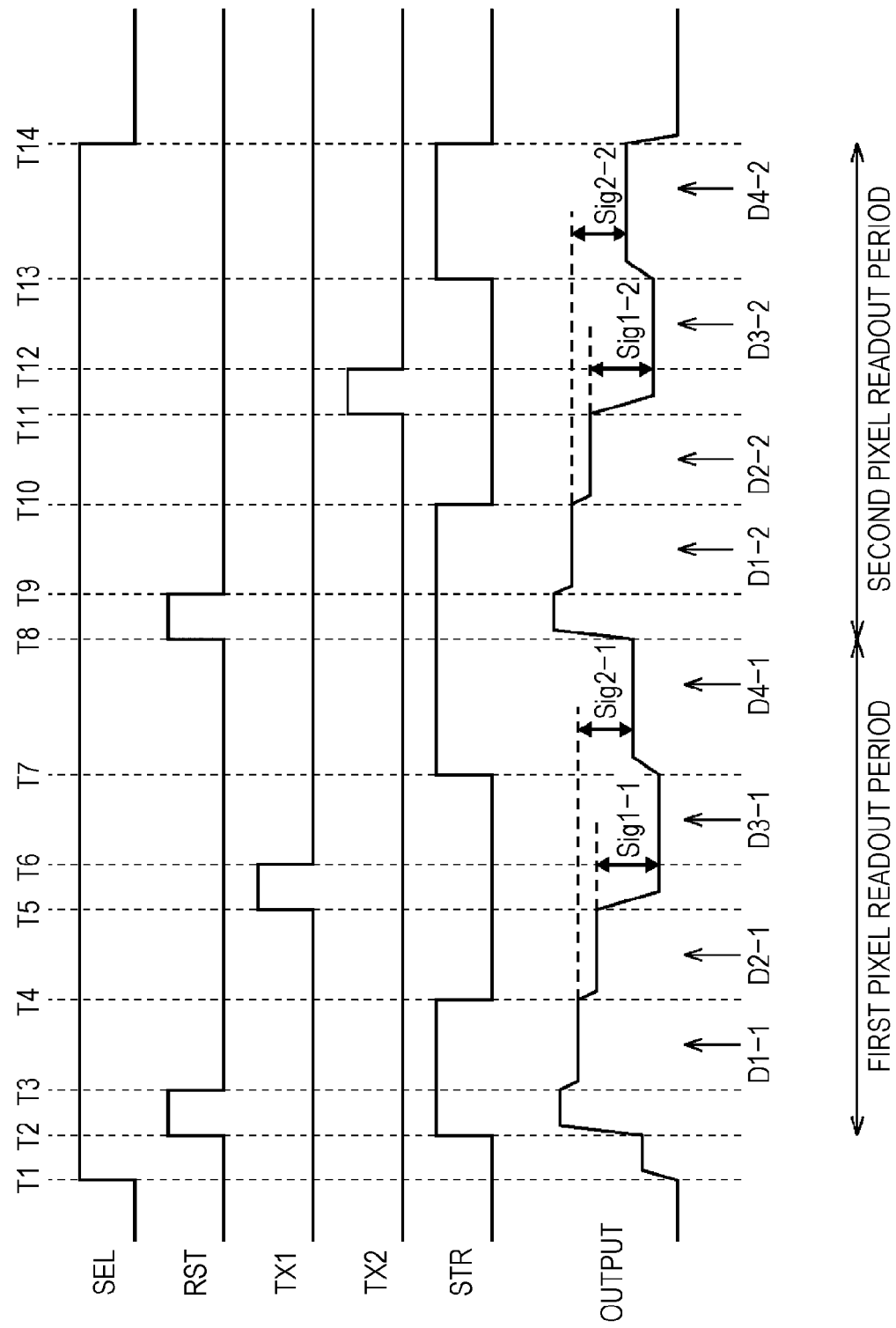
FIG. 10 is a timing chart illustrating an example of the drive timing at which a pixel is driven by using a third drive method.

FIG. 10 is a timing chart illustrating an example of the drive timing at which the pixel 41A is driven by using a third drive method.

In the pixel 41A having a two-pixel sharing structure, for example, a signal is read from the pixel 41-1 during a first pixel readout period, and then, a signal is read from the pixel 41-2 during a second pixel readout period.

At time T1, the vertical drive circuit 33 makes the selection signal SEL, which is to be supplied to the selection transistor 54 via the horizontal signal line 42S, to have a high level. With this operation, a signal is ready to be output from the pixel 41A to the horizontal drive circuit 34 via the vertical signal line 43.

The period from time T2 to T8 is the first pixel readout period during which a signal is read from the pixel 41-1, as during the period from T2 to T8 discussed with reference to FIG. 8. That is, at time T5, the transfer signal TX1, which is to be supplied to the transfer transistor 52-1, is made to have a high level, causing the transfer transistor 52-1 to be turned ON, thereby transferring electrons stored in the PD 51-1 to the FD 57.

Then, a signal representing the difference between a detection value D2-1 detected after time T4 and a detection value D3-1 detected after time T6 is output as an output signal Sig1-1 having a level corresponding to electrons generated in the PD 51-1 and stored in the capacitor 58 included in the FD 57. Moreover, a signal representing the difference between a detection value D1-1 detected after time T3 and a detection value D4-1 detected after time T7 is output as an output signal Sig2-1 having a level corresponding to electrons generated in the PD 51-1 and stored in the capacitor 58 included in the FD 57 and in the additional capacitor 59 connected to the FD 57.

Then, the period from time T8 to T14 is the second pixel readout period during which a signal is read from the pixel 41-2, as during the period from T2 to T8 discussed with reference to FIG. 8. That is, at time T11, the transfer signal TX2, which is to be supplied to the transfer transistor 52-2, is made to have a high level, causing the transfer transistor 52-2 to be turned ON, thereby transferring electrons stored in the PD 51-2 to the FD 57.

Then, a signal representing the difference between a detection value D2-2 detected after time T10 and a detection value D3-2 detected after time T12 is output as an output signal Sig1-2 having a level corresponding to electrons generated in the PD 51-2 and stored in the capacitor 58 included in the FD 57. Moreover, a signal representing the difference between a detection value D1-2 detected after time T9 and a detection value D4-2 detected after time T13 is output as an output signal Sig2-2 having a level corresponding to electrons generated in the PD 51-2 and stored in the capacitor 58 included in the FD 57 and in the additional capacitor 59 connected to the FD 57.

As described above, in the pixel 41A having a two-pixel sharing structure including the pixels 41-1 and 41-2, the output signals Sig1-1 and Sig2-1 are read from the pixel 41-1, while the output signals Sig1-2 and Sig2-2 are read from the pixel 41-2. In the third drive method, as well as in the second drive method discussed with reference to FIG. 8, the high gain mode or the low gain mode is automatically selected in accordance with the output signals Sig1-1 and Sig1-2. Alternatively, as in the first drive method discussed with reference to FIG. 7, a drive method in which the low gain mode or the high gain mode is selected in advance may be employed for the pixel 41A.

An example of the planar configuration of the pixel 41A will now be described below with reference to FIGS. 11 through 13. In the circuit diagram shown in FIG. 9, the pixel 41A includes a single set of the thin-film transistor 56 and the additional capacitor 59. However, as shown in FIGS. 11 through 13, the pixel 41A includes two sets of thin-film transistors 56 and additional capacitors 59, the two sets being driven by the same connection signal STR.

Figure 11:
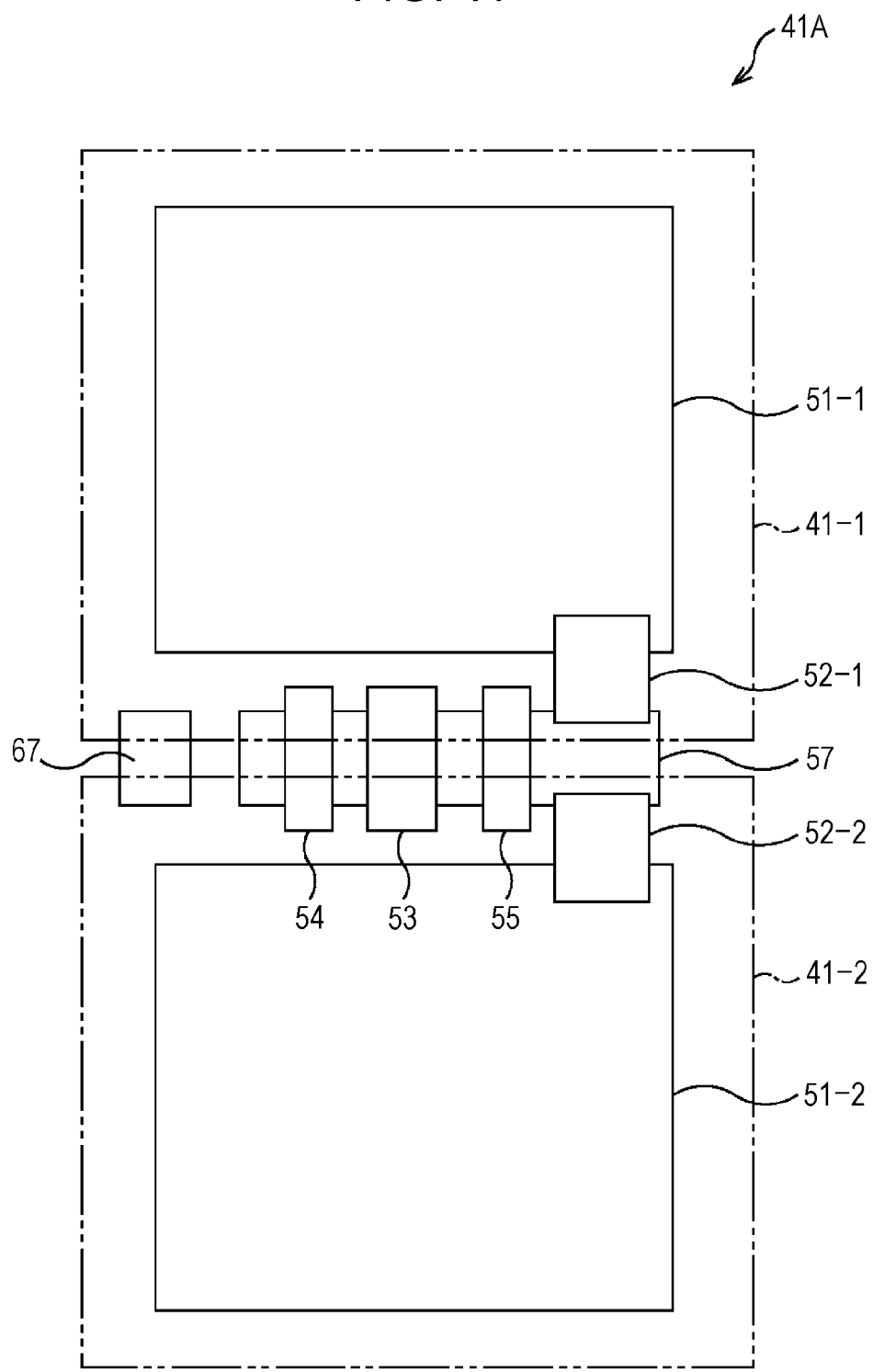
FIG. 11 illustrates a layout of a pixel on a silicon substrate.

FIG. 11 illustrates a layout of the pixel 41A on a silicon substrate.

The FD 57, which is used for both the pixels 41-1 and 41-2, is disposed between the PD 51-1 and the PD 51-2. The PD 51-1 is connected to the FD 57 via the transfer transistor 52-1, while the PD 51-2 is connected to the FD 57 via the transfer transistor 52-2. The reset transistor 55 is disposed adjacent to the FD 57. The amplifier transistor 53 is disposed adjacent to the reset transistor 55, and the selection transistor 54 is disposed adjacent to the amplifier transistor 53. This forms a source follower circuit serving as an output buffer. A well contact 67 is formed in an isolation region between the PDs 51-1 and 51-2.

Figure 12:
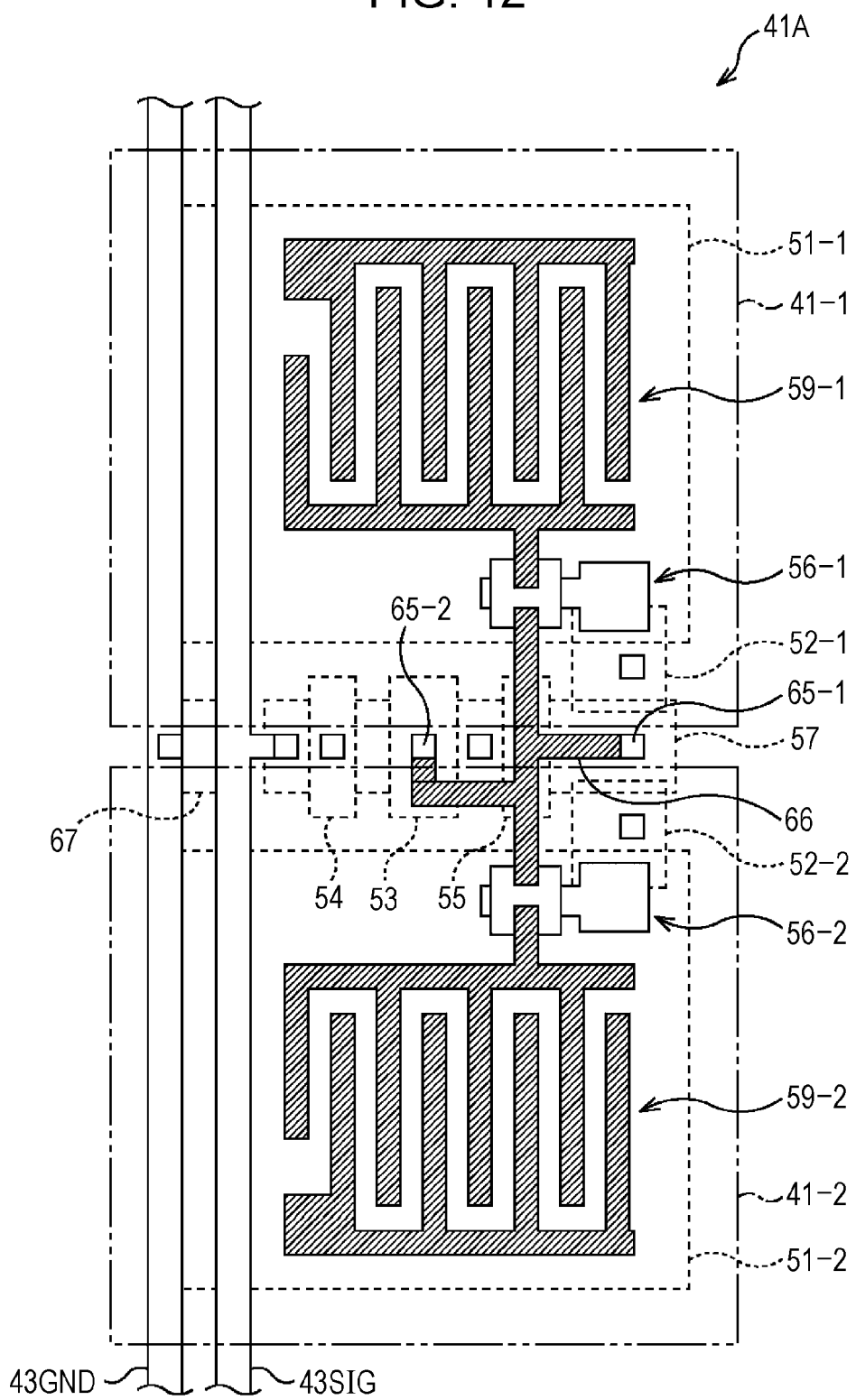
FIG. 12 illustrates a layout of a first metal wiring layer.
Figure 13:
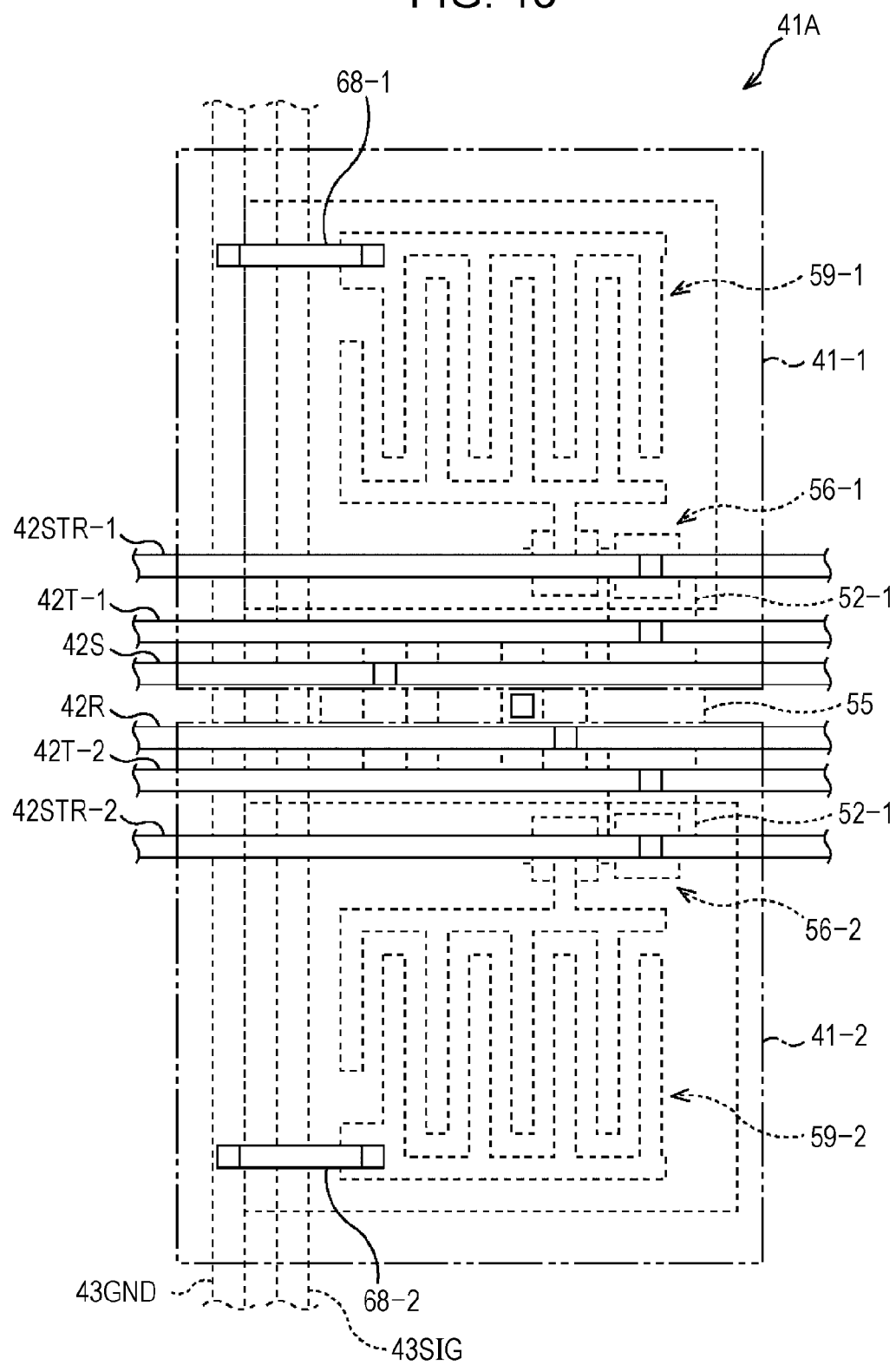
FIG. 13 illustrates a layout of a second metal wiring layer.

FIG. 12 illustrates a layout of a first metal wiring layer formed on the silicon substrate with a first interlayer insulating film therebetween.

A metal wiring 66 is connected to a contact via-hole 65-1 which is connected to the FD 57. The metal wiring 66 is connected to the amplifier transistor 53 through a contact via-hole 65-2, and is also connected to one end of a thin-film transistor 56-1 and to one end of a thin-film transistor 56-2. The other end of the thin-film transistor 56-1 is connected to an additional capacitor 59-1, while the other end of the thin-film transistor 56-2 is connected to an additional capacitor 59-2.

The thin-film transistor 56-1 and the additional capacitor 59-1 are formed in a region in which they overlap the PD 51-1 as viewed from above. The thin-film transistor 56-2 and the additional capacitor 59-2 are formed in a region in which they overlap the PD 51-2 as viewed from above. The additional capacitors 59-1 and 59-2 form in a comb-like shape, as discussed with reference to FIG. 5B.

An output (source electrode) of the selection transistor 54 is connected to an output signal wiring 43SIG forming the vertical signal line 43, and the well contact 67 is connected to a ground wiring 43GND forming the vertical signal line 43.

FIG. 13 illustrates a layout of a second metal wiring layer formed on the first metal wiring layer with a second interlayer insulating film therebetween.

One of the electrodes forming the additional capacitor 59-1 is connected to the ground wiring 43GND via a wiring 68-1 formed in the second metal wiring layer. One of the electrodes forming the additional capacitor 59-2 is connected to the ground wiring 43GND via a wiring 68-2 formed in the second metal wiring layer.

Additionally, in the second metal wiring layer, horizontal signal lines 42STR-1 and 42STR-2, 42T-1 and 42T-2, 42S, and 42R are formed. The horizontal signal lines 42STR-1 and 42STR-2 are connected to the thin-film transistors 56-1 and 56-2, respectively. The horizontal signal lines 42T-1 and 42T-2 are connected to the transfer transistors 52-1 and 52-2, respectively. The horizontal signal line 42S is connected to the selection transistor 54, and the horizontal signal line 42R is connected to the reset transistor 55.

With the layout described above, the pixel 41A having a two-pixel sharing structure including the pixels 41-1 and 41-2 can be formed. The pixel 41A shares the amplifier transistor 53, the selection transistor 54, the reset transistor 55, and the FD 57. This makes it possible to increase the areas of the PDs 51-1 and 51-2, thereby improving the photoelectric conversion efficiency.

The layouts of the pixel 41A shown in FIGS. 11 through 13 are merely examples of layouts that implement the functions of this embodiment, and various layouts that implement similar functions may be employed.

FIG. 14 is a sectional view illustrating an example of a third configuration of the pixel 41 (hereinafter denoted by 41B).

As shown in FIG. 14, the pixel 41B is configured as follows. Interlayer insulating films 62-1 through 62-3 are sequentially stacked on the front side of the silicon substrate 61. A first wiring layer is formed between the interlayer insulating films 62-1 and 62-2, and a second wiring layer is formed between the interlayer insulating films 62-2 and 62-3. In the pixel 41B, the thin-film transistor 56 and the additional capacitor 59 are formed in the second wiring layer, and a light blocking film 69 is formed in the first wiring layer between the silicon substrate 61 and the second wiring layer. The light blocking film 69 is formed by using metal of the first wiring layer and is disposed such that it covers the thin-film transistor 56 as viewed from the silicon substrate 61.

In this manner, in the pixel 41B, because of the formation of the light blocking film 69, light which has been incident on the back side of the silicon substrate 61 and has not been absorbed in the silicon substrate 61 can be blocked by the light blocking film 69. Assume that light which has not been absorbed in the silicon substrate 61 reaches the thin-film transistor 56. In this case, if a semiconductor layer having a narrow band gap is used, a leak current may be generated as a result of photoelectric conversion in the thin-film transistor 56.

In contrast, in the pixel 41B, the light blocking film 69 is formed at a position closer to the silicon substrate 61 than to the thin-film transistor 56, thereby preventing the generation of a leak current as described above. As a result, the solid-state imaging element 31 with reduced noise is implemented.

Figure 15A:
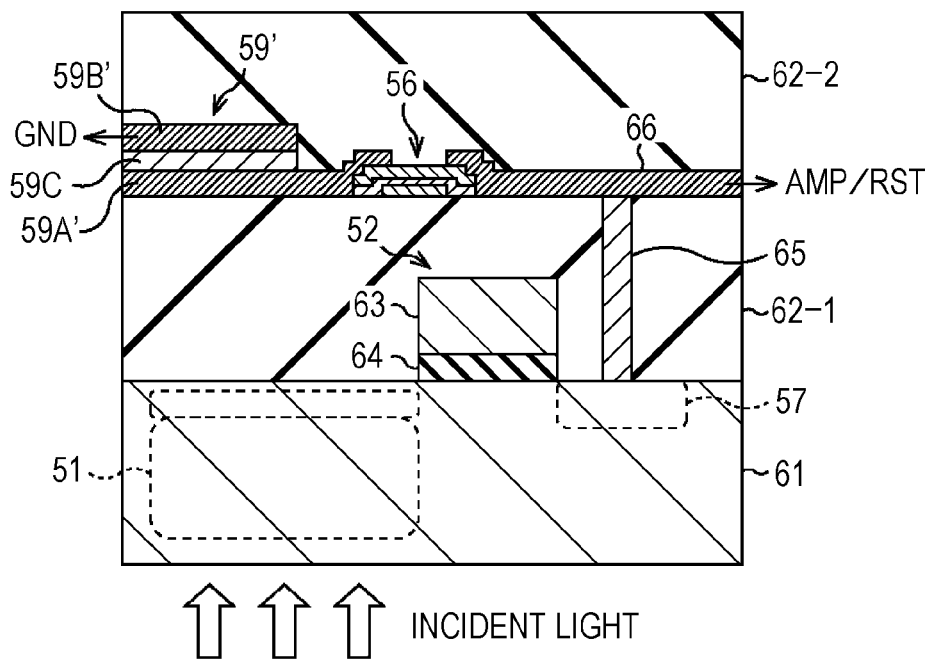
FIGS. 15A and 15B are a sectional view and a plan view, respectively, illustrating an example of a fourth configuration of a pixel.
Figure 15B:
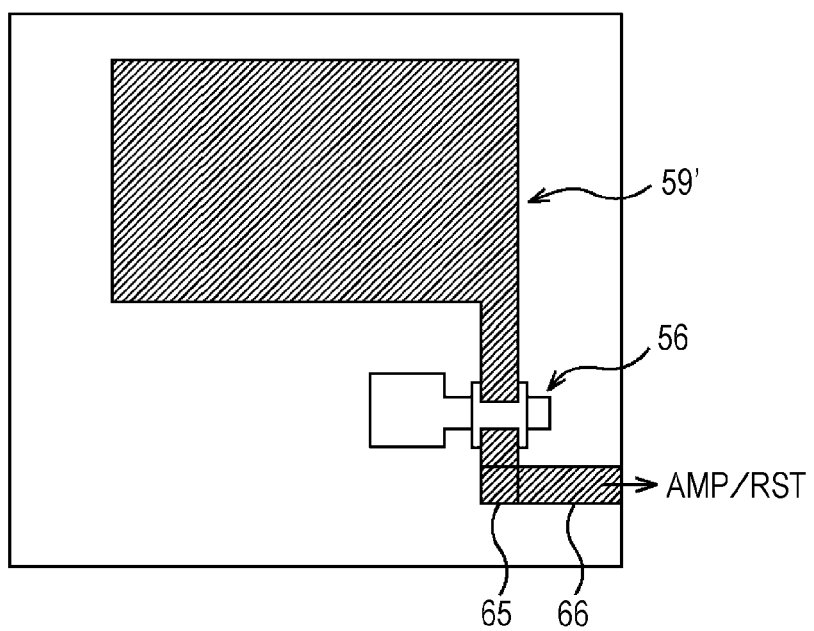

FIGS. 15A and 15B illustrate an example of a fourth configuration of the pixel 41 (hereinafter denoted by 41C). FIG. 15A illustrates an example of the sectional configuration of the FD 57 and surrounding components of the pixel 41C. FIG. 15B illustrates an example of the planar configuration of a wiring layer of the pixel 41C.

The pixel 41C includes a multilayered additional capacitor 59'. That is, in the pixel 41C, the additional capacitor 59' is formed by sandwiching an insulating layer 59C between a pair of planar electrodes 59A' and 59B'.

In this manner, in the pixel 41C, the multilayered additional capacitor 59' is utilized, thereby increasing the capacitance of the additional capacitor 59' than when the comb-like additional capacitor 59 is utilized. This makes it possible for the pixel 41C to handle a larger amount of light.

Figure 16:
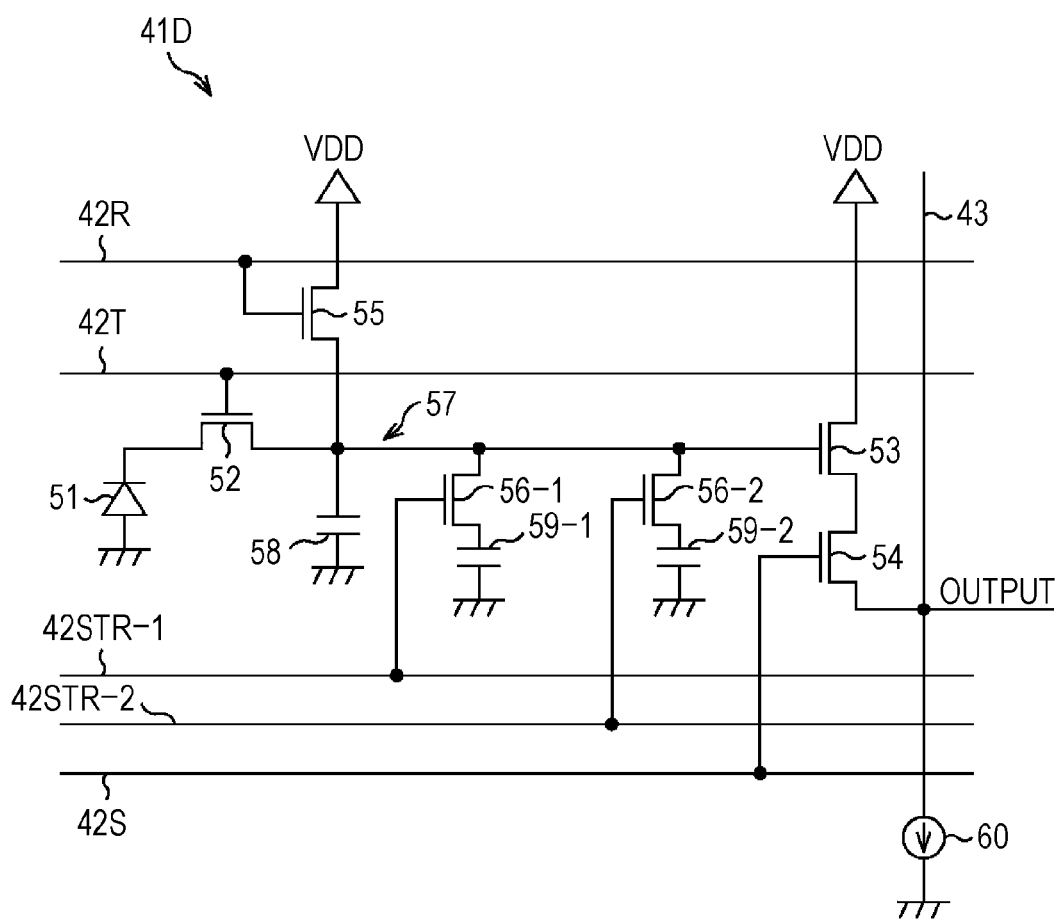
FIG. 16 is a circuit view illustrating an example of a fifth configuration of a pixel.

FIG. 16 is a circuit diagram illustrating an example of a fifth configuration of the pixel 41 (hereinafter denoted by 41D).

As in the pixel 41 shown in FIG. 4, the pixel 41D includes, as shown in FIG. 16, a PD 51, a transfer transistor 52, an amplifier transistor 53, a selection transistor 54, and a reset transistor 55. However, the pixel 41D differs from the pixel 41 shown in FIG. 4 in that the pixel 41D includes thin-film transistors 56-1 and 56-2 and additional capacitors 59-1 and 59-2.

In the pixel 41D, the thin-film transistors 56-1 and 56-2 are connected to the horizontal signal lines 42STR-1 and 42STR-2, respectively, and are independently driven.

In the pixel 41D configured as described above, electrons generated as a result of photoelectric conversion in the PD 51 are stored in the capacitor 58, or in the capacitor 58 and in the additional capacitor 59-1, or in the capacitor 58 and in the additional capacitors 59-1 and 59-2. In this manner, the capacitance of the FD 57 can be changed in three levels.

FIG. 17 is a timing chart illustrating an example of the drive timing at which the pixel 41D is driven by using a fourth drive method.

At time T1, the vertical drive circuit 33 makes the selection signal SEL, which is to be supplied to the selection transistor 54 via the horizontal signal line 42S, to have a high level. With this operation, a signal is ready to be output from the pixel 41D to the horizontal drive circuit 34 via the vertical signal line 43.

At time T2, the vertical drive circuit 33 makes the reset signal RST, which is to be supplied to the reset transistor 55 via the horizontal signal line 42R, to have a high level. Additionally, the vertical drive circuit 33 makes the connection signal STR1, which is to be supplied to the thin-film transistor 56-1 via the horizontal signal line 42STR-1, to have a high level, and also makes the connection signal STR2, which is to be supplied to the thin-film transistor 56-2 via the horizontal signal line 42STR-2, to have a high level. With this operation, the capacitor 58 included in the FD 57 and the additional capacitors 59-1 and 59-2 connected to the FD 57 via the thin-film transistors 56-1 and 56-2, respectively, are reset.

At time T3, the vertical drive circuit 33 makes the reset signal RST to have a low level, causing the reset transistor 55 to be turned OFF, thereby finishing resetting the FD 57. Then, a signal representing a reset level of the FD 57 in the state in which the additional capacitors 59-1 and 59-2 are connected to the capacitor 58 included in the FD 57 is detected by the detector of the horizontal drive circuit 34 as a detection value D1.

At time T4, the vertical drive circuit 33 makes the connection signal STR1, which is to be supplied to the thin-film transistor 56-1 via the horizontal signal line 42STR-1, to have a low level, causing the thin-film transistor 56-1 to be turned OFF. Then, a signal representing a reset level of the FD 57 in the state in which the additional capacitor 59-2 is connected to the capacitor 58 included in the FD 57 is detected by the detector of the horizontal drive circuit 34 as a detection value D2.

At time T5, the vertical drive circuit 33 makes the connection signal STR2, which is to be supplied to the thin-film transistor 56-2 via the horizontal signal line 42STR-2, to have a low level, causing the thin-film transistor 56-2 to be turned OFF. Then, a signal representing a reset level of the FD 57 in the state in which neither of the additional capacitor 59-1 nor the additional capacitor 59-2 is connected to the capacitor 58 is detected by the detector of the horizontal drive circuit 34 as a detection value D3.

At time T6, the vertical drive circuit 33 makes the transfer signal TX, which is to be supplied to the transfer transistor 52 via the horizontal signal line 42T, to have a high level, causing the transfer transistor 52 to be turned ON, thereby transferring electrons stored in the PD 51 to the FD 57.

At time T7, the vertical drive circuit 33 makes the transfer signal TX to have a low level, causing the transfer transistor 52 to be turned OFF, thereby finishing transferring electrons from the PD 51 to the FD 57. Then, a signal representing a level corresponding to electrons stored in the capacitor 58 included in the FD 57 is detected by the detector of the horizontal drive circuit 34 as a detection value D4.

At time T8, the vertical drive circuit 33 makes the connection signal STR2, which is to be supplied to the thin-film transistor 56-2 via the horizontal signal line 42STR-2, to have a high level and thereby turns ON the thin-film transistor 56-2. Then, a signal representing a level corresponding to electrons stored in the FD 57 in the state in which the additional capacitor 59-2 is connected to the capacitor 58 is detected by the detector of the horizontal drive circuit 34 as a detection value D5.

At time T9, the vertical drive circuit 33 makes the connection signal STR1, which is to be supplied to the thin-film transistor 56-1 via the horizontal signal line 42STR-1, to have a high level and thereby turns ON the thin-film transistor 56-1. Then, a signal representing a level corresponding to electrons stored in the FD 57 in the state in which the additional capacitors 59-1 and 59-2 are connected to the capacitor 58 is detected by the detector of the horizontal drive circuit 34 as a detection value D6.

At time T10, the vertical drive circuit 33 makes the connection signals STR1 and STR2, which are to be supplied to the thin-film transistors 56-1 and 56-2 via the horizontal signal lines 42STR-1 and 42STR-2, respectively, to have a low level. The vertical drive circuit 33 also makes the selection signal SEL, which is to be supplied to the selection transistor 54 via the horizontal signal line 42S, to have a low level. With this operation, the readout period for the pixel 41D is completed.

The vertical drive circuit 33 drives the pixel 41D at the drive timing described above. Then, a signal representing the difference between the detection value D3 and the detection value D4 is output as an output signal Sig1 representing a level corresponding to electrons generated in the PD 51 and stored in the capacitor 58 included in the FD 57. Additionally, a signal representing the difference between the detection value D2 and the detection value D5 is output as an output signal Sig2 having a level corresponding to electrons generated in the PD 51 and stored in the FD 57 in the state in which the additional capacitor 59-2 is connected to the capacitor 58. Moreover, a signal representing the difference between the detection value D1 and the detection value D6 is output as an output signal Sig3 having a level corresponding to electrons generated in the PD 51 and stored in the FD 57 in the state in which the additional capacitors 59-1 and 59-2 are connected to the capacitor 58.

As described above, in the pixel 41D, electrons generated as a result of photoelectric conversion in the PD 51 are converted into an output signal in accordance with the state of the FD 57 (i.e., the level of the capacitance of the FD 57 selected from the three levels of capacitances). Thus, a signal can be output with a gain suitable for the amount of incident light.

FIG. 18 is a circuit diagram illustrating an example of a sixth configuration of the pixel 41 (hereinafter denoted by 41E).

As in the pixel 41A shown in FIG. 9, the pixel 41E has a two-pixel sharing structure, as shown in FIG. 18. However, the pixel 41E differs from the pixel 41A shown in FIG. 9 in that the pixel 41E includes thin-film transistors 56-1 and 56-2 and additional capacitors 59-1 and 59-2 and in that the thin-film transistors 56-1 and 56-2 are driven independently.

FIG. 19 is a timing chart illustrating an example of the drive timing at which the pixel 41E is driven by using a fifth drive method.

In the pixel 41E having a two-pixel sharing structure, a signal is read from the pixel 41-1 during the first pixel readout period, and then, a signal is read from the pixel 41-2 during the second pixel readout period.

At time T1, the vertical drive circuit 33 makes the selection signal SEL, which is to be supplied to the selection transistor 54 via the horizontal signal line 42S, to have a high level. With this operation, a signal is ready to be output from the pixel 41E to the horizontal drive circuit 34 via the vertical signal line 43.

The period from time T2 to T10 is the first pixel readout period during which a signal is read from the pixel 41-1, as during the period from time T2 to T10 discussed with reference to FIG. 17. That is, at time T6, the transfer signal TX1, which is to be supplied to the transfer transistor 52-1, to have a high level, causing the transfer transistor 52-1 to be turned ON, thereby transferring electrons stored in the PD 51-1 to the FD 57.

Then, a signal representing the difference between a detection value D3-1 obtained after time T5 and a detection value D4-1 obtained after time T7 is output as an output signal Sig1-1 representing a level corresponding to electrons generated in the PD 51-1 and stored in the capacitor 58 included in the FD 57. Additionally, a signal representing the difference between a detection value D2-1 obtained after time T4 and a detection value D5-1 obtained after time T8 is output as an output signal Sig2-1 representing a level corresponding to electrons generated in the PD 51-1 and stored in the FD 57 in the state in which the additional capacitor 59-2 is connected to the capacitor 58. Moreover, a signal representing the difference between a detection value D1-1 obtained after time T3 and a detection value D6-1 obtained after time T9 is output as an output signal Sig3-1 representing a level corresponding to electrons generated in the PD 51-1 and stored in the FD 57 in the state in which the additional capacitors 59-1 and 59-2 are connected to the capacitor 58.

Then, the period from time T10 to T18 is the second pixel readout period. A signal is read from the pixel 41-2, as during the period from time T2 to T10 discussed with reference to FIG. 17. That is, at time T14, the transfer signal TX2, which is to be supplied to the transfer transistor 52-2, is made to have a high level, causing the transfer transistor 52-2 to be turned ON, thereby transferring electrons stored in the PD 51-2 to the FD 57.

Then, a signal representing the difference between a detection value D3-2 obtained after time T13 and a detection value D4-2 obtained after time T15 is output as an output signal Sig1-2 representing a level corresponding to electrons generated in the PD 51-2 and stored in the capacitor 58 included in the FD 57. Additionally, a signal representing the difference between a detection value D2-2 obtained after time T12 and a detection value D5-2 obtained after time T16 is output as an output signal Sig2-2 representing a level corresponding to electrons generated in the PD 51-2 and stored in the FD 57 in the state in which the additional capacitor 59-2 is connected to the capacitor 58. Moreover, a signal representing the difference between a detection value D1-2 obtained after time T11 and a detection value D6-2 obtained after time T17 is output as an output signal Sig3-2 representing a level corresponding to electrons generated in the PD 51-2 and stored in the FD 57 in the state in which the additional capacitors 59-1 and 59-2 are connected to the capacitor 58.

As described above, in the pixel 41E having a two-pixel sharing structure, electrons generated as a result of photoelectric conversion in each of the PDs 51-1 and 51-2 are converted into an output signal in accordance with the state of the FD 57 (i.e., the level of the capacitance of the FD 57 selected from the three levels of capacitances). Thus, a signal can be output with a gain suitable for the amount of incident light.

A description will now be given, with reference to FIGS. 20A through 20E, of examples of various configurations of the thin-film transistor 56 used in the pixel 41. Various materials and structures may be used for the thin-film transistor 56.

Figure 20A:
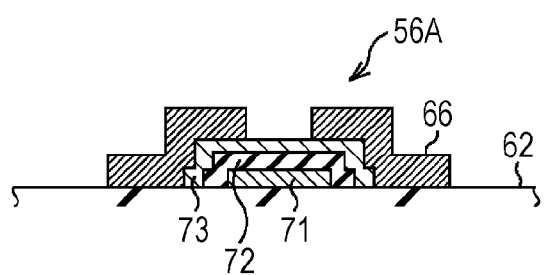
FIGS. 20A through 20E illustrate examples of various configurations of a thin-film transistor 56.

FIG. 20A illustrates a thin-film transistor 56A having an inverted-staggered structure. The thin-film transistor 56A is formed as follows. A gate electrode 71 made of a metal is first formed on the front side of an interlayer insulating film 62, and a gate insulating film 72 is formed on the gate electrode 71, and then, a semiconductor layer 73 is formed on the gate insulating film 72. Thereafter, a metallic layer, which is to form a source/drain electrode, is formed by using a metal wiring 66. Then, the formation of the inverted-staggered thin-film transistor 56A is completed.

As the gate electrode 71 or the metal wiring 66, Al, Cu, Ti, Mo, W, Cr, etc., a nitride thereof, an oxide thereof, a transparent metal, such as ITO and ZnO, or a multilayered structure having some of the above-described metals may be utilized. As the gate insulating film 72, a Si oxide, a Si nitride, a Hf oxide, an Al oxide, a Ta oxide, or a multilayered structure of such oxides may be utilized. As the semiconductor layer 73, ZnO, SnO, InO, such an element to which Ga is added, or an oxide semiconductor containing some of such elements may be utilized. As the semiconductor layer 73, an organic thin film may be utilized, in which case, the semiconductor layer 73 may be easily formed by coating.

Figure 20B:
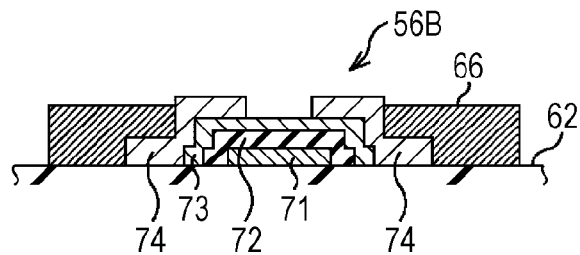

FIG. 20B illustrates a thin-film transistor 56B having a structure in which a contact layer 74 is sandwiched between the semiconductor layer 73 and the metal wiring 66. As the material of the contact layer 74, an oxide semiconductor having an enhanced conductivity may be utilized, for example, an In—Ga—Zn—O, In—Sn—Zn—O, Ga—Sn—Zn—O, In—Zn—O, Sn—Zn—O, In—Sn—O, Ga—Zn—O, In—O, Sn—O, or Zn—O oxide semiconductor may be utilized.

Figure 20C:
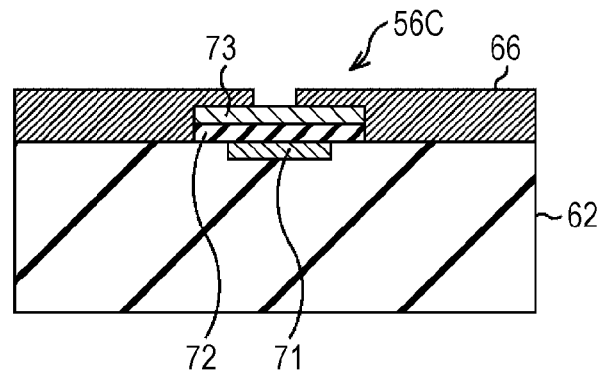

FIG. 20C illustrates a thin-film transistor 20C having a structure in which the gate electrode 71 is buried in the interlayer insulating film 62.

Figure 20D:
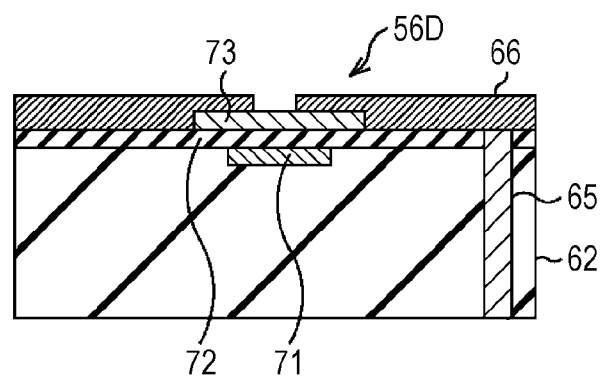

FIG. 20D illustrates a thin-film transistor 20D having a structure in which the gate electrode 71 is buried in the interlayer insulating film 62 and the gate insulating film 72 covers the entire surface of the gate electrode 71 and the entire surface of the interlayer insulating film 62.

Figure 20E:
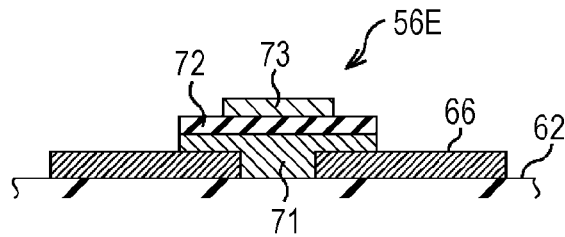

FIG. 20E illustrates a thin-film transistor 56E having a staggered structure. Unlike the inverted-staggered structure utilized for the thin-film transistors 56A through 56D, a staggered structure is utilized for the thin-film transistor 56E.

Figure 21:
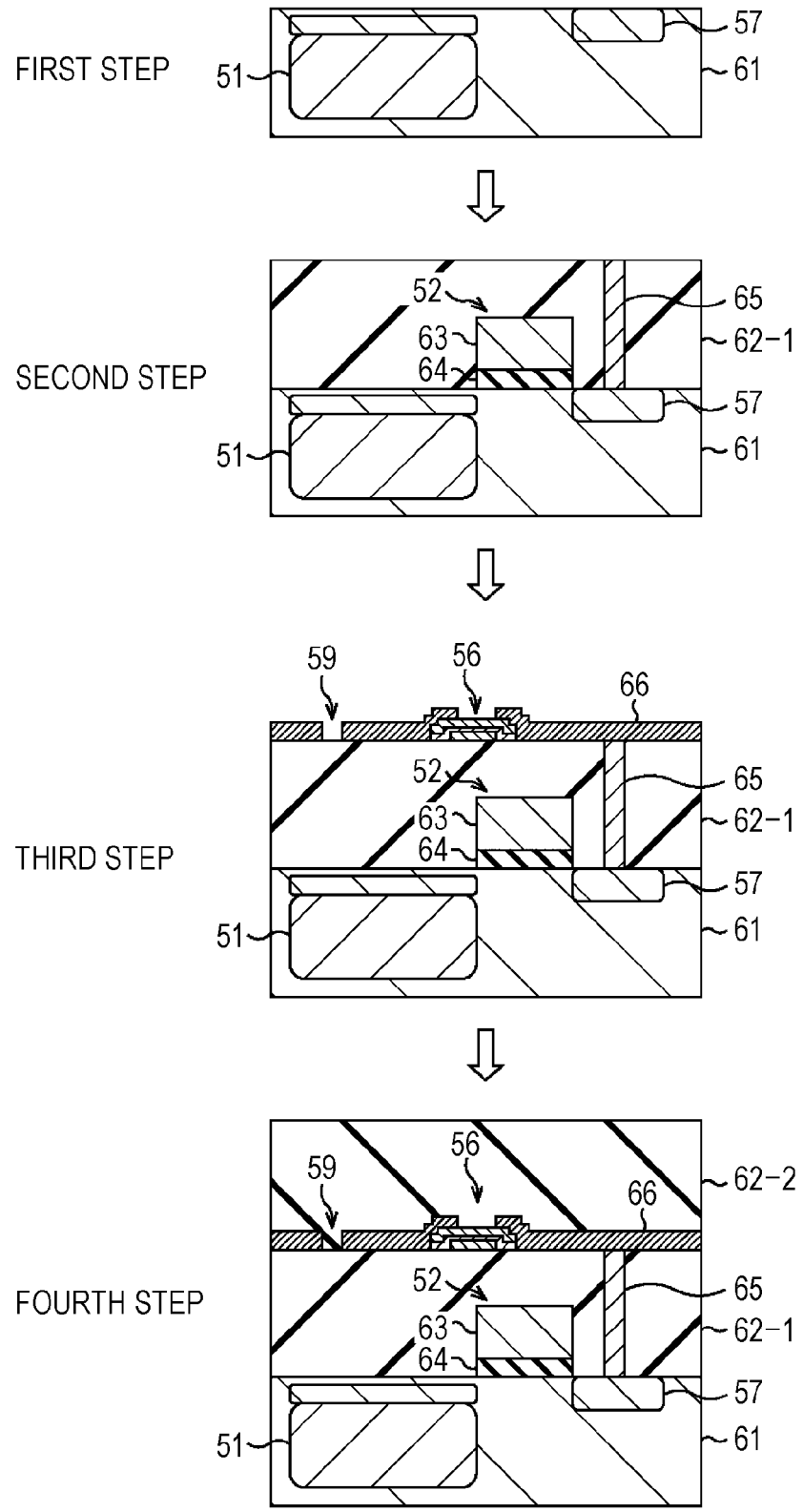
FIG. 21 illustrates a manufacturing method for a pixel.

A manufacturing method for the solid-state imaging element 31 will be described below with reference to FIG. 21.

In a first step, the PD 51 and the FD 57 are formed within the silicon substrate 61 by using ion implantation.

Then, in a second step, the gate electrode 63 of the transfer transistor 52 is formed on the front side of the silicon substrate 61 via the insulating layer 64, and the interlayer insulating film 62-1 is stacked on the gate electrode 63. Then, the contact via-hole 65 is formed and connected to the FD 57.

Then, in a third step, after the thin-film transistor 56 (gate electrode 71, gate insulating film 72, and semiconductor layer 73 shown in FIGS. 20A through 20E) is formed, the comb-like additional capacitor 59 is formed at the same time as forming the metal wiring 66.

Subsequently, in a fourth step, the interlayer insulating film 62-2 is stacked on the interlayer insulating film 62-1. The pixel 41 is formed in this manner. With those manufacturing steps, the solid-state imaging element 31 including the pixels 41 is manufactured.

As described above, in the manufacturing method for the solid-state imaging element 31, at the same time as forming the metal wiring 66, the comb-like additional capacitor 59 can be formed. It is thus possible to manufacture the solid-state imaging element 31 without increasing the number of manufacturing steps specially for forming the additional capacitor 59. The following solid-state imaging element 31 including pixels 41 having a configuration, which will be described below, may be manufactured in a manner similar to the solid-state imaging element 31 described above.

A description will now be given, with reference to FIGS. 22 through 31B, of an example of the configuration of pixels 41 used in the solid-state imaging element 31 having a global shutter function.

More specifically, by the application of the structure of the pixel 41 shown in FIGS. 5A and 5B in which the additional capacitor 59 is formed between the interlayer insulating films 62-1 and 62-2, the solid-state imaging element 31 having a so-called global shutter function can be implemented. By utilizing the global shutter function, signals are simultaneously read from all the pixels 41 by performing the exposure of the pixels 41 at the same time.

Figure 22:
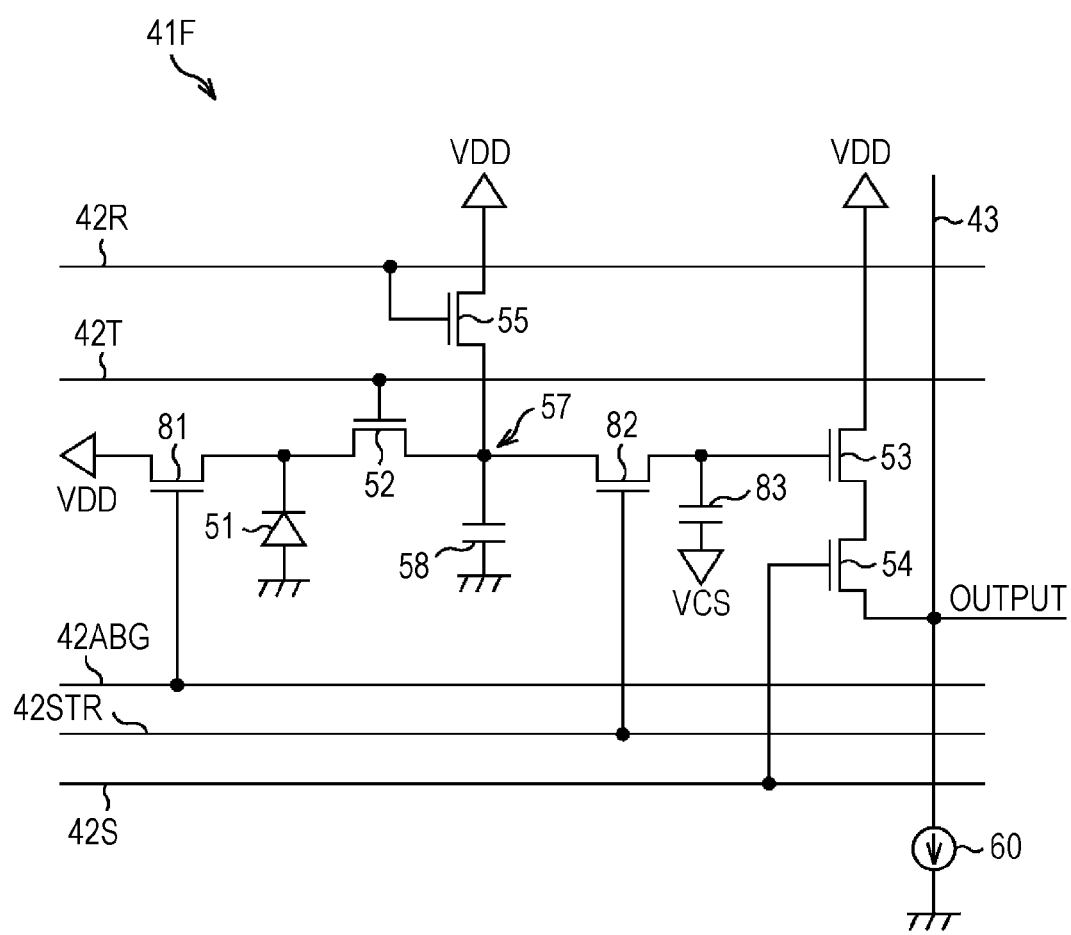
FIG. 22 is a circuit diagram illustrating an example of a seventh configuration of a pixel.

FIG. 22 is a circuit diagram illustrating an example of a seventh configuration of the pixel 41 (hereinafter denoted by 41F).

As shown in FIG. 22, the pixel 41F includes a PD 51, a transfer transistor 52, an amplifier transistor 53, a selection transistor 54, a reset transistor 55, an FD 57, a capacitor 58, a discharge transistor 81, a thin-film transistor 82, and a capacitor 83.

The pixel 41F is configured as follows. The anode terminal of the PD 51 is grounded, and the cathode terminal of the PD 51 is connected to the FD 57 via the transfer transistor 52 and is also connected to a constant voltage source VDD via the discharge transistor 81. The FD 57 is grounded via the capacitor 58, and is connected to a constant voltage source VDD via the reset transistor 55 and is also connected to the gate electrode of the amplifier transistor 53 via the thin-film transistor 82. The node between the thin-film transistor 82 and the gate electrode of the amplifier transistor 53 is connected to a power supply source VCS via the capacitor 83. One terminal of the amplifier transistor 53 is connected to a constant voltage source VDD, and the other terminal of the amplifier transistor 53 is connected via the selection transistor 54 to the vertical signal line 43 to which the constant current source 60 is connected.

The horizontal signal line 42T is connected to the gate electrode of the transfer transistor 52. The horizontal signal line 42S is connected to the gate electrode of the selection transistor 54. The horizontal signal line 42R is connected to the gate electrode of the reset transistor 55. A horizontal signal line 42ABG is connected to the gate electrode of the discharge transistor 81, and the horizontal signal line 42STR is connected to the gate electrode of the thin-film transistor 82.

That is, the pixel 41F differs from the pixel 41 shown in FIG. 4 in the following points. The thin-film transistor 82 (switching element) is disposed so as to connect or disconnect the FD 57 and the amplifier transistor 53. One terminal of the capacitor 83 is connected to the node between the thin-film transistor 82 and the amplifier transistor 53, and the other terminal of the capacitor 83 is connected to the power supply source VCS. Additionally, the discharge transistor 81 is disposed in order to discharge electrons stored in the PD 51.

The pixel 41F is configured as described above. In the solid-state imaging element 31 in which the plurality of pixels 41F are arranged in the pixel array 32 in a matrix form, electrons are simultaneously transferred from the PDs 51 to the FDs 57 in all the pixels 41F in order to implement the global shutter function. Then, electrons are transferred from the FDs 57 to the capacitors 83 via the thin-film transistors 82 and are stored in the capacitors 83. Then, in the pixel 41F from which a pixel signal is to be read, a signal representing a level corresponding to electrons stored in the capacitor 83, i.e., a signal representing a level corresponding to electrons which have been generated as a result of photoelectric conversion in the PD 51 and transferred to the FD 57 and which have been then transferred to the capacitor 83, is output.

Figure 23A:
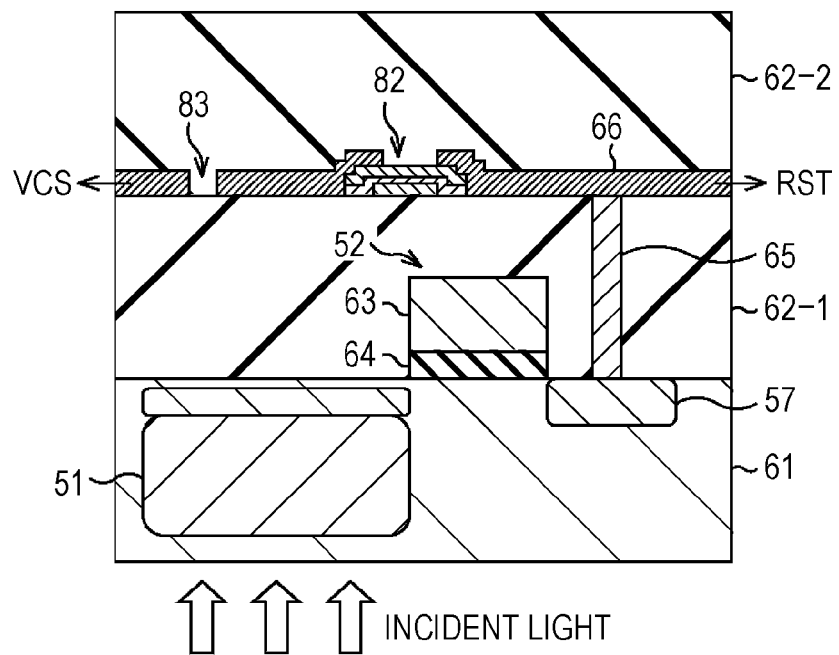
FIGS. 23A and 23B illustrate examples of a sectional configuration and a planar configuration, respectively, of a pixel.
Figure 23B:
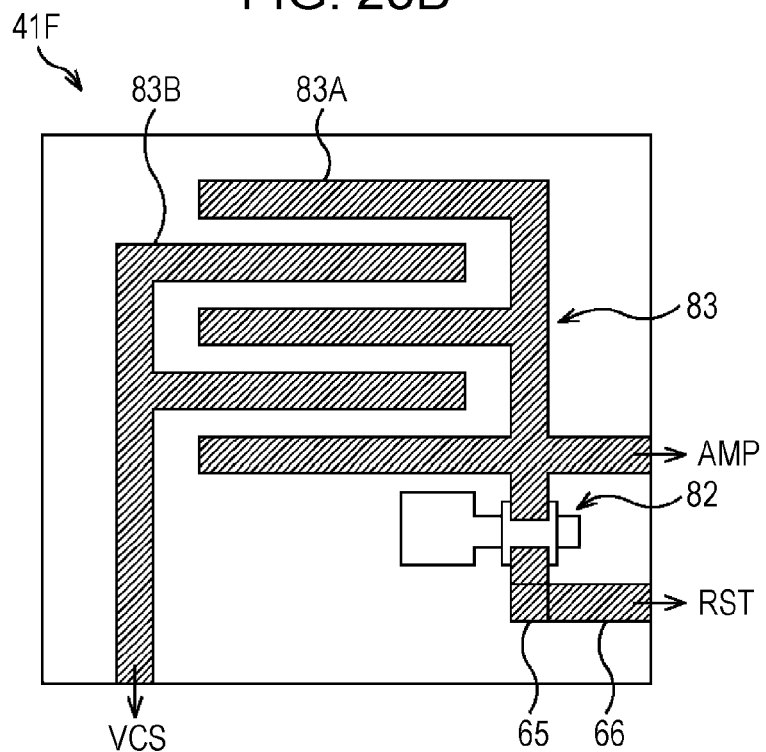

The structure of the pixel 41F will now be described below with reference to FIGS. 23A and 23B. FIG. 23A illustrates an example of the sectional configuration of the FD 57 and surrounding components of the pixel 41F. FIG. 23B illustrates an example of the planar configuration of a wiring layer of the pixel 41F. In FIGS. 23A and 23B, the same components as those of the pixel 41 shown in FIGS. 5A and 5B are designated by like reference numerals, and an explanation thereof will thus be omitted.

As in the pixel 41 shown in FIGS. 5A and 5B, in the pixel 41F, the interlayer insulating films 62-1 and 62-2 are sequentially stacked on the silicon substrate 61, and a wiring layer is formed between the interlayer insulating films 62-1 and 62-2. The capacitor 83 disposed in the wiring layer is formed in a comb-like shape, as in the additional capacitor 59 discussed with reference to FIG. 5B. However, as shown in FIG. 22, the pixel 41F differs from the pixel 41 in that the FD 57 is connected to the capacitor 83 via the thin-film transistor 82 and the amplifier transistor 53 is connected to the capacitor 83.

More specifically, the FD 57 is connected, through the contact via-hole 65, to the metal wiring 66 formed in the wiring layer between the interlayer insulating films 62-1 and 62-2. One end of the metal wiring 66 is connected to the reset transistor 55, and the other end of the metal wiring 66 is connected to one end of the thin-film transistor 82 formed in the wiring layer. One electrode 83A forming the capacitor 83 is connected to the other end of the thin-film transistor 82. The electrode 83A is also connected to the amplifier transistor 53, and another electrode 83B forming the capacitor 83 is connected to the power supply source VCS.

As shown in FIG. 23B, the pair of electrodes 83A and 83B forming the thin-film transistor 83 are formed in a so-called comb-like shape, and wiring portions corresponding to the teeth of the comb-like shape of the electrode 83A and those of the electrode 83B are alternately disposed with a predetermined spacing therebetween. These wiring portions serve as capacitors storing electrons therein. The capacitor 83 has a certain area, and is formed in a region in which it overlaps the PD 51 when viewed from above.

The pixel 41F is configured as described above. The thin-film transistor 82 is driven under control of the vertical drive circuit 33, thereby connecting or disconnecting the FD 57 and the capacitor 83. For example, after electrons are transferred from the PD 51 to the FD 57, the thin-film transistor 82 is turned ON, thereby transferring electrons stored in the FD 57 to the capacitor 83. At this time, the power supply source VCS connected to the electrode 83B is made to have a high level, increasing the voltage in the electrode 83A, thereby transferring electrons stored in the FD 57 to the capacitor 83. The voltage of the power supply source VCS may be increased to a suitable value in a range from 0 V to the constant voltage source VDD.

As described above, in the solid-state imaging element 31 having a global shutter function, the capacitors 83 storing electrons which have been simultaneously transferred from the PDs 51 in all the pixels 41F are formed in the wiring layer disposed on the silicon substrate 61 with the interlayer insulating film 62-1 therebetween. The thin-film transistors 82 are also formed in the same wiring layer in which the capacitors 83 are formed. In this manner, by forming the thin-film transistors 82 and the capacitors 83 in the same wiring layer, a larger area is secured for the PDs 51, compared with a structure in which the thin-film transistors 82 and the capacitors 83 are formed in the silicon substrate 61. Thus, the photoelectric conversion efficiency of the PDs 51 is maintained.

Figure 24:
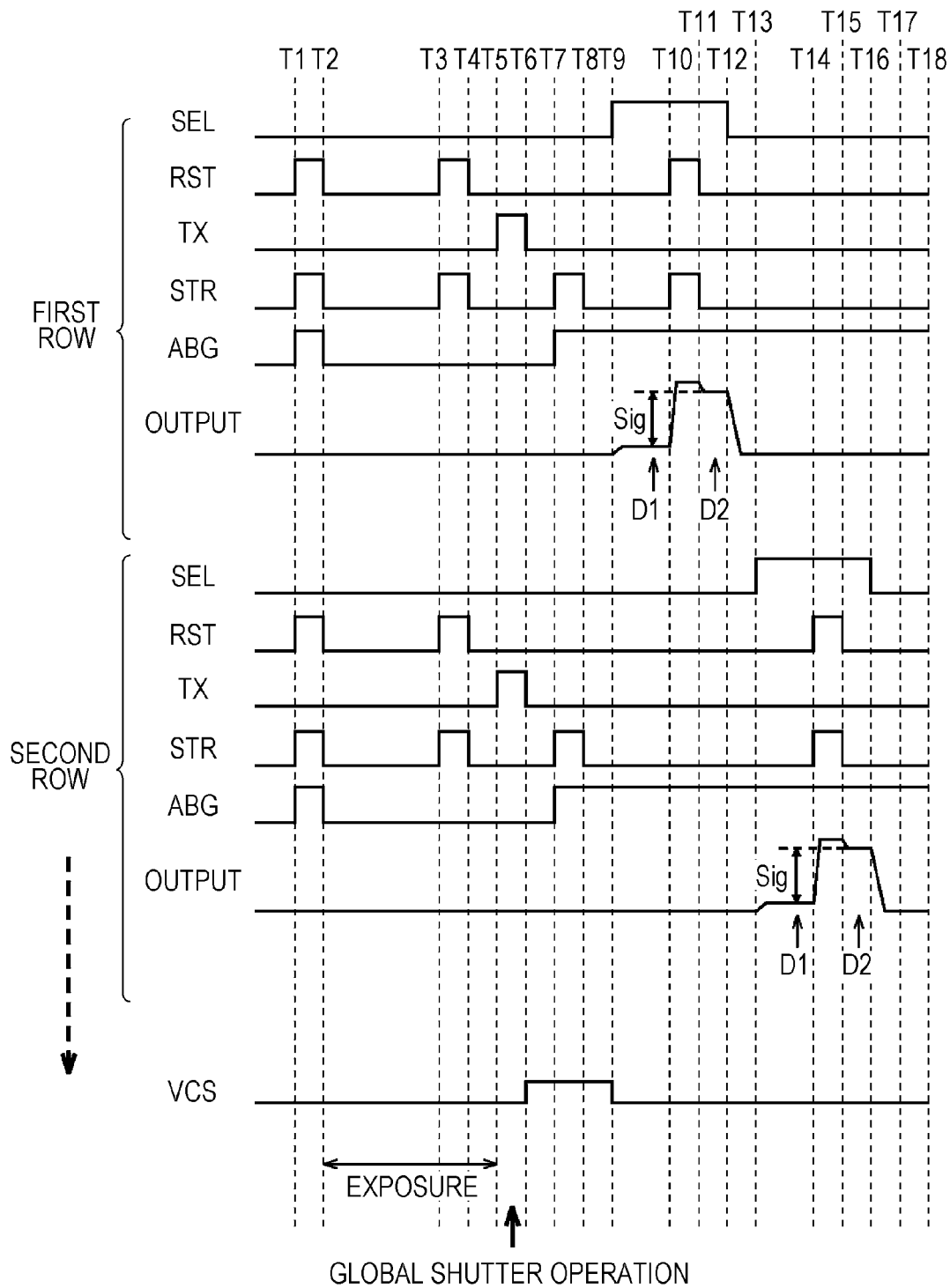
FIG. 24 is a timing chart illustrating an example of the drive timing at which a pixel is driven by using a sixth drive method.

FIG. 24 is a timing chart illustrating an example of the drive timing at which the pixel 41F is driven by using a sixth drive method. The sixth drive method is a method for reading signals by performing a global shutter operation. Each signal may take one of two values, i.e., a high level and a low level.

At time T1, in order to simultaneously reset all the rows of pixels 41F, the vertical drive circuit 33 makes the reset signal RST, the connection signal STR, and the discharge signal ABG to have a high level so as to reset the PDs 51, the FDs 57, and the capacitors 83 of all the rows of pixels 41F.

The connection signal STR is supplied to the thin-film transistor 82 via the horizontal signal line 42STR. When the connection signal STR is made to have a high level, the thin-film transistor 82 is turned ON, thereby connecting the FD 57 and the capacitor 83. The reset signal RST is supplied to the reset transistor 55 via the horizontal signal line 42R. When the reset signal is made to have a high level, the reset transistor 55 is turned ON, thereby resetting the FD 57 and the capacitor 83. The discharge signal ABG is supplied to the discharge transistor 81 via the horizontal signal line 42ABG. When the discharge signal ABG is made to have a high level, the discharge transistor 81 is turned ON, thereby discharging electrons stored in the PD 51 to the constant voltage source VDD.

At time T2, for all the rows of pixels 41F, the vertical drive circuit 33 simultaneously makes the reset signal RST, the connection signal STR, and the discharge signal ABG to have a low level, thereby simultaneously turning OFF the reset transistors 55, the thin-film transistors 82, and the discharge transistors 81 of all the rows of pixels 41F. With this operation, the resetting of the PDs 51, the FDs 57, and the capacitors 83 is completed, and the exposure of the PDs 51 is started in all the rows of the pixels 41F.

At time T3, for all the rows of pixels 41F, the vertical drive circuit 33 simultaneously makes the reset signal RST and the connection signal STR to have a high level. At time T4, for all the rows of pixels 41F, the vertical drive circuit 33 simultaneously makes the reset signal RST and the connection signal STR to have a low level. With this operation, the reset transistors 55 and the thin-film transistors 82 are turned ON, and electrons generated mainly due to a leak current during the exposure period are discharged from the FDs 57 and the capacitors 83.

At time T5, for all the rows of pixels 41F, the vertical drive circuit 33 simultaneously makes the transfer signal TX, which is to be supplied to the transfer transistors 52 via the horizontal signal line 42T, to have a high level, thereby turning ON the transfer transistors 52. With this operation, the exposure of the pixels 41F is completed, and in all the rows of pixels 41F, electrons stored in the PDs 51 are simultaneously transferred to the FDs 57. This transfer operation is simultaneously performed in all the pixels 41F, thereby implementing the global shutter operation.

At time T6, for all the rows of pixels 41F, the vertical drive circuit 33 simultaneously makes the transfer signal TX to have a low level, causing the transfer transistors 52 to be turned OFF, thereby finishing transferring electrons.

At time T7, for all the rows of pixels 41F, the vertical drive circuit 33 simultaneously makes the connection signal STR, which is to be supplied to the thin-film transistors 82 via the horizontal signal line 42STR, to have a high level, thereby connecting the FDs 57 and the capacitors 83 via the thin-film transistors 82. At this time, the vertical drive circuit 33 makes the potential of the power supply source VCS connected to the terminal (electrode 83B in FIGS. 23A and 23B) of the capacitor 83, which is opposite the terminal connected to the thin-film transistor 82, to have a high level during the period from time T6 to T9. With this operation, a potential is formed so that electrons are transferred from the FDs 57 to the capacitors 83.

At time T7, for all the rows of pixels 41E, the vertical drive circuit 33 simultaneously makes the discharge signal ABG, which is to be supplied to the discharge transistors 81 via the horizontal signal line 42ABG, to have a high level. The discharge signal ABG is maintained at the high level after time T7, and electrons generated as a result of photoelectric conversion in the PDs 51 are continuously discharged to the constant voltage source VDD, thereby preventing unnecessary electrons from being stored in the PDs 51.

At time T8, for all the rows of pixels 41E, the vertical drive circuit 33 simultaneously makes the connection signal STR, which is to be supplied to the thin-film transistors 82 via the horizontal signal line 42STR, to have a low level, thereby finishing transferring electrons from the FDs 57 to the capacitors 83.

The operation during the period from time T1 to T8 is performed at the same time for all the pixels 41E, and electrons generated in the PDs 51 of all the pixels 41E are stored in the capacitors 83. Then, a signal is read from the pixels 41F row by row. For example, the period from time T9 to T12 is the reading period for the first row of pixels 41F, and the period from time T13 to T16 is the reading period for the second row of pixels 41F. In this manner, signals are sequentially read from the pixels 41F until the final row of pixels 41F.

At time T9, the vertical drive circuit 33 makes the selection signal SEL, which is to be supplied to the selection transistors 54 via the horizontal signal line 42S, to have a high level for the first row of pixels 41F, thereby allowing a signal to be output from the pixels 41F to the horizontal drive circuit 34 via the vertical signal line 43. Then, after the output voltage is stabilized, a signal representing a level corresponding to electrons stored in the capacitors 83 is detected by the detector of the horizontal drive circuit 34 as a detection value D1.

At time T10, for the first row of pixels 41F, the vertical drive circuit 33 makes the reset signal RST and the connection signal STR to have a high level, thereby turning ON the reset transistors 55 and the thin-film transistors 82. With this operation, electrons stored in the FDs 57 and the capacitors 83 are discharged to the constant voltage source VDD, thereby resetting the FDs 57 and the capacitors 83.

At time T11, the vertical drive circuit 33 makes the reset signal RST and the connection signal STR to have a low level, causing the reset transistors 55 and the thin-film transistors 82 to be turned OFF, thereby finishing resetting the FDs 57 and the capacitors 83. Then, after the output voltage is stabilized, a signal representing a reset level of the capacitors 83 is detected by the detector of the horizontal drive circuit 34 as a detection value D2.

At time T12, the vertical drive circuit 33 makes the selection signal SEL, which is to be supplied to the selection transistors 54 via the horizontal signal line 42S, to have a low level. With this operation, the readout period for the first row of pixels 41F is completed.

In this manner, the period from time T9 to T12 is the readout period for the first row of pixels 41F, and a signal representing the difference between the detection value D1 and the detection value D2 is output from the horizontal drive circuit 34 as an output signal Sig representing a level corresponding to electrons generated as a result of photoelectric conversion in the PDs 51.

Subsequently, as in the period from time T9 to T12, the period from time T13 to T16 is the readout period for the second row of pixels 41F, and a signal representing a level corresponding to electrons generated in the PDs 51 of the second row of pixels 41F is output as an output signal Sig. Thereafter, an operation similar to the above-described operation is performed for all the rows of pixels 41F, thereby outputting pixel signals from all the pixels 41F.

As described above, in the solid-state imaging element 31 including the pixels 41F, the global shutter operation can be implemented.

Figure 25:
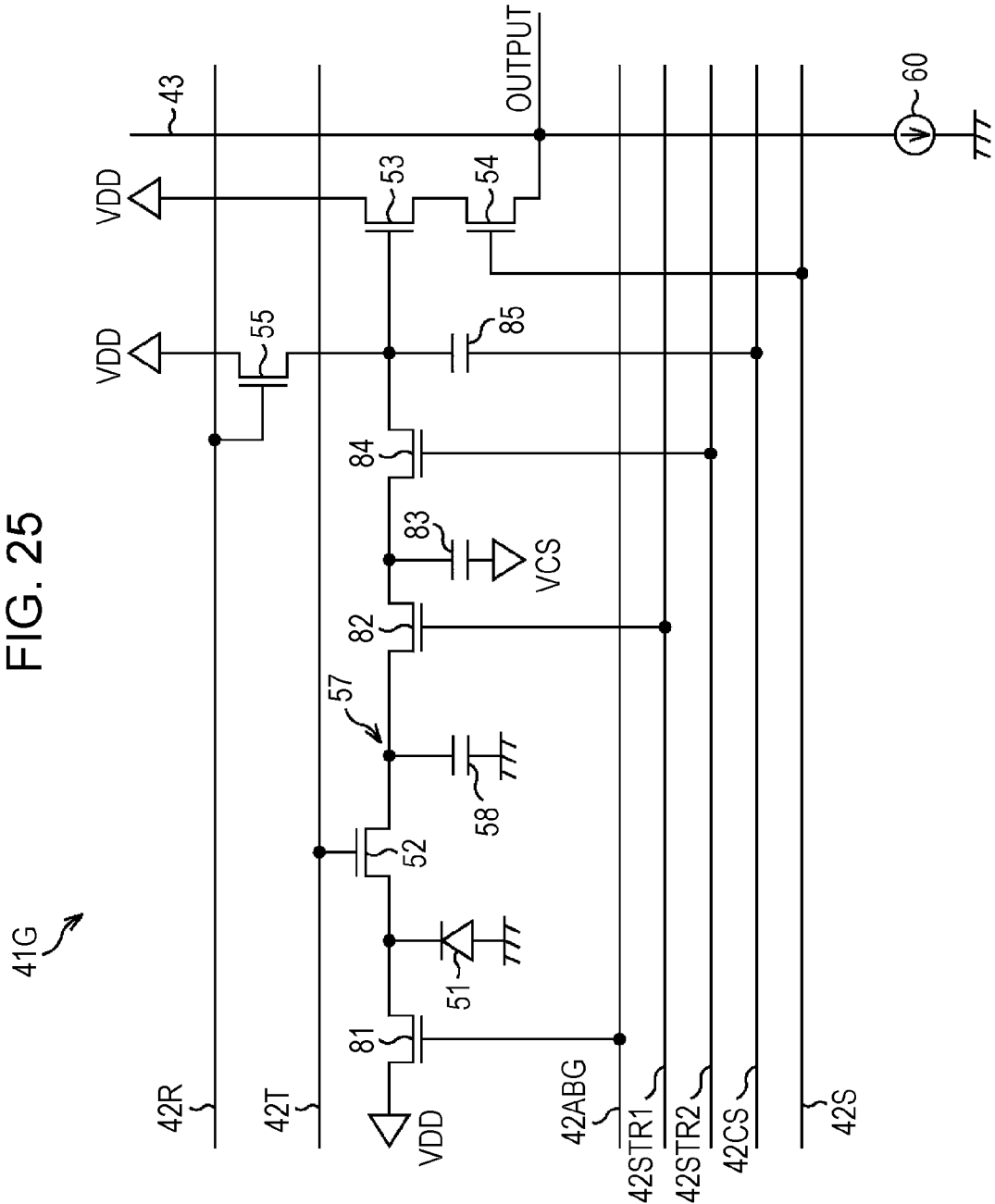
FIG. 25 is a circuit diagram illustrating an example of an eighth configuration of a pixel.

FIG. 25 is a circuit diagram illustrating an example of an eighth configuration of the pixel 41 (hereinafter denoted by 41G).

In the pixel 41G shown in FIG. 25, the following correlated double sampling (CDS) operation is performed. After a signal indicating a reset level is read, a signal representing a level corresponding to electrons transferred from the PD 51 is read, thereby calculating a pixel signal.

As in the pixel 41F shown in FIG. 22, the pixel 41G includes, as shown in FIG. 25, a PD 51, a transfer transistor 52, an amplifier transistor 53, a selection transistor 54, a reset transistor 55, an FD 57, a capacitor 58, a discharge transistor 81, a thin-film transistor 82, and a capacitor 83. However, the pixel 41G differs from the pixel 41F in that the pixel 41G includes a thin-film transistor 84 and a capacitor 85.

As in the thin-film transistor 82 and the capacitor 83, the thin-film transistor 84 and the capacitor 85 are formed between the interlayer insulating films 62-1 and 62-2 (FIG. 23A).

The thin-film transistor 84 is disposed so as to connect or disconnect the node between the thin-film transistor 82 and the capacitor 83 and the gate electrode of the amplifier transistor 53. The node between the thin-film transistor 84 and the amplifier transistor 53 is connected to one terminal of the capacitor 85, and is connected to a constant voltage source VDD via the reset transistor 55. A horizontal signal line 42STR1 is connected to the gate electrode of the thin-film transistor 82. A horizontal signal line 42STR2 is connected to the gate electrode of the thin-film transistor 84. A horizontal signal line 42CS is connected to the other terminal of the capacitor 85.

The pixel 41G is configured as described above. In the solid-state imaging element 31 in which the plurality of pixels 41G are arranged in the pixel array 32 in a matrix form, electrons are simultaneously transferred from the PDs 51 to the FDs 57 of all the pixels 41G in order to implement the global shutter function. Then, electrons are transferred from the FDs 57 to the capacitors 83 via the thin-film transistors 82 and are stored in the capacitors 83. Then, in the pixel 41G from which a pixel signal is to be read, after a signal representing a reset level of the capacitor 85 is output, electrons are transferred from the capacitor 83 to the capacitor 85 via the thin-film transistor 84, and a signal indicating a level corresponding to electrons stored in the capacitor 85 is output.

Figure 26:
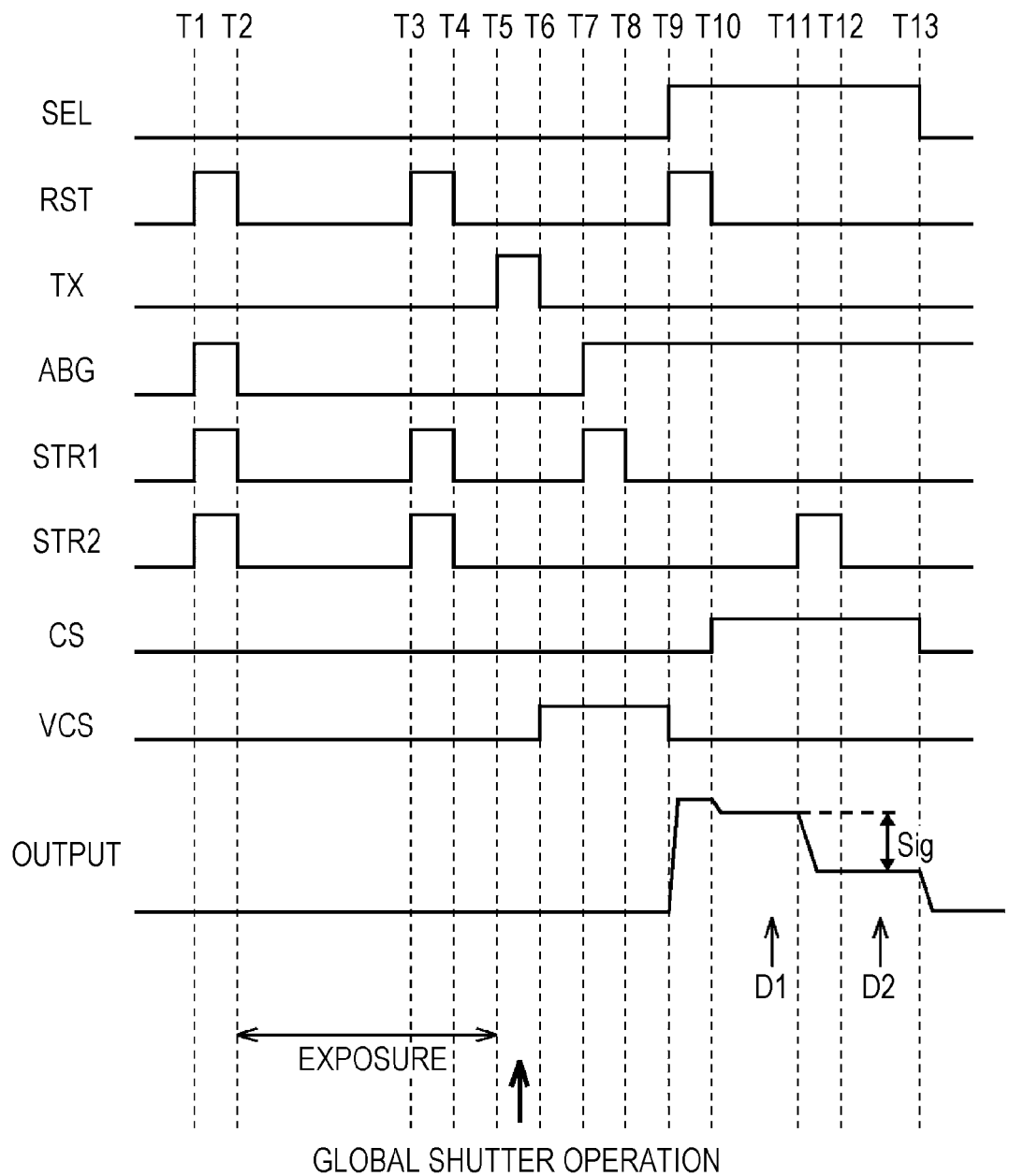
FIG. 26 is a timing chart illustrating an example of the drive timing at which a pixel is driven by using a seventh drive method.

FIG. 26 is a timing chart illustrating an example of the drive timing at which the pixel 41G is driven by using a seventh drive method.

At time T1, in order to simultaneously reset all the rows of pixels 41G, the vertical drive circuit 33 makes the reset signal RST, the discharge signal ABG, the connection signal STR1, and the connection signal STR2 to have a high level so as to reset the PDs 51, the FDs 57, the capacitors 83, and the capacitors 85.

The connection signal STR1 is supplied to the thin-film transistor 82 via the horizontal signal line 42STR1. When the connection signal STR1 is made to have a high level, the thin-film transistor 82 is turned ON, thereby connecting the FD 57 and the capacitor 83. The connection signal STR2 is supplied to the thin-film transistor 84 via the horizontal signal line 42STR2. When the connection signal STR2 is made to have a high level, the thin-film transistor 84 is turned ON, thereby connecting the capacitor 83 and the capacitor 85.

The reset signal RST is supplied to the reset transistor 55 via the horizontal signal line 42R. When the reset signal RST is made to have a high level, the reset transistor 55 is turned ON, thereby resetting the FD 57, the capacitor 83, and the capacitor 85. The discharge signal ABG is supplied to the discharge transistor 81 via the horizontal signal line 42ABG. When the discharge signal ABG is made to have a high level, the discharge transistor 81 is turned ON, thereby discharging electrons stored in the PD 51 to the constant voltage source VDD.

At time T2, the vertical drive circuit 33 makes the reset signal RST, the discharge signal ABG, the connection signal STR1, and the connection signal STR2 to have a low level, thereby turning OFF the reset transistor 55, the discharge transistor 81, the thin-film transistor 82, and the thin-film transistor 84. With this operation, the resetting of the PDs 51, the FDs 57, the capacitors 83, and the capacitors 85 of all the rows of pixels 41G is completed, and the exposure of the PDs 51 is simultaneously started in all the rows of pixels 41G.

At time T3, for all the rows of pixels 41G, the vertical drive circuit 33 simultaneously makes the reset signal RST, the connection signal STR1, and the connection signal STR2 to have a high level. At time T4, for all the rows of pixels 41G, the vertical drive circuit 33 simultaneously makes the reset signal RST, the connection signal STR1, and the connection signal STR2 to have a low level. With this operation, the reset transistor 55, the thin-film transistor 82, and the thin-film transistor 84 are turned ON, and electrons generated mainly due to a leak current during the exposure period are discharged from the FD 57, the capacitor 83, and the capacitor 85.

As during the period from time T5 to T8 shown in FIG. 24, the operation during the period from time T5 to T8 is performed at the same time for all the rows of pixels 41G, and electrons generated in the PDs 51 are transferred to the FDs 57 and are further transferred to the capacitors 83. Then, a signal is sequentially read from the pixels 41G row by row. The drive timing at which the pixels 41G of one row are driven is shown in FIG. 26. During the period from time T6 to T9, the vertical drive circuit 33 makes the potential of the power supply source VCS to have a high level. With this operation, a potential is formed so that electrons are transferred from the FD 57 to the capacitor 83, thereby transferring electrons from the FD 57 to the capacitor 83.

At time T9, the vertical drive circuit 33 makes the selection signal SEL, which is to be supplied to the selection transistor 54 via the horizontal signal line 42S, to have a high level, thereby allowing a signal to be output from the pixels 41G to the horizontal drive circuit 34 via the vertical signal line 43. At the same time, the vertical drive circuit 33 makes the reset signal RST to have a high level, thereby turning ON the reset transistor 55. With this operation, electrons stored in the capacitor 85 are discharged to the constant voltage source VDD, thereby resetting the capacitor 85.

At time T10, the vertical drive circuit 33 makes the reset signal RST to have a low level, causing the reset transistor 55 to be turned OFF, thereby finishing resetting the capacitor 85. Then, after the output voltage is stabilized, a signal representing a reset level of the capacitor 85 is detected by the detector of the horizontal drive circuit 34 as a detection value D1.

At time T11, the vertical drive circuit 33 makes the connection signal STR2, which is to be supplied to the thin-film transistor 84 via the horizontal signal line 42STR2, to have a high level, thereby connecting the capacitor 83 and the capacitor 85 via the thin-film transistor 84. During the period from time T10 to T13, the vertical drive circuit 33 makes the potential of the horizontal signal line 42CS connected to a terminal of the capacitor 85, which is opposite the terminal connected to the thin-film transistor 84, to have a high level. With this operation, the voltage of the capacitor 85 (the gate terminal of the amplifier transistor 53) becomes higher than the voltage of the capacitor 83, thereby transferring electrons stored in the capacitor 83 to the capacitor 85.

At time T12, the vertical drive circuit 33 makes the connection signal STR2, which is to be supplied to the thin-film transistor 84 via the horizontal signal line 42STR2, to have a low level, thereby finishing transferring electrons from the capacitor 83 to the capacitor 85. Then, after the output voltage is stabilized, a signal representing a level corresponding to electrons stored in the capacitor 85 is detected by the detector of the horizontal drive circuit 34 as a detection value D2.

At time T13, the vertical drive circuit 33 makes the selection signal SEL, which is to be supplied to the selection transistor 54 via the horizontal signal line 42S, to have a low level. Then, the readout period is completed for this row of pixels. Thereafter, the subsequent row of pixels 41G is subjected to a readout operation, and the operation from time T9 to T13 is repeated. In this manner, signals are read from all the pixels 41G.

As described above, in the pixel 41G, after resetting the capacitor 85 connected to the gate electrode of the amplifier transistor 53, reading of a signal indicating a reset level of the capacitor 85 and reading of a signal indicating a level corresponding to electrons generated in the PD 51 are sequentially performed. This makes it possible for the solid-state imaging element 31 including the pixels 41G to perform a correlated double sampling (CDS) operation, as well as to implement a global shutter operation, thereby reducing noise when performing resetting.

Figure 27:
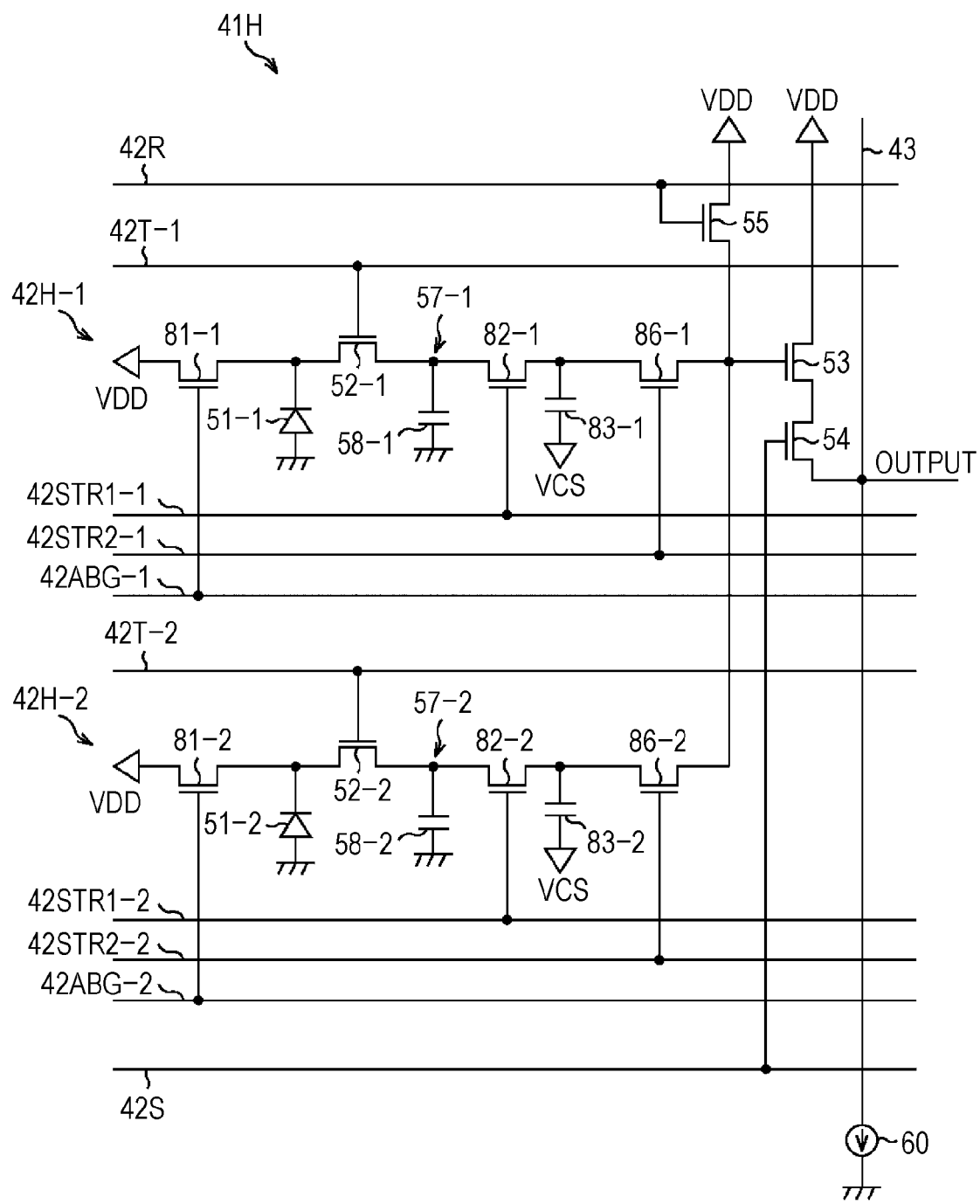
FIG. 27 is a circuit diagram illustrating an example of a ninth configuration of a pixel.

FIG. 27 is a circuit diagram illustrating an example of a ninth configuration of the pixel 41 (hereinafter denoted by 41H).

As shown in FIG. 27, the pixel 41H includes two pixels 41H-1 and 41H-2. As in the pixel 41A shown in FIG. 9, the pixel 41H is a two-pixel sharing structure including an amplifier transistor 53, a selection transistor 54, and a reset transistor 55.

The pixel 41H-1 includes a PD 51-1, a transfer transistor 52-1, an FD 57-1, a capacitor 58-1, a discharge transistor 81-1, a thin-film transistor 82-1, a capacitor 83-1, and a thin-film transistor 86-1.

In the pixel 41H-1, the anode terminal of the PD 51-1 is grounded, and the cathode terminal of the PD 51-1 is connected to the FD 57-1 via the transfer transistor 52-1 and is also connected to a constant voltage source VDD via the discharge transistor 81-1. The FD 57-1 is grounded via the capacitor 58-1 and is connected to the gate electrode of the amplifier transistor 53 via the thin-film transistor 82-1 and the thin-film transistor 86-1. The node between the thin-film transistor 82-1 and the thin-film transistor 86-1 is connected to a power supply source VCS via the capacitor 83-1, and the node between the thin-film transistor 86-1 and the amplifier transistor 53 is connected to a constant voltage source VDD via the reset transistor 55.

The horizontal signal line 42T-1 is connected to the gate electrode of the transfer transistor 52-1, and the horizontal signal line ABG-1 is connected to the gate electrode of the discharge transistor 81-1. The horizontal signal line 42STR1-1 is connected to the gate electrode of the thin-film transistor 82-1, and the horizontal signal line 42STR2-1 is connected to the gate electrode of the thin-film transistor 86-1.

The pixel 41H-2 includes a PD 51-2, a transfer transistor 52-2, an FD 57-2, a capacitor 58-2, a discharge transistor 81-2, a thin-film transistor 82-2, a capacitor 83-2, and a thin-film transistor 86-2. The connection configuration of the pixel 41H-2 is similar to that of the pixel 41H-1.

In this manner, the pixels 41H-1 and 41H-2 include the capacitors 83-1 and 83-2 which store therein electric charge generated in the PDs 51-1 and 51-2, respectively, and implement a global shutter operation, as in the pixel 41F shown in FIG. 22.

Figure 28:
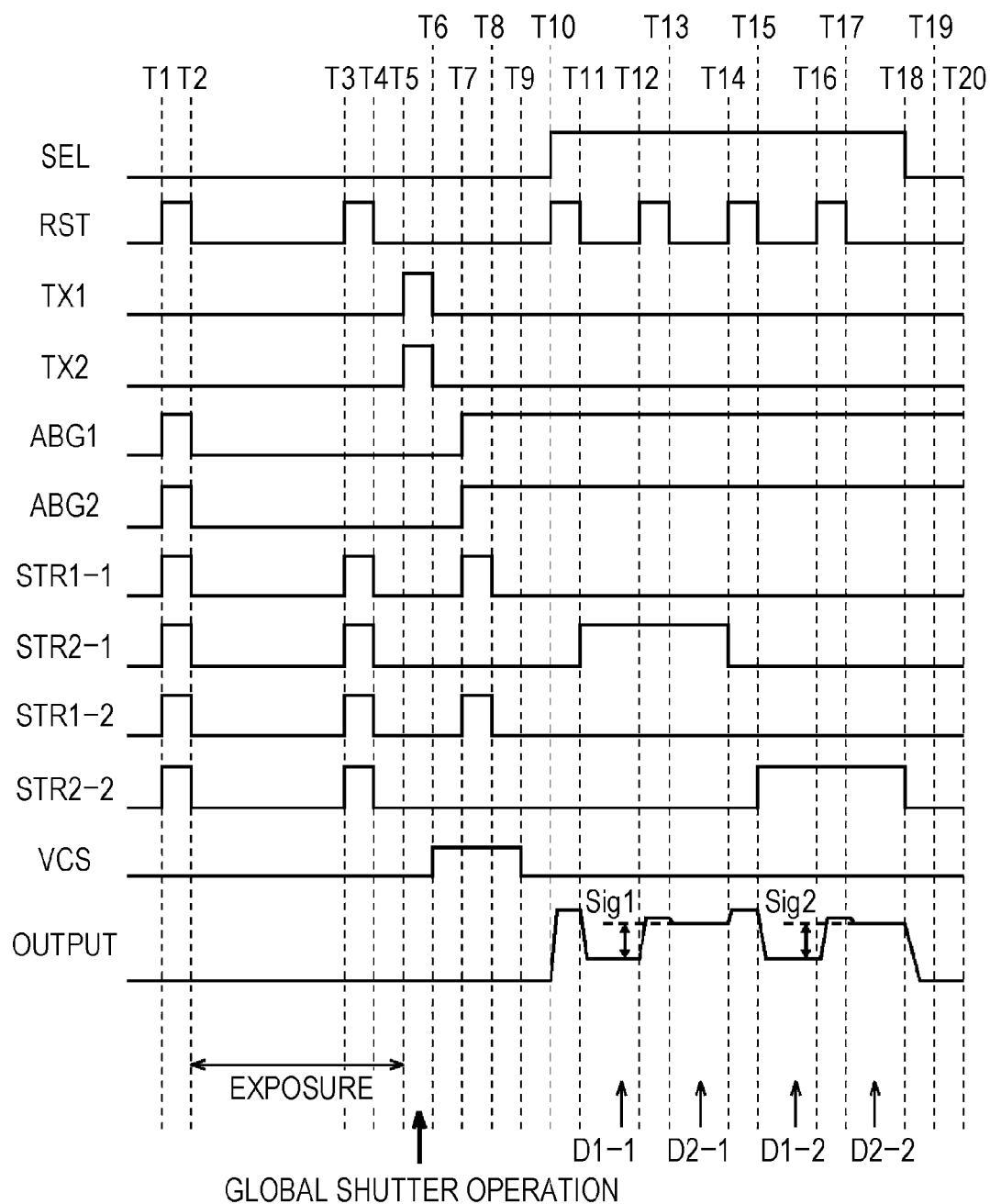
FIG. 28 is a timing chart illustrating an example of the drive timing at which a pixel is driven by using an eighth drive method.

FIG. 28 is a timing chart illustrating an example of the drive timing at which the pixel 41H is driven by using an eighth drive method.

At time T1, in order to simultaneously reset all the rows of pixels 41H, the vertical drive circuit 33 makes the reset signal RST, the discharge signals ABG1 and ABG2, the connection signals STR1-1 and STR2-1, and the connection signals STR1-2 and STR2-2 to have a high level so as to simultaneously reset the PDs 51-1 and 51-2, the FDs 57-1 and 57-2, the capacitors 83-1 and 83-2 of all the rows of pixels 41H.

The reset signal RST and the connection signals STR1-1 and STR2-1 are made to have a high level, causing the reset transistor 55 and the thin-film transistors 82-1 and 86-1 to be turned ON, thereby resetting the FD 57-1 and the capacitor 83-1. Similarly, the reset signal RST and the connection signals STR1-2 and 2-2 are made to have a high level, causing the reset transistor 55 and the thin-film transistors 82-2 and 86-2 to be turned ON, thereby resetting the FD 57-2 and the capacitor 83-2. Additionally, the discharge signals ABG1 and ABG2 are made to have a high level, causing the discharge transistors 81-1 and 81-2 to be turned ON, thereby discharging electrons stored in the PDs 51-1 and 51-2 to the constant voltage sources VDD.

At time T2, the vertical drive circuit 33 makes the reset signal RST, the discharge signals ABG1 and ABG2, the connection signals STR1-1 and STR2-1, and the connection signals STR1-2 and STR2-2 to have a low level, thereby turning OFF the reset transistor 55, the discharge transistors 81-1 and 81-2, and the thin-film transistors 82-1 and 82-2. With this operation, the resetting of the PDs 51-1 and 51-2, the FDs 57-1 and 57-2, and the capacitors 83-1 and 83-2 is completed, and the exposure of the PDs 51-1 and 51-2 of all the rows of the pixels 41H is simultaneously started.

At time T3, for all the rows of pixels 41H, the vertical drive circuit 33 simultaneously makes the reset signal RST, the connection signals STR1-1 and STR2-1, and the connection signals STR1-2 and STR2-2 to have a high level. At time T4, for all the rows of pixels 41H, the vertical drive circuit 33 simultaneously makes the reset signal RST, the connection signals STR1-1 and STR2-1, and the connection signals STR1-2 and STR2-2 to have a low level. With this operation, electrons generated in the FDs 57-1 and 57-2 mainly because of a leak current are discharged from the FDs 57-1 and 57-2 and the capacitors 82-1 and 82-2.

At time T5, for all the rows of pixels 41H, the vertical drive circuit 33 simultaneously makes the transfer signals TX1 and TX2, which are to be supplied to the transfer transistors 52-1 and 52-2 via the horizontal signal lines 42T-1 and 42T-2, respectively, to have a high level, thereby causing the transfer transistors 52-1 and 52-2 to be turned ON. With this operation, the exposure of the pixel 41H is completed, and in all the rows of pixels 41H, electrons stored in the PDs 51-1 and 51-2 are simultaneously transferred to the FDs 57-1 and 57-2, respectively. This transfer operation is simultaneously performed in all the pixels 41H, thereby implementing a global shutter operation.

At time T6, for all the rows of pixels 41H, the vertical drive circuit 33 simultaneously makes the transfer signals TX1 and TX2 to have a low level, causing the transfer transistors 52-1 and 52-2 to be turned OFF, thereby finishing transferring electrons.

At time T7, for all the rows of pixels 41H, the vertical drive circuit 33 simultaneously makes the connection signals STR1-1 and STR1-2, which are to be supplied to the thin-film transistors 82-1 and 82-2 via the horizontal signal lines 42STR-1 and 42STR-2, respectively, to have a high level. With this operation, the FD 57-1 and the capacitor 83-1 are connected to each other via the thin-film transistor 82-1, and the FD 57-2 and the capacitor 83-2 are connected to each other via the thin-film transistor 82-2.

Meanwhile, during the period from time T6 to T9, the vertical drive circuit 33 makes the potential of the power supply sources VCS to have a high level. In the pixel 41H-1, the power supply source VCS is connected to the terminal of the capacitor 83-1, which is opposite the terminal connected to the thin-film transistor 82-1. In the pixel 41H-2, the power supply source VCS is connected to the terminal of the capacitor 83-2, which is opposite the terminal connected to the thin-film transistor 82-2.

With this operation, the voltage of the terminal of the capacitor 83-1 connected to the power supply source VCS is increased, thereby transferring electrons stored in the FD 57-1 to the capacitor 83-1. Similarly, the voltage of the terminal of the capacitor 83-2 connected to the power supply source VCS is increased, thereby transferring electrons stored in the FD 57-2 to the capacitor 83-2.

At time T7, for all the rows of pixels 41H, the vertical drive circuit 33 simultaneously makes the discharge signals ABG1 and ABG2, which are to be supplied to the discharge transistors 81-1 and 81-2 via the horizontal signal lines 42ABG-1 and 42ABG-2, respectively, to have a high level. The discharge signals ABG1 and ABG2 are maintained at the high level after time T7, and electrons generated as a result of photoelectric conversion in the PDs 51-1 and 51-2 are continuously discharged to the constant voltage sources VDD, thereby preventing unnecessary electrons from being stored in the PDs 51-1 and 51-2.

At time T8, for all the rows of pixels 41H, the vertical drive circuit 33 simultaneously makes the connection signals STR1-1 and STR1-2, which are to be supplied to the thin-film transistors 82-1 and 82-2 via the horizontal signal lines 42STR1-1 and 42STR1-2, respectively, to have a low level, thereby finishing transferring electrons from the FDs 57-1 and 57-2 to the capacitors 83-1 and 83-2, respectively.

At time T9, the vertical drive circuit 33 makes the power supply sources VCS to have a low level. The operation until time T9 is performed for all the pixels 41H, and electrons generated in the PDs 51 remain being stored in the associated capacitors 83.

At time T10, the vertical drive circuit 33 makes the selection signal SEL, which is to be supplied to the selection transistor 54 via the horizontal signal line 42S, to have a high level. With this operation, a signal is ready to be output from the pixels 41H via the vertical signal line 43 to the horizontal drive circuit 34. At time T10, the vertical drive circuit 33 also makes the reset signal RST to have a high level, thereby turning ON the reset transistor 55. With this operation, unnecessary electrons are discharged from the node between the thin-film transistors 86-1 and 86-2 and the gate electrode of the amplifier transistor 53.

At time T11, the vertical drive circuit 33 makes the reset signal RST to have a low level and also makes the connection signal STR2-1, which is to be supplied to the thin-film transistor 86-1 via the horizontal signal line STR2-1, to have a high level. With this operation, the capacitor 83-1 and the gate electrode of the amplifier transistor 53 is connected, thereby outputting a signal representing a level corresponding to electrons stored in the capacitor 83-1 from the amplifier transistor 53. Then, after the output voltage is stabilized, a signal representing a level corresponding to electrons stored in the capacitor 83-1 is detected by the detector of the horizontal drive circuit 34 as a detection value D1-1.

At time T12, the vertical drive circuit 33 makes the reset signal RST to have a high level, thereby turning ON the reset transistor 55. With this operation, electrons stored in the capacitor 83-1 are discharged to the constant voltage source VDD, and the capacitor 83-1 is reset.

At time T13, the vertical drive circuit 33 makes the reset signal RST to have a low level, thereby finishing resetting the capacitor 83-1. Then, after the output voltage is stabilized, a signal representing a reset level of the capacitor 83-1 is detected by the detector of the horizontal drive circuit 34 as a detection value D2-1.

Then, a signal representing the difference between the detection value D1-1 detected after time T11 and the detection value D2-1 detected after time T13, i.e., the output signal Sig1 representing a level corresponding to electrons generated in the PD 51-1, is detected as a pixel signal of the pixel 41H-1.

At time T14, the vertical drive circuit 33 makes the connection signal STR2-1, which is to be supplied to the thin-film transistors 86-1 via the horizontal signal line 42STR2-1, to have a low level, thereby disconnecting the capacitor 83-1 from the gate electrode of the amplifier transistor 53. Simultaneously, the vertical drive circuit 33 makes the reset signal RST to have a high level, thereby discharging unnecessary electrons from the node between the gate electrode of the amplifier transistor 53 and the capacitor 86-1.

At time T15, the vertical drive circuit 33 makes the reset signal RST to have a low level, and at the same time, makes the connection signal STR2-2, which is to be supplied to the thin-film transistor 86-2 via the horizontal signal line 42STR2-2, to have a high level, thereby connecting the capacitor 83-2 and the gate electrode of the amplifier transistor 53. Then, a signal representing a level corresponding to electrons stored in the capacitor 83-2 is output from the amplifier transistor 53. Then, after the output voltage is stabilized, a signal representing a level corresponding to electrons stored in the capacitor 83-2 is detected by the detector of the horizontal drive circuit 34 as a detection signal D1-2.

At time T16, the vertical drive circuit 33 makes the reset signal RST to have a high level, thereby turning ON the reset transistor 55. With this operation, electrons stored in the capacitor 83-2 are discharged to the constant voltage source VDD, thereby resetting the capacitor 83-2.

At time T17, the vertical drive circuit 33 makes the reset signal RST to have a low level, thereby finishing resetting the capacitor 83-2. Then, after the output voltage is stabilized, a signal representing a reset level of the capacitor 83-2 is detected by the detector of the horizontal drive circuit 34 as a detection value D2-2.

Then, a signal indicating the difference between the detection value D1-2 detected after time T15 and the detection value D2-2 detected after time T17, i.e., an output signal Sig2 representing a level corresponding to electrons generated in the PD 51-2, is detected as a pixel signal of the pixel 41H-2.

At time T18, the vertical drive circuit 33 makes the connection signal STR2-2, which is to be supplied to the thin-film transistor 86-2 via the horizontal signal line 42STR-2, to have a low level, and at the same time, makes the selection signal SEL, which is to be supplied to the selection transistor 54 via the horizontal signal line 42S, to have a low level. Then, the readout period for this row of pixels is completed. Thereafter, the subsequent row of pixels 41H is subjected to a readout operation, and the operation from time T10 to T18 is repeated. In this manner, signals are read from all the pixels 41H.

As described above, in the pixel 41H, the amplifier transistor 53, the selection transistor 54, and the reset transistor 55 are used for both the pixels 41H-1 and 41H-2. With this structure, the area in which the transistors are disposed can be reduced. Accordingly, a large area can be secured for the PD 51, thereby improving photoelectric conversion efficiency.

The pixel 41H is not configured to perform a CDS operation. However, as in the pixel 41G shown in FIG. 25, the thin-film transistor 84 and the capacitor 85 may be disposed, and the pixel 41H may be driven at a drive timing, such as that shown in FIG. 26, thereby making it possible to perform a CDS operation.

Figure 29:
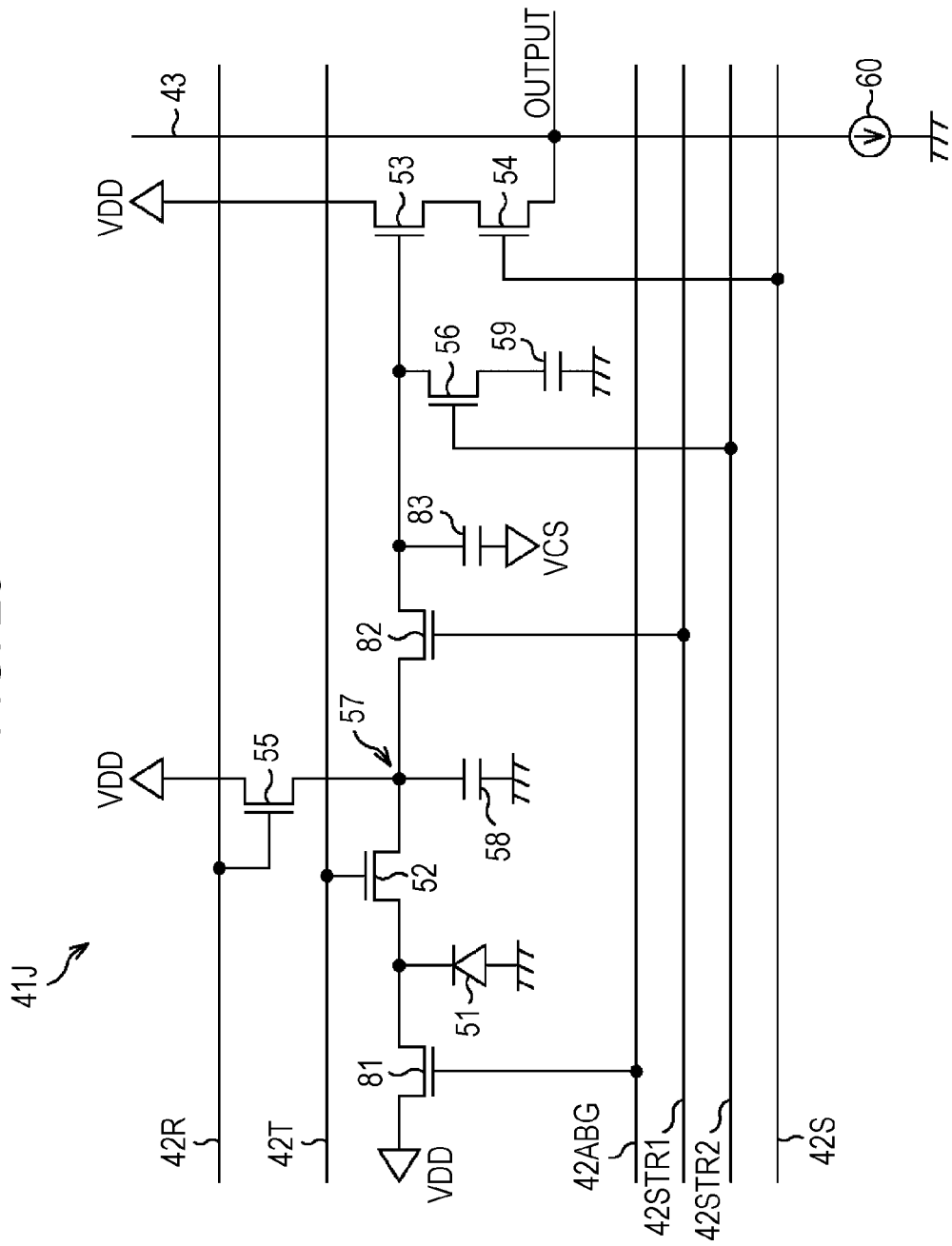
FIG. 29 is a circuit diagram illustrating an example of a tenth configuration of a pixel.

FIG. 29 is a circuit diagram illustrating an example of a tenth configuration of the pixel 41 (hereinafter denoted by 41J).

As shown in FIG. 29, the pixel 41J includes a PD 51, a transfer transistor 52, an amplifier transistor 53, a selection transistor 54, a reset transistor 55, a thin-film transistor 56, an FD 57, a capacitor 58, an additional capacitor 59, a discharge transistor 81, a thin-film transistor 82, and a capacitor 83. That is, the pixel 41J is formed by a combination of the configuration of the pixel 41F shown in FIG. 22 and the configuration of the pixel 41 shown in FIG. 4. In the pixel 41 shown in FIG. 4, electrons are stored in the capacitor 58 included in the FD 57 and in the additional capacitor 59 connected to the FD 57 via the thin-film transistor 56.

The pixel 41J is configured as follows. The anode terminal of the PD 51 is grounded, and the cathode terminal of the PD 51 is connected to the FD 57 via the transfer transistor 52 and is also connected to a constant voltage source VDD via the discharge transistor 81. The FD 57 is grounded via the capacitor 58 and is connected to a constant voltage source VDD via the reset transistor 55, and is connected to the gate electrode of the amplifier transistor 53 via the thin-film transistor 82.

The node between the thin-film transistor 82 and the gate electrode of the amplifier transistor 53 is connected to a power supply source VCS via the capacitor 83. This node is also connected to one terminal of the additional capacitor 59 via the thin-film transistor 56, and the other terminal of the additional transistor 59 is grounded. One terminal of the amplifier transistor 53 is connected to a constant voltage source VDD, and the other terminal of the amplifier transistor 53 is connected, via the selection transistor 54, to the vertical signal line 43 to which a constant current source 60 is connected.

The horizontal signal line 42T is connected to the gate electrode of the transfer transistor 52, while the horizontal signal line 42S is connected to the gate electrode of the selection transistor 54. The horizontal signal line 42R is connected to the gate electrode of the reset transistor 55. The horizontal signal line 42ABG is connected to the gate electrode of the discharge transistor 81. The horizontal signal line 42STR1 is connected to the gate electrode of the thin-film transistor 82, while the horizontal signal line 42STR2 is connected to the gate electrode of the thin-film transistor 56.

That is, the pixel 41J differs from the pixel 41F shown in FIG. 22 in that the additional transistor 59 is connectable, via the thin-film transistor 56, to the node between the thin-film transistor 82 and the gate electrode of the amplifier transistor 53.

As in the pixel 41F shown in FIG. 22, in the pixel 41J configured as described above, a global shutter function can be implemented. Additionally, as in the pixel 41 shown in FIG. 4, the capacitance of the storage capacitor connected to the node between the gate electrode of the amplifier transistor 53 and the capacitor 83 is made variable. More specifically, in the pixel 41J, electrons generated in the PD 51 can be stored in the storage capacitor forming the capacitor 83 or in the storage capacitor formed by connecting the additional capacitor 59 to the capacitor 83. That is, in the solid-state imaging element 31 including the pixels 41J, it is possible to obtain images without distortion by virtue of a global shutter function, and also to obtain images with a wider dynamic range.

Figure 30A:
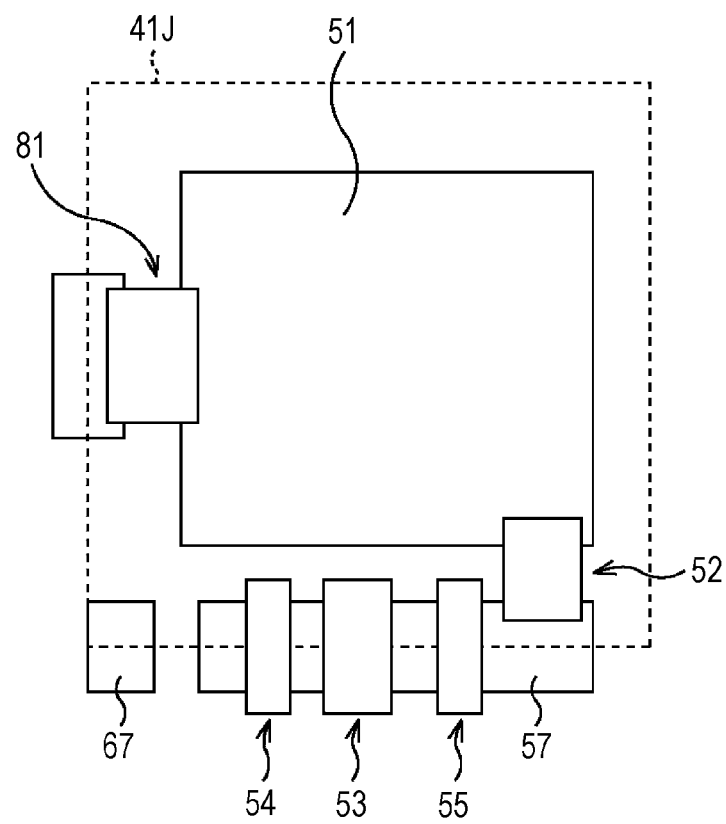
FIGS. 30A and 30B illustrate examples of a planar configuration of a pixel.
Figure 30B:
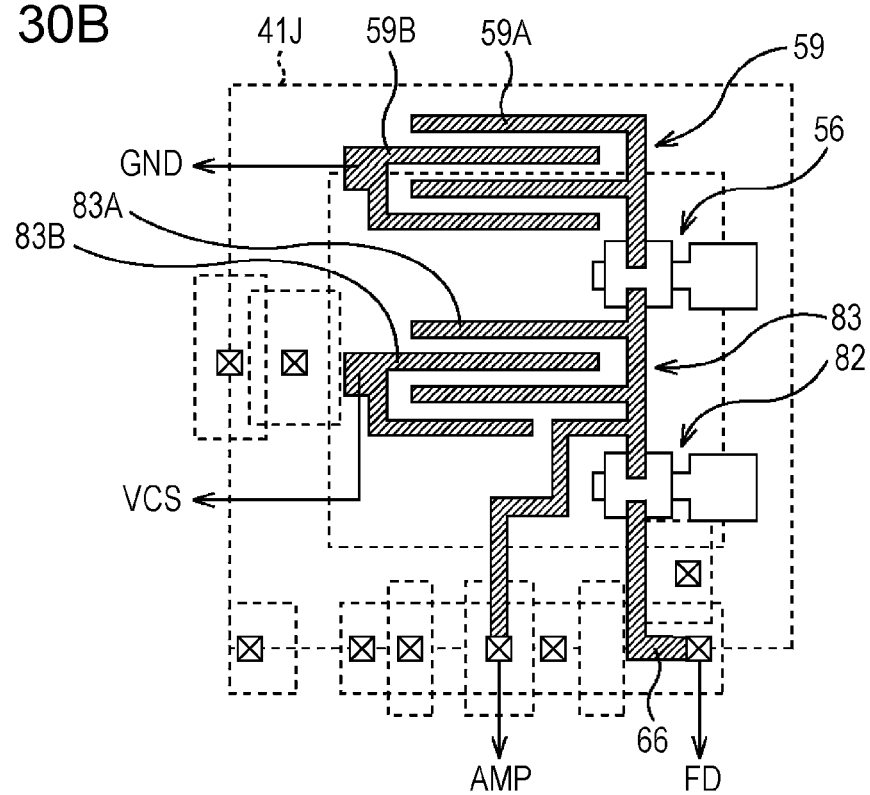

The structure of the pixel 41J will now be described below with reference to FIGS. 30A and 30B. FIG. 30A illustrates an example of the layout of the pixel 41J on a silicon substrate. FIG. 30B illustrates an example of the planar configuration of a wiring layer of the pixel 41J.

As shown in FIG. 30A, the PD 51 is connected to the FD 57 via the transfer transistor 52. The reset transistor 55 is disposed adjacent to the FD 57. The discharge transistor 81 is connected to the PD 51. The amplifier transistor 53 is disposed adjacent to the reset transistor 55, and the selection transistor 54 is disposed adjacent to the amplifier transistor 53. This forms a source follower circuit serving as an output buffer. A well contact 67 is formed at a position away from the selection transistor 54.

As shown in FIG. 30B, a pair of electrodes 83A and 83B forming the capacitor 83 are formed in a so-called comb-like shape, and wiring portions corresponding to the teeth of the comb-like shape of the electrode 83A and those of the electrode 84B are alternately disposed with a predetermined spacing therebetween. Similarly, a pair of electrodes 59A and 59B forming the capacitor 59 are formed in a so-called comb-like shape, and wiring portions corresponding to the teeth of the comb-like shape of the electrode 59A and those of the electrode 59B are alternately disposed with a predetermined spacing therebetween. The capacitor 83 and the additional capacitor 59 have a certain area, and are formed in a region in which they overlap the PD 51 when viewed from above.

The metal wiring 66 connected to the FD 57 is connected to the electrode 83A forming the capacitor 83 via the thin-film transistor 82, and the other electrode 83B forming the capacitor 83 is connected to the power supply source VCS. The electrode 83A is also connected to the amplifier transistor 53 and is connected to the electrode 59A forming the additional capacitor 59 via the thin-film transistor 56. The other electrode 59B forming the additional capacitor 59 is grounded.

The pixel 41J is configured as described above. In the solid-state imaging element 31 including the pixels 41J, it is possible to obtain images without distortion by virtue of a global shutter function, and also to obtain images with a wider dynamic range.

Figure 31A:
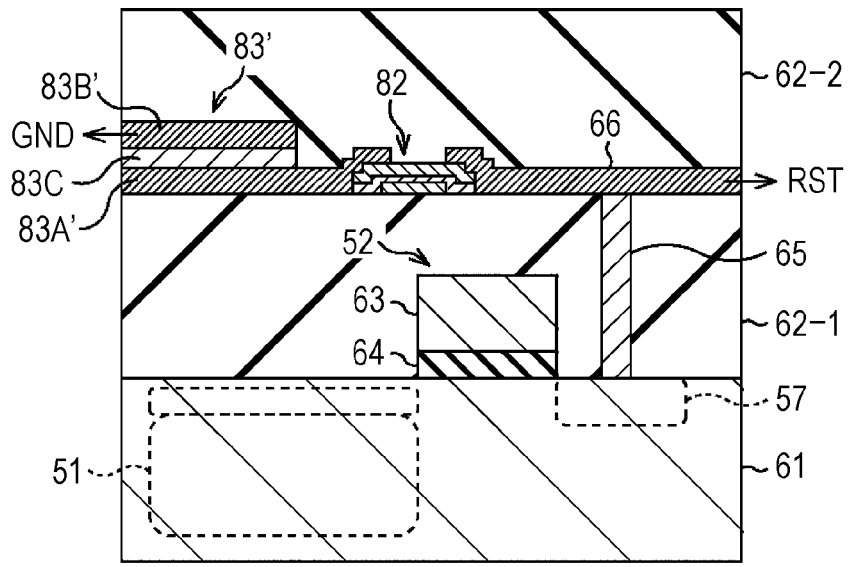
FIGS. 31A and 31B are a sectional view and a plan view, respectively, illustrating an eleventh configuration of a pixel.
Figure 31B:
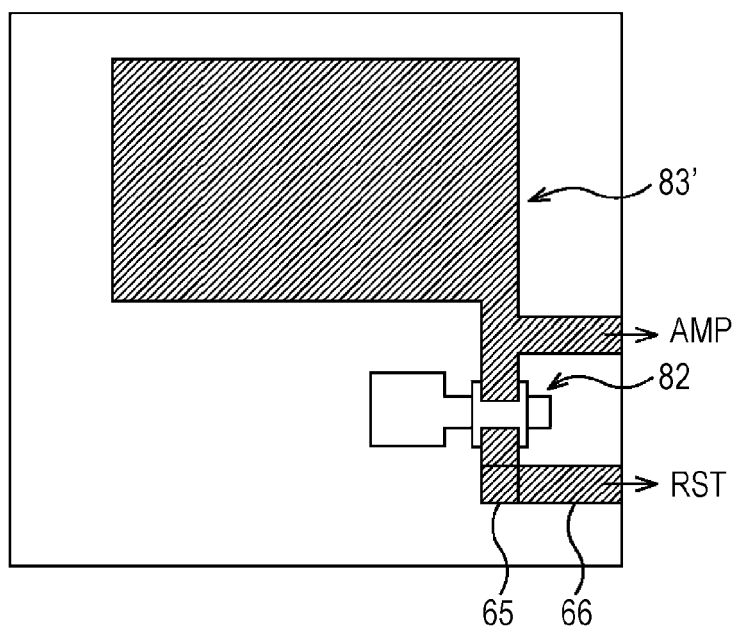

FIGS. 31A and 31B illustrate an example of an eleventh configuration of the pixel 41 (hereinafter denoted by 41K). FIG. 31A illustrates an example of the sectional configuration of the FD 57 and surrounding components of the pixel 41K. FIG. 31B illustrates an example of the planar configuration of a wiring layer of the pixel 41K. In FIGS. 31A and 31B, the same components as those of the pixel 41F shown in FIGS. 23A and 23B are designated by like reference numerals, and an explanation thereof will thus be omitted.

The pixel 41K has a circuit configuration similar to that of the pixel 41F shown in FIG. 22, and includes a multilayered capacitor 83' instead of the comb-like capacitor 83. That is, in the pixel 41K, the FD 57 is connected to the multilayered capacitor 83' and the amplifier transistor 53 via the thin-film transistor 82.

As shown in FIG. 31A, the capacitor 83' is formed by sandwiching an insulating film 83C between a pair of electrodes 83A' and 83B' formed in a planar shape. In this manner, by using the multilayered capacitor 83', the capacitance is increased to a greater level than when the comb-like capacitor 83 is used. This makes it possible for the pixel 41K to handle a larger amount of light.

The above-described solid-state imaging element 31 is applicable to various electronic apparatuses, such as imaging systems, e.g., digital still cameras and digital video cameras, cellular telephones including an imaging function, and other apparatuses including an imaging function.

Figure 32:
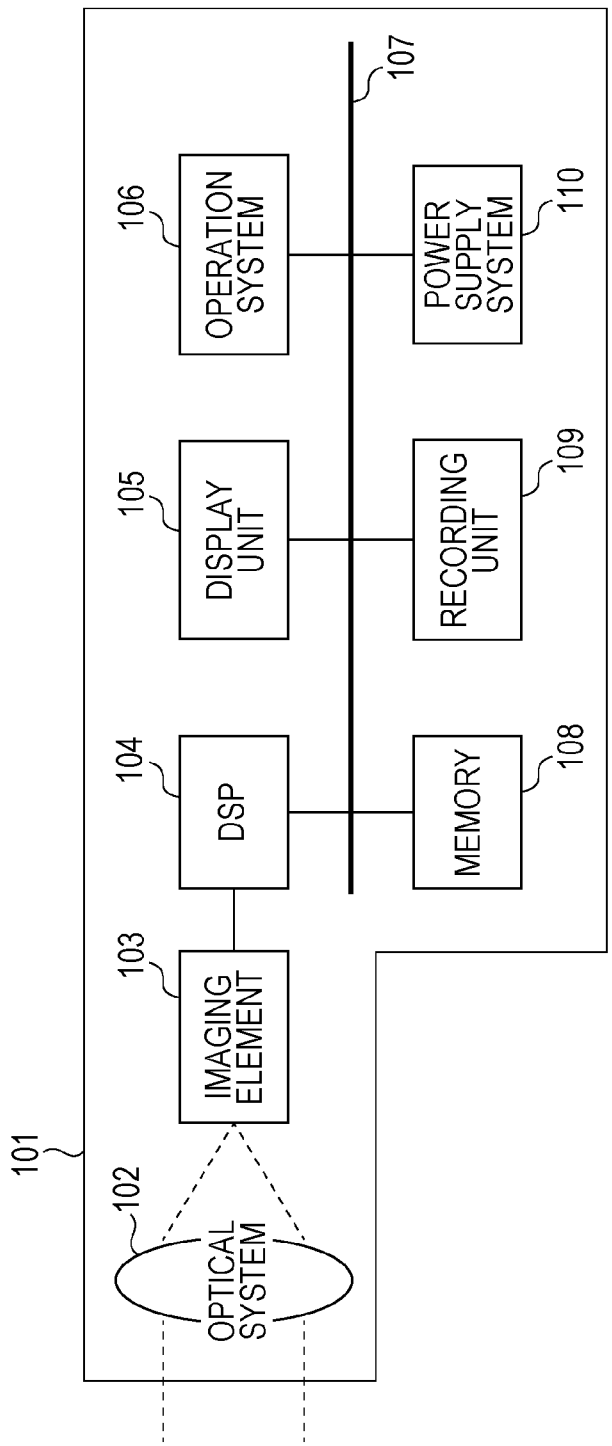
FIG. 32 is a block diagram illustrating an example of the configuration of an imaging device installed in an electronic apparatus.

FIG. 32 is a block diagram illustrating an example of the configuration of an imaging device 101 installed in an electronic apparatus.

As shown in FIG. 32, the imaging device 101 includes an optical system 102, an imaging element 103, and a digital signal processor (DSP) 104. The DSP 104, a display unit 105, an operation system 106, a memory 108, a recording unit 109, and a power supply system 110 are connected to one another via a bus 107. With this configuration, the imaging device 101 is able to capture still images and moving pictures.

The optical system 102 includes one or multiple lenses, and focuses image light (incident light) from a subject onto the imaging element 103 and forms an image on the light receiving surface (sensor) of the imaging element 103.

As the imaging element 103, the solid-state imaging element 31 including the pixels 41 having one of the above-described configurations is used. Electrons are stored in the imaging element 103 during a certain period in accordance with an image formed on the light receiving surface of the imaging element 103 after light passing through the optical system 102. Then, a signal corresponding to electrons stored in the imaging element 103 is supplied to the DSP 104.

The DSP 104 performs various signal processing operations on the signal supplied from the imaging element 103 so as to obtain an image, and temporarily stores data representing the image in the memory 108. The data stored in the memory 108 is recorded in the recording unit 109, or is supplied to the display unit 105 and the corresponding image is displayed. The operation system 106 receives various operations from a user and supplies operation signals to the individual blocks. The power supply system 110 supplies power necessary for driving the individual blocks of the imaging device 101.

In the imaging device 101 configured as described above, as the imaging element 103, the above-described solid-state imaging element 31 is used, thereby making it possible to obtain high-quality images with a wider dynamic range.

The configuration of a solid-state imaging element according to an embodiment of the present disclosure may be employed for backside illumination CMOS solid-state imaging elements, frontside illumination CMOS solid-state imaging elements, and charge coupled device (CCD) solid-state imaging elements.

The following configurations may be applied to the present disclosure.

(1)

An imaging element including a plurality of pixels, each of the plurality of pixels comprising:

a photoelectric transducer disposed in each of the plurality of pixels and configured to generate electric charge corresponding to received light;

a storage unit having a predetermined capacitance and configured to store therein electric charge transferred from the photoelectric transducer;

a capacitor disposed separate from a silicon substrate with an interlayer insulating film therebetween, the photoelectric transducer and the storage unit being formed in the silicon substrate; and a connecting unit disposed separate from the silicon substrate with the interlayer insulating film therebetween and configured to connect the storage unit and the capacitor.

(2)

The imaging element according to (1), wherein the imaging element is driven such that transfer of electric charge from the photoelectric transducer to the storage unit is simultaneously performed in the plurality of pixels, and electric charge stored in the storage unit is transferred to the capacitor via the connecting unit and is retained in the capacitor.

(3)

The imaging element according to (1) or (2), each of the plurality of pixels further comprising:

a second capacitor disposed separate from the silicon substrate with the interlayer insulating film therebetween; and a second connecting unit disposed separate from the silicon substrate with the interlayer insulating film therebetween and configured to connect the capacitor and the second capacitor, wherein, after a signal representing a reset level of the second capacitor is read, electric charge is transferred from the capacitor to the second capacitor via the second connecting unit and a signal representing a level corresponding to electric charge stored in the second capacitor is read.

(4)

The imaging element according to one of (1) through (3), wherein an output unit configured to output a signal representing a level corresponding to electric charge stored in the capacitor is disposed for all the plurality of pixels.

(5)

The imaging element according to one of (1) through (4), each of the plurality of pixels further comprising:

an additional capacitor configured to store electric charge therein in addition to the storing unit storing electric charge; and a connecting/disconnecting unit configured to connect or disconnect the storage unit and the additional capacitor, wherein the additional capacitor and the connecting/disconnecting unit are formed in a wiring layer disposed separate from the silicon substrate with the interlayer insulating film therebetween, the photoelectric transducer being formed in the silicon substrate.

(6)

The imaging element according to (1), wherein:

the capacitor is an additional capacitor configured to store electric charge therein in addition to the storing unit storing electric charge; and the connecting unit is driven so as to connect or disconnect the storage unit and the additional capacitor during a readout period for which a signal is read from the pixel.

(7)

The imaging element according to (6), wherein, during the readout period for which a signal is read from the pixel, a signal is read in the state in which the storage unit and the additional capacitor are connected by the connecting unit and a signal is read in the state in which the storage unit and the additional capacitor are not connected by the connecting unit.

(8)

The imaging element according to (6) or (7), wherein light to be received by the photoelectric transducer is incident on a back side of the silicon substrate which opposes a side of the silicon substrate on which a wiring layer is stacked.

(9)

The imaging element according to one of (6) through (8), wherein the storage unit is used for all the plurality of pixels.

(10)

The imaging element according to one of (6) through (9), wherein a plurality of the capacitors are connected to the storage unit via a plurality of the associated connecting units.

(11)

The imaging element according to one of (6) through (10), wherein a light blocking film is formed between the silicon substrate and the connecting unit, the photoelectric transducer being formed in the silicon substrate.

(12)

The imaging element according to one of (1) through (11), wherein the capacitor includes a pair of electrodes formed in a comb-like shape and having wiring portions, the wiring portions of one electrode and the wiring portions of the other electrode being alternately disposed with a predetermined spacing therebetween.

(13)

The imaging element according to one of (1) through (11), wherein the capacitor includes a pair of planar electrodes opposing each other and sandwiching an insulating film therebetween.

The present disclosure contains subject matter related to that disclosed in Japanese Priority Patent Application JP 2011-145563 filed in the Japan Patent Office on Jun. 30, 2011 and Japanese Priority Patent Application JP 2011-267559 filed in the Japan Patent Office on Dec. 7, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging element including a plurality of pixels, each of the plurality of pixels comprising:
   a photoelectric transducer that generates electric charge corresponding to received light;
   a storage unit that stores therein electric charge transferred from the photoelectric transducer;
   a capacitor; and
   a connecting transistor that selectively connects the storage unit and the capacitor,
   wherein the photoelectric transducer is formed in a silicon substrate and the capacitor and the connecting transistor are formed in a wiring layer disposed separate from the silicon substrate with an interlayer insulating film therebetween.

2. The imaging element according to claim 1, wherein the imaging element is driven such that transfer of electric charge from the photoelectric transducer to the storage unit is simultaneously performed in the plurality of pixels, and electric charge stored in the storage unit is transferred to the capacitor via the connecting transistor and is retained in the capacitor.

3. The imaging element according to claim 1, wherein:
   the capacitor is an additional capacitor configured to store electric charge therein in addition to the storing unit storing electric charge; and
   the connecting transistor is driven so as to connect or disconnect the storage unit and the additional capacitor during a readout period for which a signal is read from the pixel.

4. The imaging element according to claim 3, wherein light to be received by the photoelectric transducer is incident on a back side of the silicon substrate which opposes a side of the silicon substrate on which a wiring layer is stacked.

5. The imaging element according to claim 3, wherein the storage unit is used for all the plurality of pixels.

6. The imaging element according to claim 3, wherein a plurality of the capacitors are connected to the storage unit via a plurality of the associated connecting transistors.

7. The imaging element according to claim 3, wherein a light blocking film is formed between the silicon substrate and the connecting transistor, the photoelectric transducer being formed in the silicon substrate.

8. The imaging element according to claim 1, wherein the capacitor includes a pair of planar electrodes opposing each other and sandwiching an insulating film therebetween.

9. An electronic apparatus comprising:
   the imaging element of claim 1.

10. The electronic apparatus according to claim 9, wherein the imaging element has a structure in which light to be received by the photoelectric transducer is incident on a back side of the silicon substrate which opposes a side of the silicon substrate on which a wiring layer is stacked.

11. The An imaging element including a plurality of pixels, each of the plurality of pixels comprising:
    a photoelectric transducer that is formed in a silicon substrate and that generates electric charge corresponding to received light;
    a storage unit that stores electric charge transferred from the photoelectric transducer;
    a first capacitor that is disposed separate from the silicon substrate with an interlayer insulating film therebetween; and
    a first connecting unit that is disposed separate from the silicon substrate with the interlayer insulating film therebetween and that selectively connects the storage unit and the first capacitor;
    a second capacitor that is disposed separate from the silicon substrate with the interlayer insulating film therebetween; and
    a second connecting unit that is disposed separate from the silicon substrate with the interlayer insulating film therebetween and that selectively connects the first capacitor and the second capacitor,
    wherein, after a signal representing a reset level of the second capacitor is read, electric charge is transferred from the first capacitor to the second capacitor via the second connecting unit and a signal representing a level corresponding to electric charge stored in the second capacitor is read.

12. The imaging element according to claim 1, wherein an output unit configured to output a signal representing a level corresponding to electric charge stored in the capacitor is disposed for all the plurality of pixels.

13. An imaging element including a plurality of pixels, each of the plurality of pixels comprising:
    a photoelectric transducer that generates electric charge corresponding to received light;
    a storage unit that stores electric charge transferred from the photoelectric transducer;
    a first capacitor; and
    a first connecting unit that selectively connects the storage unit and the first capacitor;
    a second capacitor; and
    a second connecting unit that selectively connects the storage unit and the second capacitor,
    wherein the first and second capacitors and the first and second connecting units are formed in a wiring layer disposed separate from a silicon substrate with an interlayer insulating film therebetween, the photoelectric transducer being formed in the silicon substrate.

14. An electronic apparatus comprising:
    the imaging element of claim 13.

15. An imaging element including a plurality of pixels, each of the plurality of pixels comprising:
- a photoelectric transducer that generates electric charge corresponding to received light;
- a storage unit that stores electric charge transferred from the photoelectric transducer;
- a capacitor; and
- a connecting unit that selectively connects the storage unit and the first capacitor;
- wherein the capacitor and the connecting unit are formed in a wiring layer disposed separate from the silicon substrate with an interlayer insulating film therebetween, the photoelectric transducer being formed in the silicon substrate, and
- wherein, during a readout period for which a signal is read from the pixel, a signal is read in the state in which the storage unit and the capacitor are connected by the connecting unit and a signal is read in the state in which the storage unit and the capacitor are not connected by the connecting unit.

16. An electronic apparatus comprising:
the imaging element of claim 15.

17. An imaging element including a plurality of pixels, each of the plurality of pixels comprising:
- a photoelectric transducer that generates electric charge corresponding to received light;
- a storage unit that stores electric charge transferred from the photoelectric transducer;
- a capacitor; and
- a connecting unit that selectively connects the storage unit and the first capacitor;
- wherein the capacitor and the connecting unit are formed in a wiring layer disposed separate from the silicon substrate with an interlayer insulating film therebetween, the photoelectric transducer being formed in the silicon substrate, and
- wherein the capacitor includes a pair of electrodes formed in a comb-like shape and having wiring portions, the wiring portions of one electrode and the wiring portions of the other electrode being alternately disposed with a predetermined spacing therebetween.

18. An electronic apparatus comprising:
the imaging element of claim 17.

\* \* \* \* \*